(12) United States Patent
Yamazaki et al.

(10) Patent No.: US 12,727,356 B2
(45) Date of Patent: Sep. 1, 2026

(54) DISPLAY PANEL, DATA PROCESSING DEVICE AND METHOD FOR MANUFACTURING THE DISPLAY PANEL

(71) Applicant: Semiconductor Energy Laboratory Co., Ltd., Atsugi (JP)

(72) Inventors: Shunpei Yamazaki, Setagaya (JP); Takayuki Ikeda, Atsugi (JP); Kenichi Okazaki, Tochigi (JP); Yasumasa Yamane, Atsugi (JP); Hajime Kimura, Atsugi (JP); Tatsuya Onuki, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 696 days.

(21) Appl. No.: 17/570,487

(22) Filed: Jan. 7, 2022

(65) Prior Publication Data

US 2022/0223671 A1 Jul. 14, 2022

(30) Foreign Application Priority Data

Jan. 14, 2021 (JP) ................................ 2021-004571

(51) Int. Cl.
*H01L 27/32* (2006.01)
*H01L 51/56* (2006.01)
(Continued)

(52) U.S. Cl.
CPC ........... *H10K 59/35* (2023.02); *H10K 59/122* (2023.02); *H10K 59/131* (2023.02); *H10K 59/40* (2023.02);
(Continued)

(58) Field of Classification Search
CPC ........... H10K 59/122; H10K 59/80522; H10K 50/824
See application file for complete search history.

(56) References Cited

U.S. PATENT DOCUMENTS 5,953,985 A 9/1999 Kobayashi
6,120,338 A 9/2000 Hirano et al.
(Continued)

FOREIGN PATENT DOCUMENTS

CN 109509765 A * 3/2019 ........... H10K 50/125
JP 2000-036385 A 2/2000
(Continued)

OTHER PUBLICATIONS

Machine translation, Yang, Chinese Pat. Pub. No. CN109509765A, translation date: Mar. 1, 2025, Espacenet, all pages. (Year: 2025).*
(Continued)

*Primary Examiner* — Victoria K. Hall
(74) *Attorney, Agent, or Firm* — Eric J. Robinson; Robinson Intellectual Property Law Office, P.C.

(57) ABSTRACT

A display panel including a first light-emitting device, a second light-emitting device, a first insulating film, and a conductive film is provided. The first light-emitting device includes a first electrode and a second electrode. The second light-emitting device includes a third electrode and a fourth electrode. The first insulating film is in contact with a top surface and a side surface of the first electrode, a top surface and a side surface of the second electrode, a top surface and a side surface of the third electrode, and a top surface and a side surface of the fourth electrode, and includes a first opening and a second opening. The first opening overlaps with the second electrode and the second opening overlaps with the fourth electrode. The conductive film is electrically connected to the second electrode and the fourth electrode in the first opening and in the second opening, respectively.

13 Claims, 43 Drawing Sheets

(51) Int. Cl.

| | |
|---|---|
| ***H10K 59/122*** | (2023.01) |
| ***H10K 59/131*** | (2023.01) |
| ***H10K 59/35*** | (2023.01) |
| ***H10K 59/40*** | (2023.01) |
| ***H10K 59/80*** | (2023.01) |
| *H10K 50/17* | (2023.01) |
| *H10K 59/12* | (2023.01) |
| *H10K 59/123* | (2023.01) |
| *H10K 71/00* | (2023.01) |

(52) U.S. Cl.

CPC ..... *H10K 59/80522* (2023.02); *H10K 50/171* (2023.02); *H10K 59/1201* (2023.02); *H10K 59/123* (2023.02); *H10K 71/00* (2023.02)

(56) References Cited

U.S. PATENT DOCUMENTS

| | | | | |
|---|---|---|---|---|
| 7,819,716 | B2 | 10/2010 | Murata | |
| 2002/0072139 | A1 | 6/2002 | Kashiwabara | |
| 2005/0057151 | A1* | 3/2005 | Kuwabara | H05B 33/22 313/506 |
| 2008/0024059 | A1* | 1/2008 | Hsu | H10K 50/82 428/917 |
| 2009/0079333 | A1* | 3/2009 | Koo | H10K 59/805 313/504 |
| 2010/0155711 | A1* | 6/2010 | Hasegawa | H10K 59/876 257/40 |
| 2011/0148290 | A1 | 6/2011 | Oota | |
| 2011/0272715 | A1* | 11/2011 | Kang | H10K 59/122 438/34 |
| 2012/0256204 | A1 | 10/2012 | Yoshizumi et al. | |
| 2012/0273804 | A1 | 11/2012 | Hatano | |
| 2012/0276484 | A1 | 11/2012 | Izumi et al. | |
| 2013/0084531 | A1 | 4/2013 | Hamaguchi et al. | |
| 2013/0084664 | A1 | 4/2013 | Yoshitoku et al. | |
| 2013/0084666 | A1 | 4/2013 | Oshige | |
| 2013/0280839 | A1 | 10/2013 | Sonoda et al. | |
| 2013/0295705 | A1 | 11/2013 | Sonoda et al. | |
| 2014/0004640 | A1 | 1/2014 | Hamaguchi et al. | |
| 2014/0004642 | A1 | 1/2014 | Otsuka et al. | |
| 2015/0060826 | A1 | 3/2015 | Matsumoto et al. | |
| 2015/0069360 | A1 | 3/2015 | Sato | |
| 2015/0076476 | A1 | 3/2015 | Odaka et al. | |
| 2016/0172595 | A1 | 6/2016 | Malinowski et al. | |
| 2016/0315133 | A1 | 10/2016 | Sato | |
| 2017/0082882 | A1* | 3/2017 | Hirakata | G06F 3/0446 |
| 2017/0141167 | A1 | 5/2017 | Naganuma | |
| 2017/0256754 | A1 | 9/2017 | Defranco et al. | |
| 2018/0190908 | A1 | 7/2018 | Ke et al. | |
| 2019/0189706 | A1* | 6/2019 | Choi | H10K 59/352 |
| 2020/0203662 | A1 | 6/2020 | Mollard et al. | |
| 2020/0212143 | A1 | 7/2020 | Jeong et al. | |

FOREIGN PATENT DOCUMENTS

| | | | |
|---|---|---|---|
| JP | 2003-059663 | A | 2/2003 |
| JP | 2007-220423 | A | 8/2007 |
| JP | 2008-098106 | A | 4/2008 |
| JP | 2008-147072 | A | 6/2008 |
| JP | 2008-251270 | A | 10/2008 |
| JP | 2012-160473 | A | 8/2012 |
| JP | 2014-120218 | A | 6/2014 |
| JP | 2014-135251 | A | 7/2014 |
| JP | 2014-232568 | A | 12/2014 |
| JP | 2015-090752 | A | 5/2015 |
| JP | 2015-115178 | A | 6/2015 |
| JP | 2016-197494 | A | 11/2016 |
| JP | 2019-179696 | A | 10/2019 |
| JP | 2020-160305 | A | 10/2020 |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterened by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke. T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

FIG. 8A

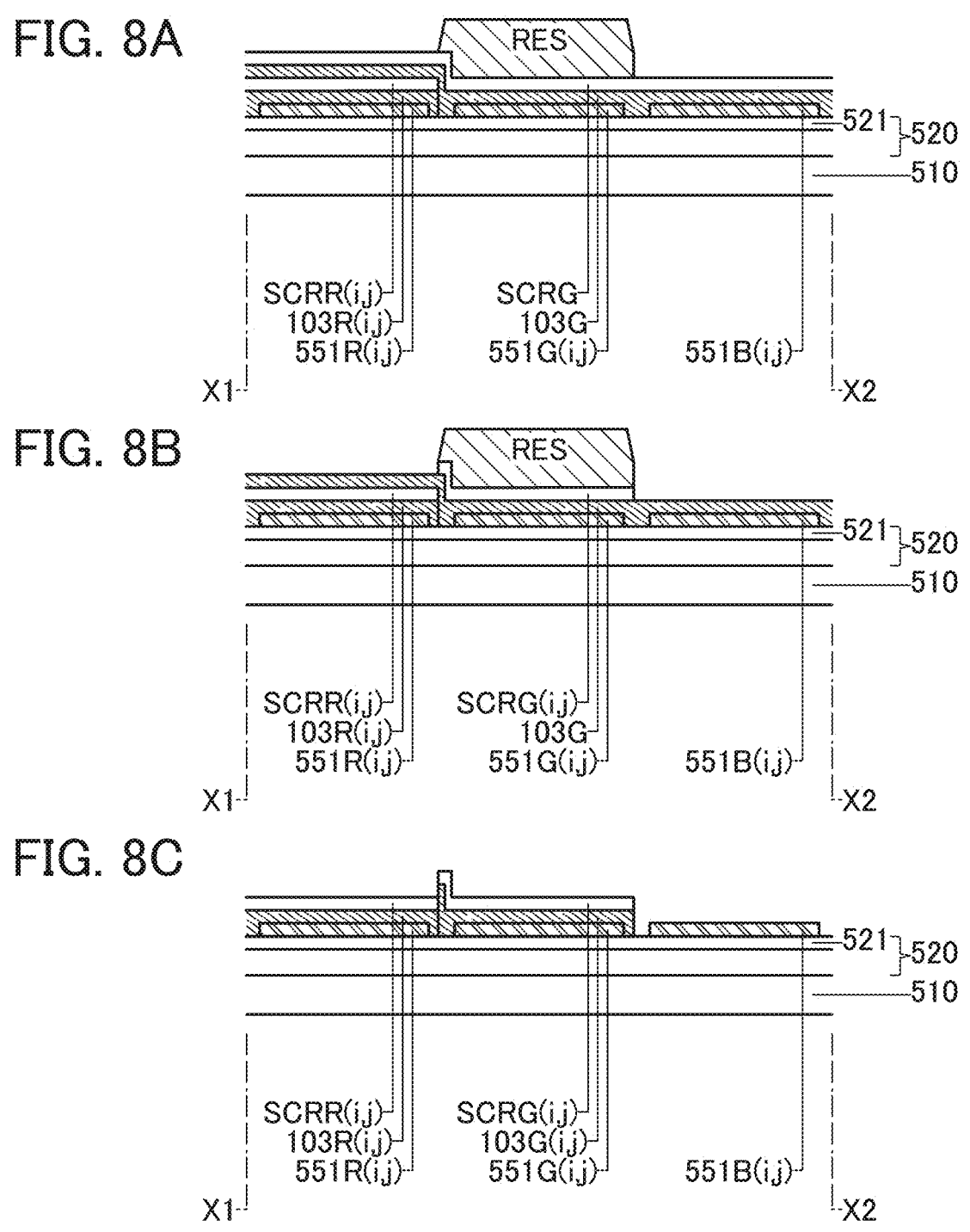

RES
521
520
510
SCRR(i,j)
103R(i,j)
551R(i,j)
SCRG
103G
551G(i,j)
551B(i,j)
X1
X2

FIG. 8B

RES
521
520
510
SCRR(i,j)
103R(i,j)
551R(i,j)
SCRG(i,j)
103G
551G(i,j)
551B(i,j)
X1
X2

FIG. 8C 521
520
510
SCRR(i,j)
103R(i,j)
551R(i,j)
SCRG(i,j)
103G(i,j)
551G(i,j)
551B(i,j)
X1
X2

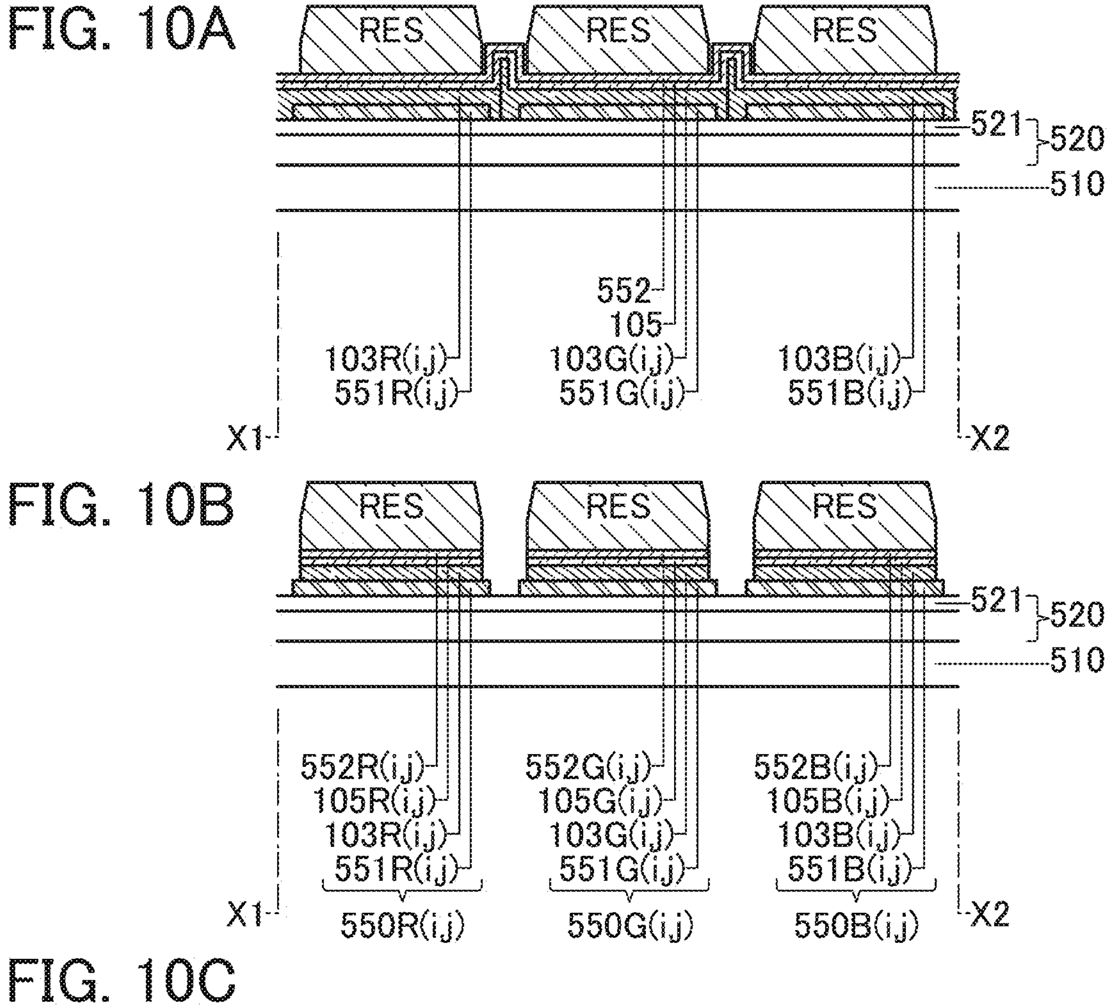
FIG. 10C
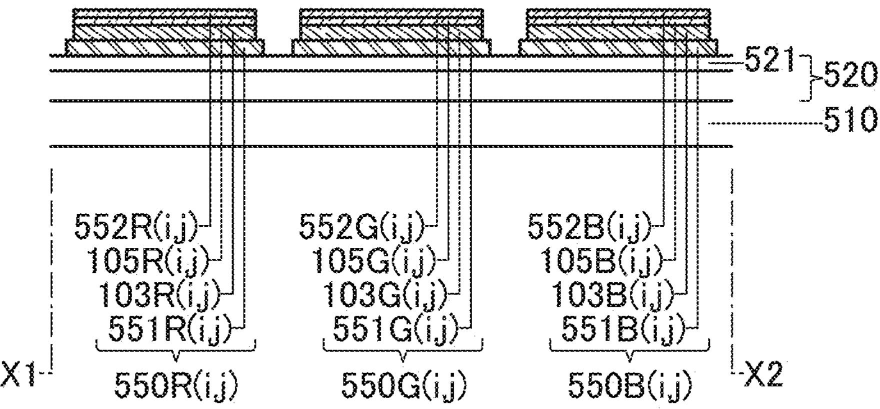

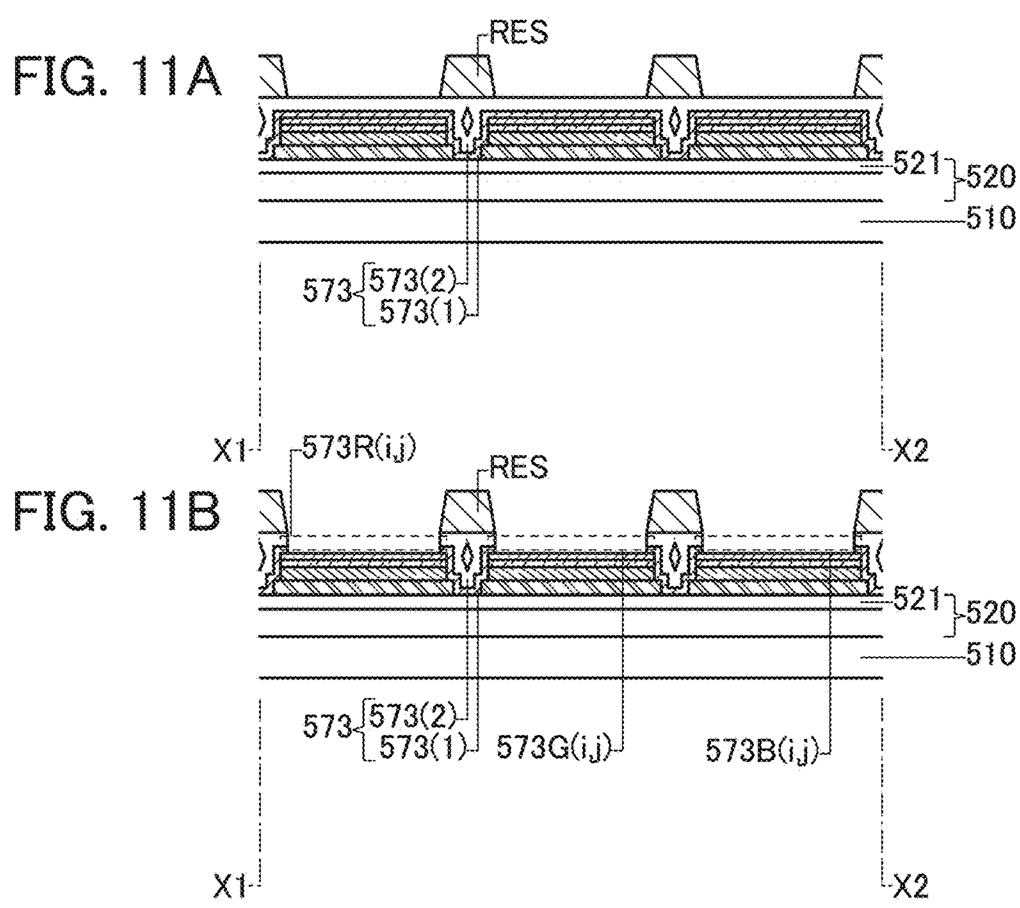
FIG. 11A
RES
521
520
510
573
573(2)
573(1)
X1
X2
FIG. 11B
573R(i,j)
RES
521
520
510
573
573(2)
573(1)
573G(i,j)
573B(i,j)
X1
X2
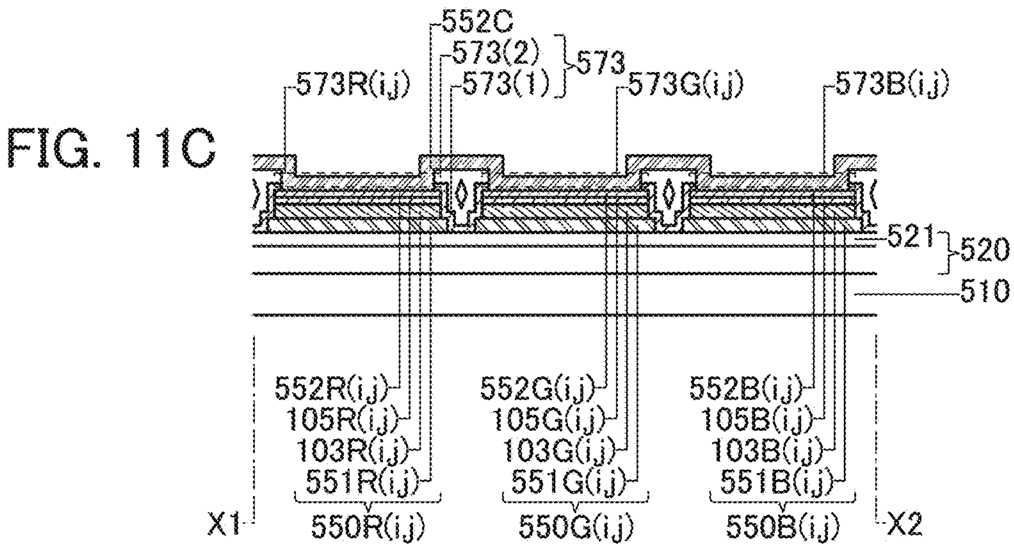
FIG. 11C
552C
573(2)
573(1)
573
573R(i,j)
573G(i,j)
573B(i,j)
521
520
510
552R(i,j)
105R(i,j)
103R(i,j)
551R(i,j)
550R(i,j)
552G(i,j)
105G(i,j)
103G(i,j)
551G(i,j)
550G(i,j)
552B(i,j)
105B(i,j)
103B(i,j)
551B(i,j)
550B(i,j)
X1
X2

FIG. 15A
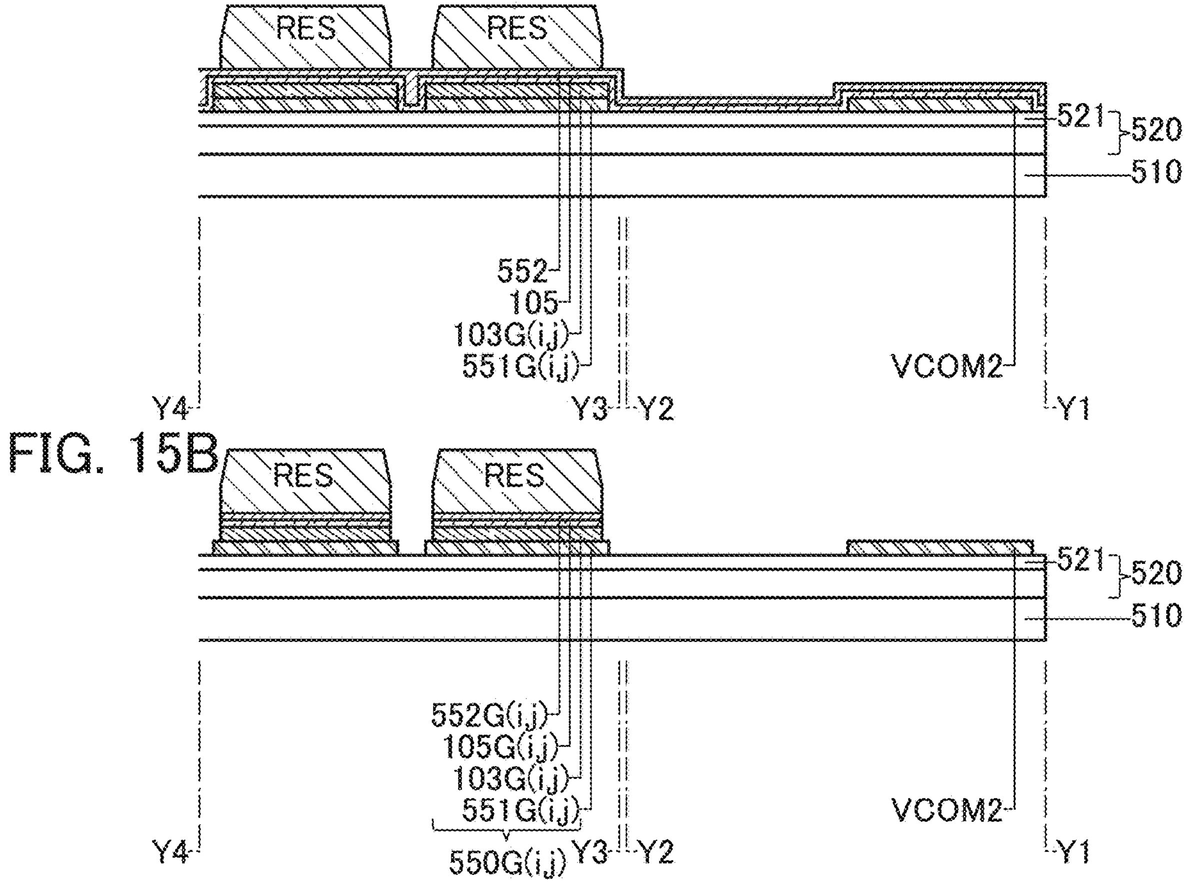
FIG. 15B
FIG. 15C
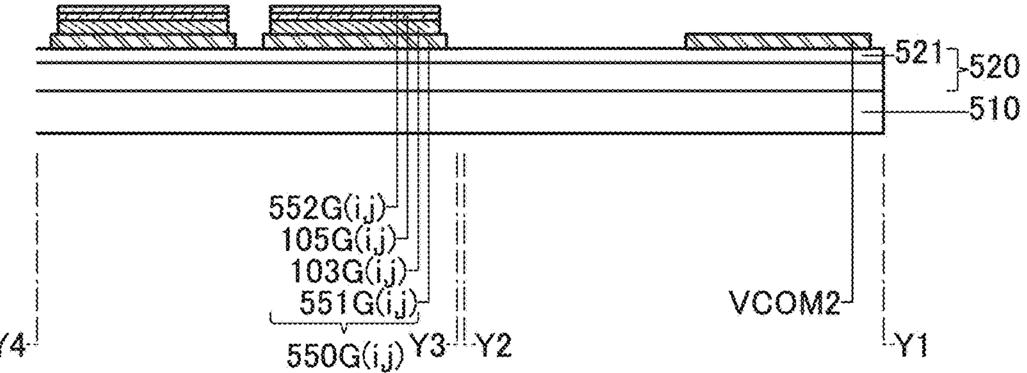

0eV 0.2eV

−5.4eV

HOMO1

HOMO2

FIG. 27A
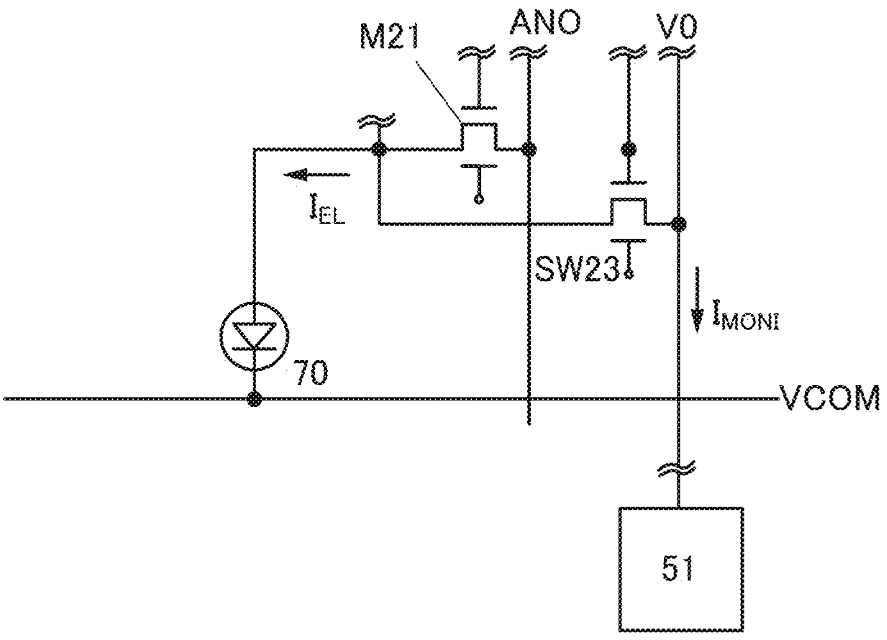
FIG. 27B
FIG. 27C
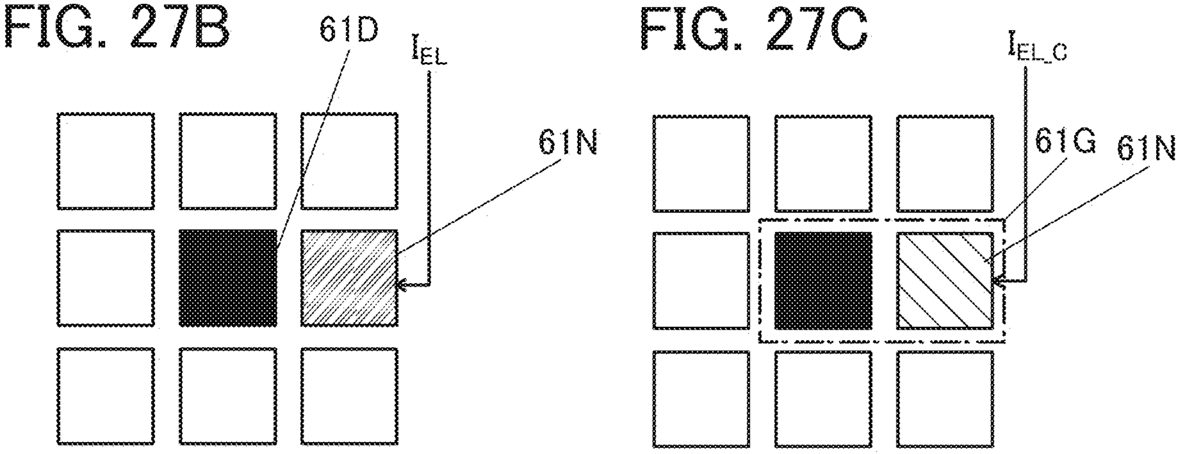

FIG. 30A
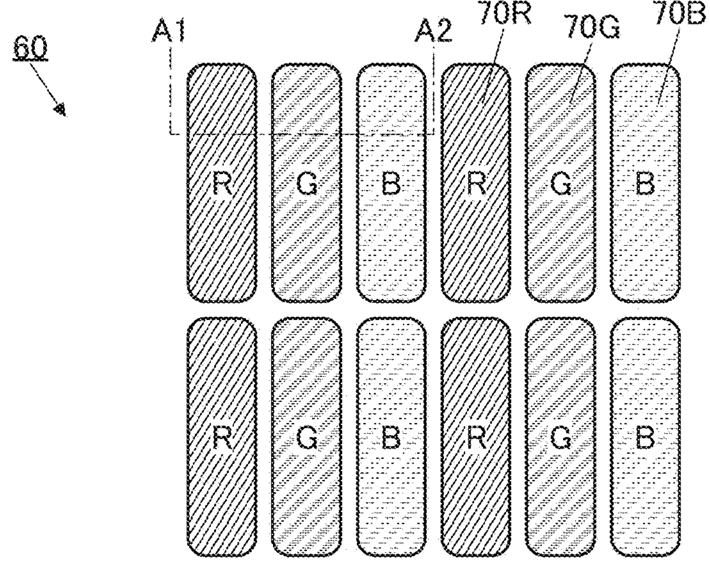
FIG. 30B
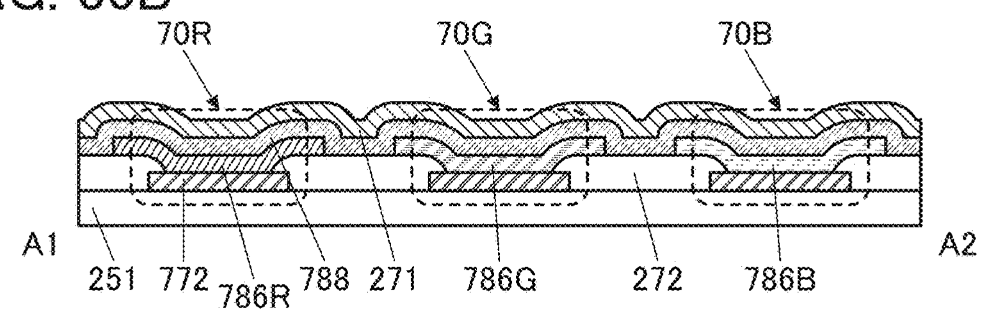
FIG. 30C
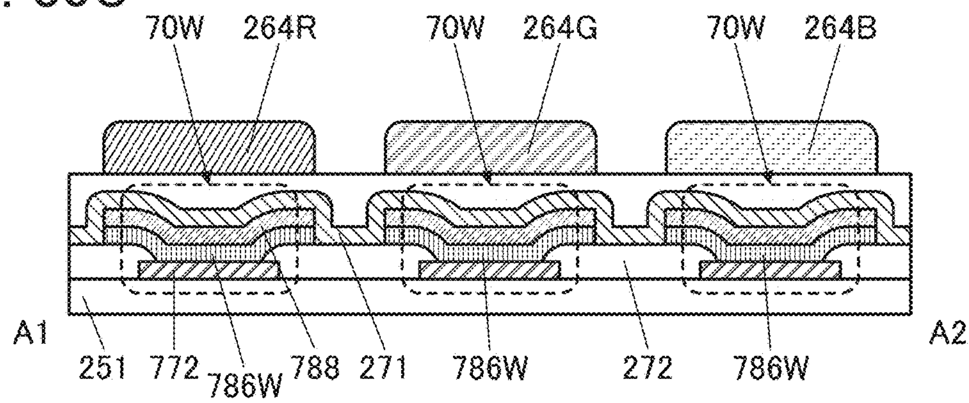
FIG. 30D
70R
273
275
70G
70B
A1
A2
251
772
786R
788
271
786G
786B 10
70
30
20
40.62
50.82
91
92
93
94
95
96

FIG. 38A
FIG. 38C
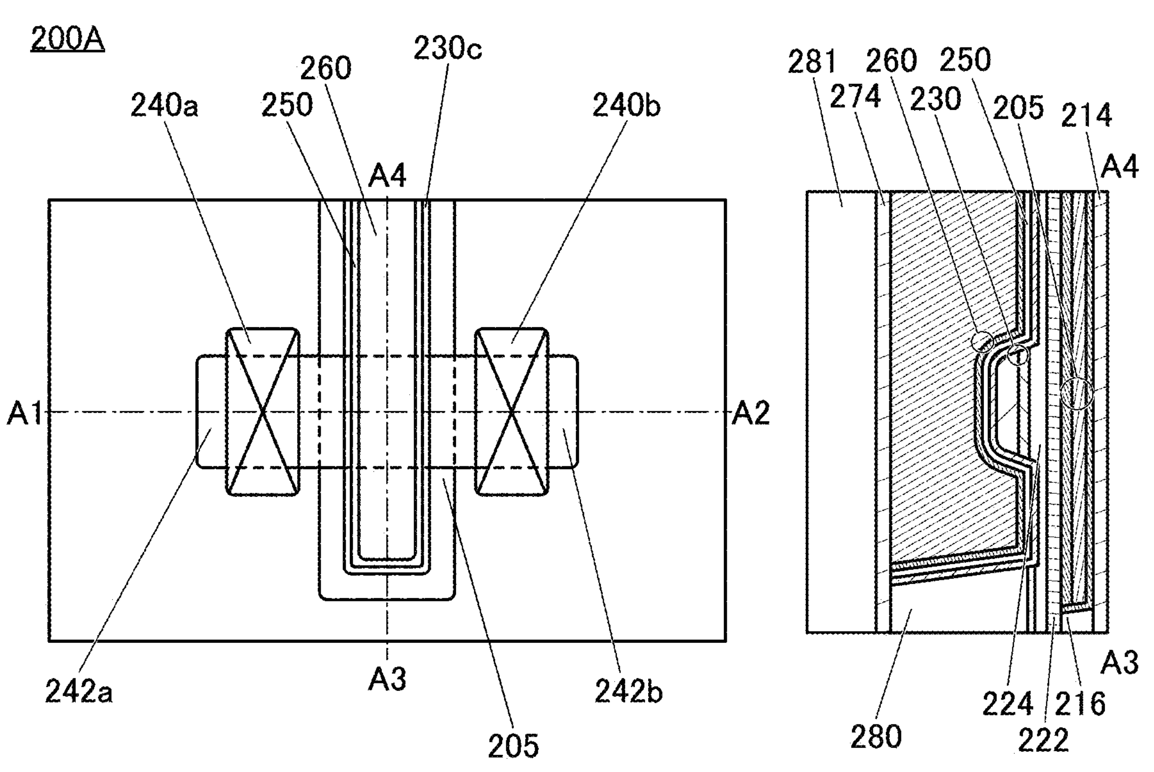
FIG. 38B
240: 240a, 240b
241: 241a, 241b
242: 242a, 242b
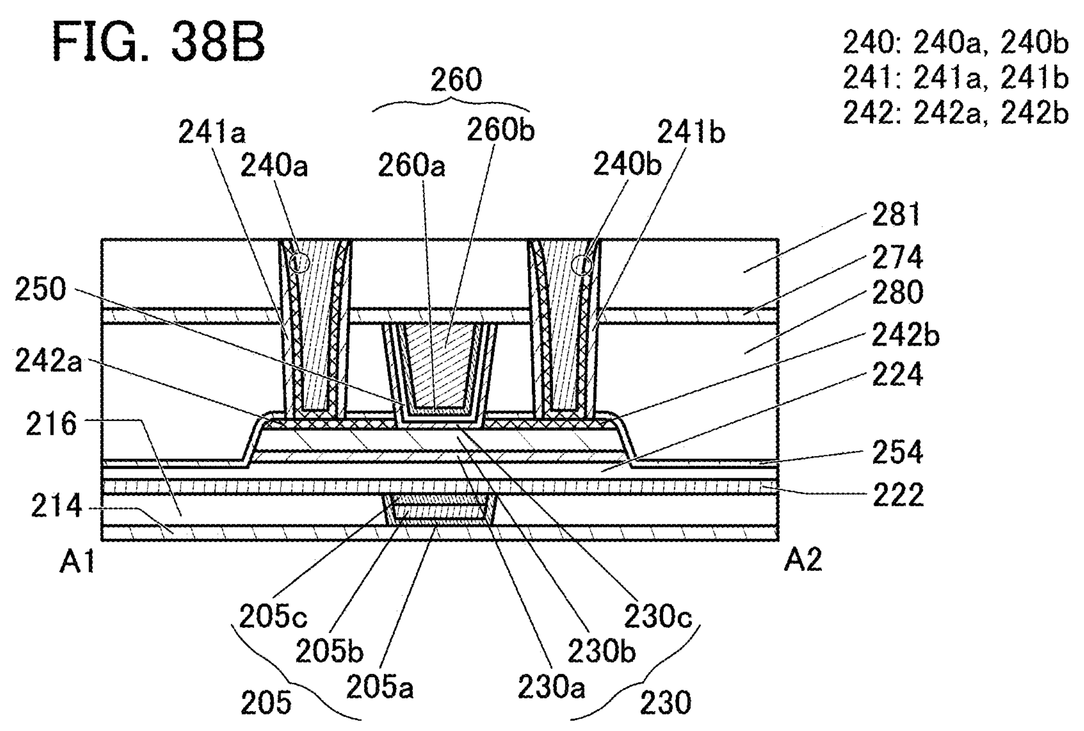

FIG. 39A
Intermediate state
New Crystalline Phase
| Amorphous | Crystalline | Crystal |
| --- | --- | --- |
| ・completely amorphous | ・CAAC<br>・nc<br>・CAC<br>excluding single crystal and poly crystal | ・single crystal<br>・poly crystal |
FIG. 39B
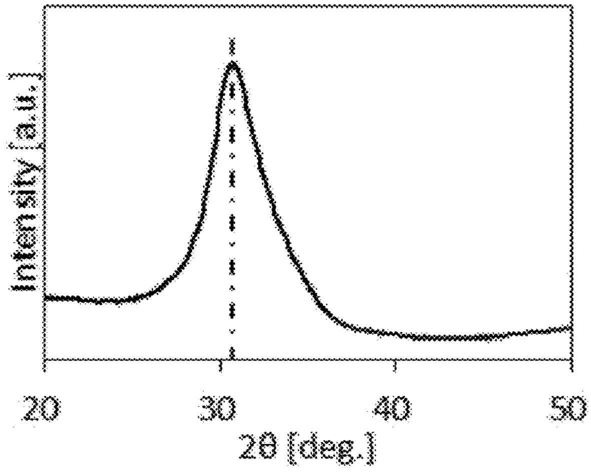
FIG. 39C
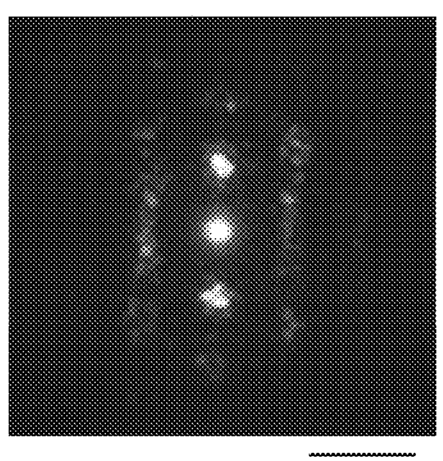

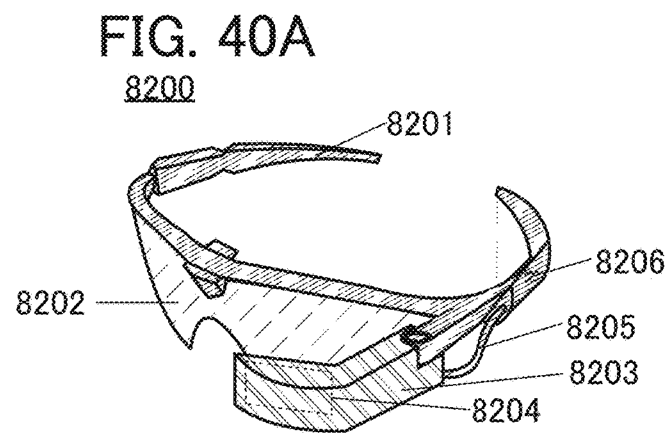
FIG. 40A
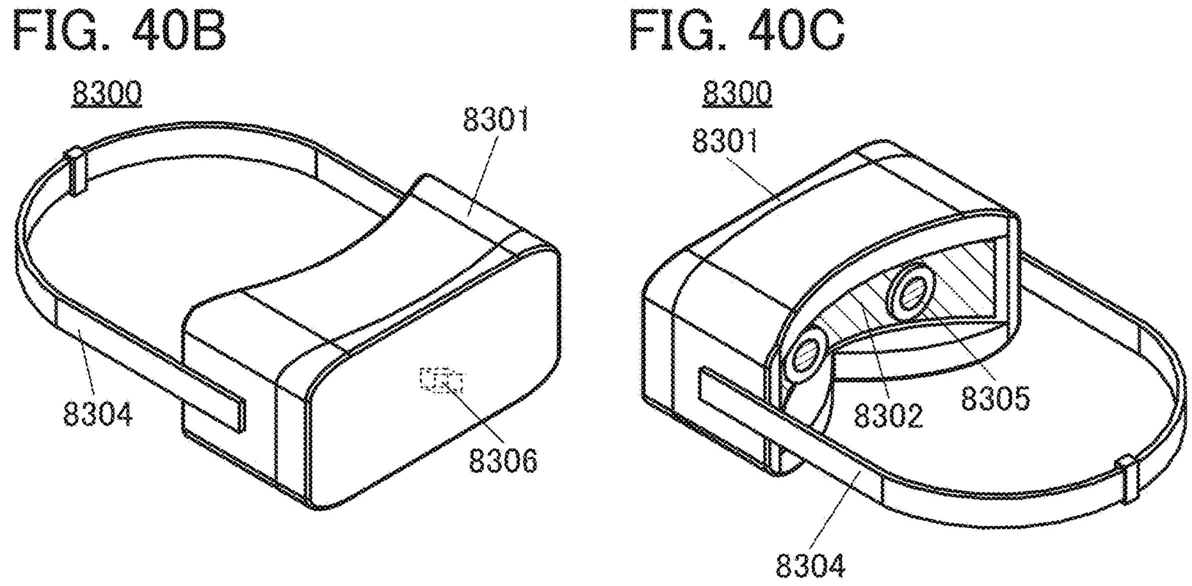
FIG. 40B
FIG. 40C
FIG. 40D
8300
8305
8301
8302

DISPLAY PANEL, DATA PROCESSING DEVICE AND METHOD FOR MANUFACTURING THE DISPLAY PANEL

PRIORITY

This application is based on Japanese Patent Application Serial No. 2021-004571 filed with Japan Patent Office on Jan. 14, 2021, the entire contents of which are hereby incorporated by reference.

BACKGROUND OF THE INVENTION

1. Field of the Invention

One embodiment of the present invention relates to a display panel, a method for manufacturing the display panel, a data processing device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting device, a power storage device, a memory device, a method for driving any of them, and a method for manufacturing any of them.

2. Description of the Related Art

A method for manufacturing an organic EL display in which a light-emitting layer can be formed without using a fine metal mask is known. An example of the method is a method for manufacturing an organic EL display described in Patent Document 1. The method includes a step of forming a first light-emitting layer as a continuous film crossing a display region including an electrode array by deposition of a first luminescent organic material containing a mixture of a host material and a dopant material over the electrode array that is formed over an insulating substrate and includes a first pixel electrode and a second pixel electrode; a step of irradiating part of the first light-emitting layer positioned over the second pixel electrode with ultraviolet light while part of the first light-emitting layer positioned over the first pixel electrode is not irradiated with ultraviolet light; a step of forming a second light-emitting layer as a continuous film crossing a display region by deposition of a second luminescent organic material, which contains a mixture of a host material and a dopant material but differs from the first luminescent organic material, over the first light-emitting layer; and a step of forming a counter electrode over the second light-emitting layer.

REFERENCE

[Patent Document 1] Japanese Published Patent Application No. 2012-160473

SUMMARY OF THE INVENTION

An object of one embodiment is to provide a novel display panel that is highly convenient, useful, or reliable. Another object of one embodiment of the present invention is to provide a novel method for manufacturing the display panel that is highly convenient, useful, or reliable. Another object is to provide a novel data processing device that is highly convenient, useful, or reliable. Another object is to provide a novel display panel, a novel method for manufacturing the display panel, a novel data processing device, or a novel semiconductor device.

Note that the description of these objects does not preclude the existence of other objects. One embodiment of the present invention does not have to achieve all these objects. Other objects will be apparent from and can be derived from the description of the specification, the drawings, the claims, and the like.

(1) One embodiment of the present invention is a display panel including a first light-emitting device, a second light-emitting device, a first insulating film, and a conductive film.

The first light-emitting device includes a first electrode and a second electrode. The first electrode includes a first region overlapping with the second electrode and a second region outside the first region.

The second light-emitting device includes a third electrode and a fourth electrode, and the third electrode includes a third region overlapping with the fourth electrode and a fourth region outside the third region.

The first insulating film is in contact with the second region and the fourth region. The first insulating film includes a first opening and a second opening. The first opening overlaps with the second electrode, and the second opening overlaps with the fourth electrode.

The conductive film is electrically connected to the second electrode in the first opening, and the conductive film is electrically connected to the fourth electrode in the second opening.

Accordingly, a short circuit between the second region of the first electrode and the second electrode can be prevented. A short circuit between the second region of the first electrode and the conductive film can be prevented. In addition, a short circuit between the fourth region of the third electrode and the fourth electrode can be prevented. In addition, a short circuit between the fourth region of the third electrode and the conductive film can be prevented. A potential that is equal to a potential of the second electrode can be supplied to the fourth electrode. In addition, a display defect or display unevenness can be prevented. As a result, a novel display panel that is highly convenient, useful, or reliable can be provided.

(2) Another embodiment of the present invention is the display panel in which the first light-emitting device includes a first unit and the second light-emitting device includes a second unit.

The first unit is sandwiched between the second electrode and the first electrode, and the first unit has a function of emitting first light.

The second unit is sandwiched between the fourth electrode and the third electrode, and the second unit has a function of emitting second light. In addition, a hue of the second light is different from that of the first light.

(3) Another embodiment of the present invention is the display panel in which the first light-emitting device includes a first layer and the second light-emitting device includes a second layer.

The first layer is sandwiched between the second electrode and the first unit, and the first layer includes an electron-injection material.

The second layer is sandwiched between the fourth electrode and the second unit, and the second layer includes the electron-injection material.

Thus, light with a predetermined hue can be exhibited using the first light-emitting device and the second light-emitting device by an additive color mixing method. As a result, a novel display panel that is highly convenient, useful, or reliable can be provided.

(4) Another embodiment of the present invention is the display panel in which the fourth electrode includes a sidewall facing a sidewall of the second electrode, and the second unit includes a sidewall facing a sidewall of the first unit.

In addition, the first insulating film is in contact with the sidewall of the second electrode, the sidewall of the fourth electrode, the sidewall of the first unit, and the sidewall of the second unit.

Accordingly, surrounding impurities, which would damage the reliability of the first light-emitting device, can be prevented from diffusing into the first unit through the sidewall of the first unit. Furthermore, surrounding impurities, which would damage the reliability of the second light-emitting device, can be prevented from diffusing into the second unit through the sidewall of the second unit. Furthermore, the first insulating film can prevent a current from flowing between the first unit and the second unit. In addition, crosstalk between the first light-emitting device and the second light-emitting device can be prevented. As a result, a novel display panel that is highly convenient, useful, or reliable can be provided.

(5) Another embodiment of the present invention is the display panel in which the first insulating film includes a second insulating film and a third insulating film.

The second insulating film includes a region between the sidewall of the second electrode and the third insulating film, a region between the sidewall of the fourth electrode and the third insulating film, a region between the sidewall of the first unit and the third insulating film, and a region between the sidewall of the second unit and the third insulating film.

Thus, for example, a film that can cover a complicated cross-sectional shape can be used for the second insulating film and a film whose deposition rate is higher than that of the second insulating film can be used for the third insulating film. In addition, a material that can capture impurities, which would damage the reliability of the light-emitting device, can be used for the second insulating film, and a material that can suppress diffusion of such impurities, which would damage the reliability of the light-emitting device, can be used for the third insulating film. As a result, a novel display panel that is highly convenient, useful, or reliable can be provided.

(6) Another embodiment of the present invention is the display panel including a fourth insulating film. The fourth insulating film is in contact with the first electrode, the third electrode, and the first insulating film.

(7) Another embodiment of the present invention is a data processing device including the above-described display panel and at least one of a keyboard, a hardware button, a pointing device, a touch sensor, an illuminance sensor, an imaging device, an audio input device, a sight input device, and an attitude detection device.

(8) Another embodiment of the present invention is a method for manufacturing a display panel having the following first to twentieth steps.

In the first step, a first electrode, a second electrode, and a third electrode are formed.

In the second step, a first unit is formed over the first electrode, the second electrode, and the third electrode.

In the third step, a first sacrifice layer is formed over the first unit.

In the fourth step, parts of the first sacrifice layer over the second electrode and the third electrode are removed by a photoetching method so that the first sacrifice layer is formed into a predetermined shape.

In the fifth step, parts of the first unit over the second electrode and the third electrode are removed by an etching method so that the first unit is formed into a predetermined shape overlapping with the first sacrifice layer.

In the sixth step, a second unit is formed over the first sacrifice layer, the second electrode, and the third electrode.

In the seventh step, a second sacrifice layer is formed over the second unit.

In the eighth step, parts of the second sacrifice layer over the first sacrifice layer and the third electrode are removed by a photoetching method so that the second sacrifice layer is formed into a predetermined shape.

In the ninth step, parts of the second unit over the first sacrifice layer and the third electrode are removed by an etching method so that the second unit is formed into a predetermined shape overlapping with the second sacrifice layer.

In the tenth step, a third unit is formed over the first sacrifice layer, the second sacrifice layer, and the third electrode.

In the eleventh step, a third sacrifice layer is formed over the third unit.

In the twelfth step, parts of the third sacrifice layer over the first sacrifice layer and the second sacrifice layer are removed by a photoetching method so that the third sacrifice layer is formed into a predetermined shape.

In the thirteenth step, parts of the third unit over the first sacrifice layer and the second sacrifice layer are removed by an etching method so that the third unit is formed into a predetermined shape overlapping with the third sacrifice layer.

In the fourteenth step, the first sacrifice layer, the second sacrifice layer, and the third sacrifice layer are removed by an etching method.

In the fifteenth step, a first layer is formed over the first unit, the second unit, and the third unit.

In the sixteenth step, a fourth electrode is formed over the first layer.

In the seventeenth step, slits are formed in surroundings of the first electrode, the second electrode, and the third electrode by a photoetching method to form a first light-emitting device, a second light-emitting device, and a third light-emitting device.

In the eighteenth step, an insulating film is formed to cover the first light-emitting device, the second light-emitting device, the third light-emitting device, and sidewalls of the slits.

In the nineteenth step, a first opening in the insulating film over the first light-emitting device, a second opening in the insulating film over the second light-emitting device, and a third opening in the insulating film over the third light-emitting device are formed by a photoetching method In the twentieth step, a conductive film is formed to cover the first opening, the second opening, and the third opening.

Thus, a display panel including a plurality of light-emitting devices can be manufactured without using a metal mask. As a result, a novel method for manufacturing a display panel that is highly convenient, useful, or reliable can be provided.

Although the block diagram in drawings attached to this specification shows components classified based on their functions in independent blocks, it is difficult to classify actual components based on their functions completely, and one component can have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, the connection relation of a transistor is sometimes described assuming for convenience that the source and the drain are fixed; in reality, the names of the source and the drain interchange with each other depending on the relation of the potentials.

In this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

In this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state where current, voltage, or a potential can be supplied or transmitted. Accordingly, a state of being connected means not only a state of being directly connected but also a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring serves as an electrode. Connection in this specification also includes such a case where one conductive film has functions of a plurality of components, in its category.

In this specification, one of a first electrode and a second electrode of a transistor refers to a source electrode and the other thereof refers to a drain electrode.

One embodiment of the present invention can provide a novel display panel that is highly convenient, useful, or reliable. A novel method for manufacturing the display panel that is highly convenient, useful, or reliable can be provided. A novel data processing device that is highly convenient, useful, or reliable can be provided. A novel display panel, a novel method for manufacturing the display panel, a novel data processing device, or a novel semiconductor device can be provided.

Note that the description of these effects does not preclude the existence of other effects. One embodiment of the present invention does not necessarily have all these effects. Other effects will be apparent from and can be derived from the description of the specification, the drawings, the claims, and the like.

BRIEF DESCRIPTION OF THE DRAWINGS

In the accompanying drawings:

FIGS. 8A to 8C illustrate the method for manufacturing the display panel according to the embodiment;

FIGS. 9A to 9D illustrate the method for manufacturing the display panel according to the embodiment;

FIGS. 10A to 10C illustrate the method for manufacturing the display panel according to the embodiment;

FIGS. 11A to 11C illustrate the method for manufacturing the display panel according to the embodiment;

FIGS. 13A to 13C illustrate the method for manufacturing the display panel according to the embodiment;

FIGS. 15A to 15C illustrate the method for manufacturing the display panel according to the embodiment;

FIGS. 21A to 21E each illustrate a structure of a data processing device according to one embodiment;

FIGS. 27A to 27C are a circuit diagram and schematic diagrams illustrating a structure example of the display device;

FIGS. 30A to 30D each illustrate a structure example of a display device;

FIG. 38A is a top view illustrating a structure example of a transistor, and FIGS. 38B and 38C are cross-sectional views illustrating the structure example of the transistor;

FIG. 39A is a diagram illustrating the classification of crystal structures of IGZO, FIG. 39B is a graph showing an XRD spectrum of a CAAC-IGZO film, and FIG. 39C is an image showing nanobeam electron diffraction patterns of a CAAC-IGZO film;

FIGS. 40A to 40D illustrate examples of electronic devices;

DETAILED DESCRIPTION OF THE INVENTION

Figure 1A:
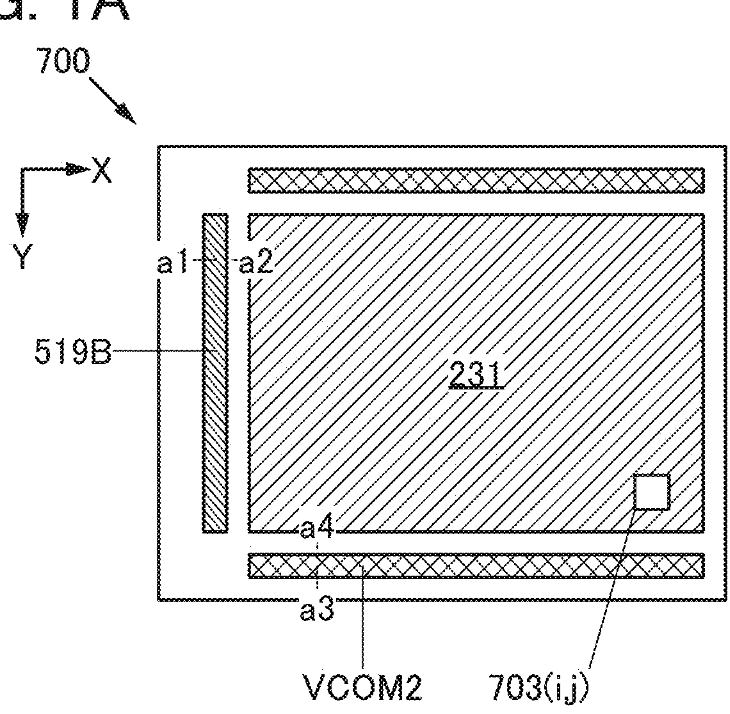
FIGS. 1A and 1B illustrate a structure of a display panel according to one embodiment.

A display panel of one embodiment of the present invention includes a first light-emitting device, a second light-emitting device, a first insulating film, and a conductive film. The first light-emitting device includes a first electrode and a second electrode; the first electrode includes a first region overlapping with the second electrode and a second region outside the first region. The second light-emitting device includes a third electrode and a fourth electrode, and the third electrode includes a third region overlapping with the fourth electrode and a fourth region outside the third region. The first insulating film is in contact with the second region and the fourth region, and the first insulating film includes a first opening and a second opening. The first opening overlaps with the second electrode and the second opening overlaps with the fourth electrode. The conductive film is electrically connected to the second electrode and the fourth electrode in the first opening and in the second opening, respectively.

With such a structure, a short circuit between the second region of the first electrode and the second electrode can be prevented. A short circuit between the second region of the first electrode and the conductive film can be prevented. Furthermore, a short circuit between the fourth region of the third electrode and the fourth electrode can be prevented. A short circuit between the fourth region of the third electrode and the conductive film can be prevented. In addition, a potential which is equal to the potential of the second electrode can be supplied to the fourth electrode. Moreover, a display defect or display unevenness can be prevented. As a result, a novel display panel that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the present invention described below, the same portions or portions having similar functions are denoted by the same reference numerals in different drawings, and the description thereof is not repeated.

Embodiment 1

In this embodiment, a structure of a display panel of one embodiment of the present invention will be described with reference to FIGS. 1A and 1B, FIG. 2, FIGS. 3A and 3B, FIGS. 4A to 4C, and FIG. 5. Note that a display panel described in this specification can also be referred to as a display device.

Figure 1B:
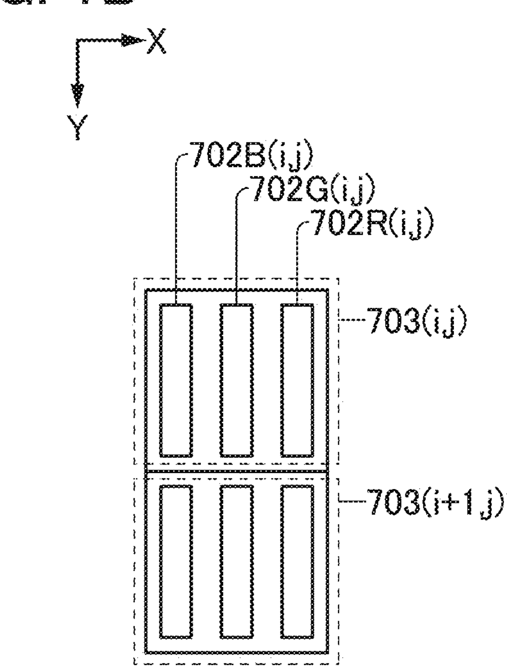

FIGS. 1A and 1B illustrate a structure of the display panel of one embodiment of the present invention. FIG. 1A is a top view illustrating the display panel of one embodiment of the present invention, and FIG. 1B is a top view illustrating part of the display panel.

Figure 2:
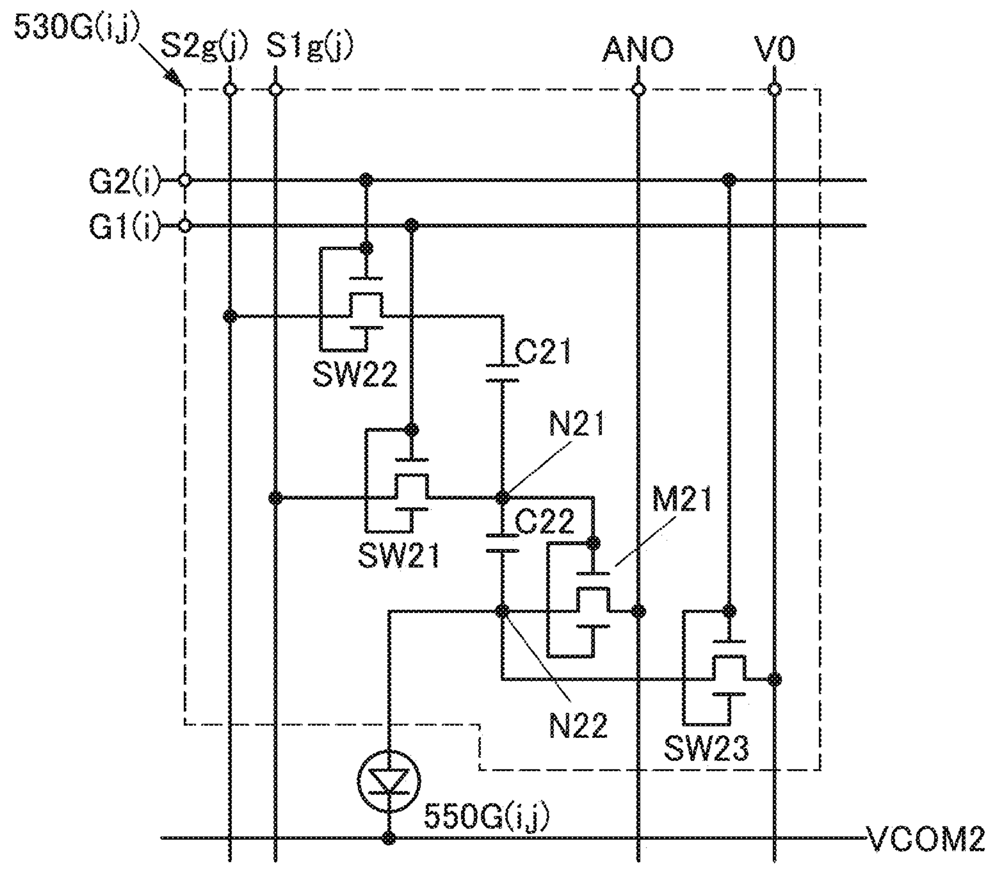
FIG. 2 is a circuit diagram illustrating a pixel of a display panel according to one embodiment.

FIG. 2 is a circuit diagram illustrating a pixel in the display panel of one embodiment of the present invention.

Figure 3A:
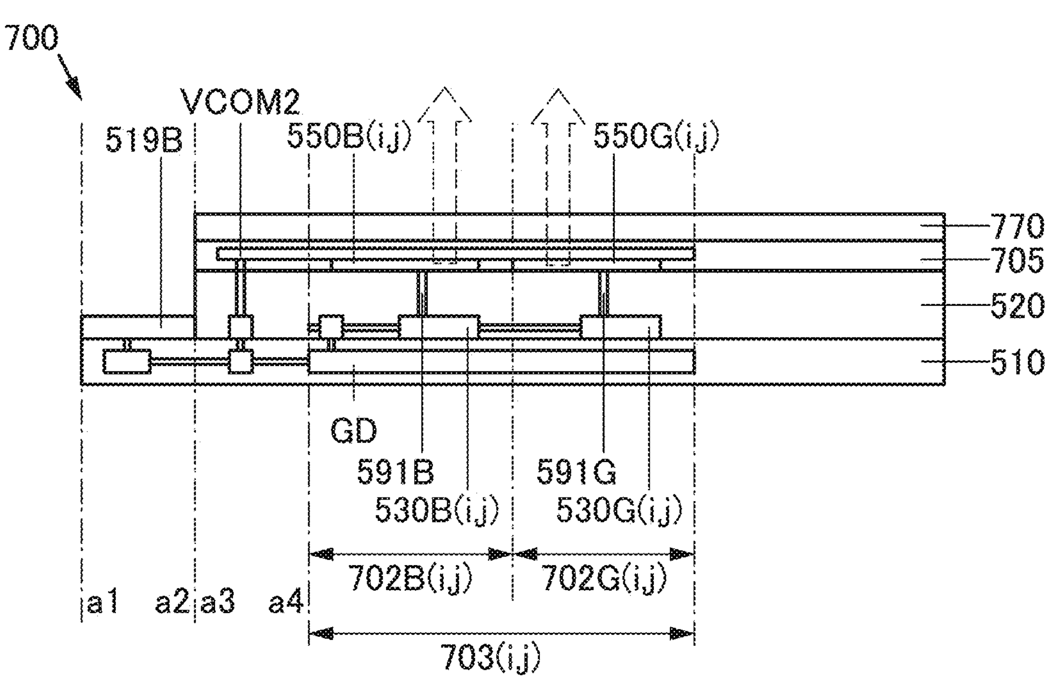
FIGS. 3A and 3B illustrate a structure of a display panel according to one embodiment.
Figure 3B:
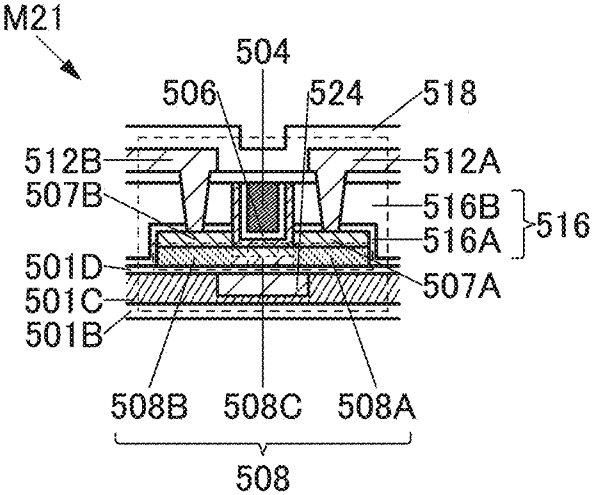

FIGS. 3A and 3B are cross-sectional views illustrating the structure of the display panel of one embodiment of the present invention. FIG. 3A illustrates cross sections taken along the cutting lines a1-a2 and a3-a4 in FIG. 1A and a cross section of a set of pixels 703($i,j$). FIG. 3B is a cross-sectional view illustrating a transistor that can be used in the display panel of one embodiment of the present invention.

Figure 4A:
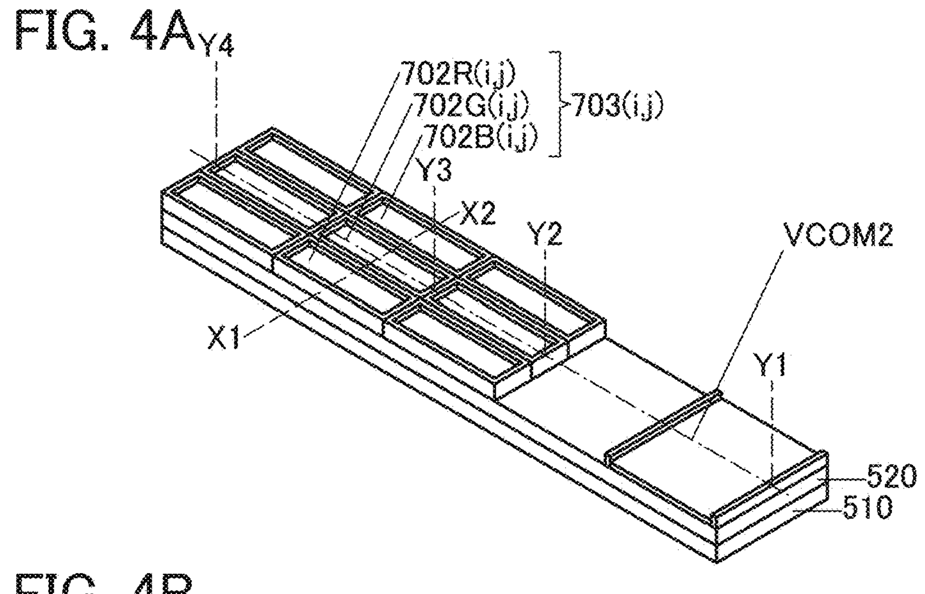
FIGS. 4A to 4C illustrate a structure of a display panel according to one embodiment.
Figure 4B:
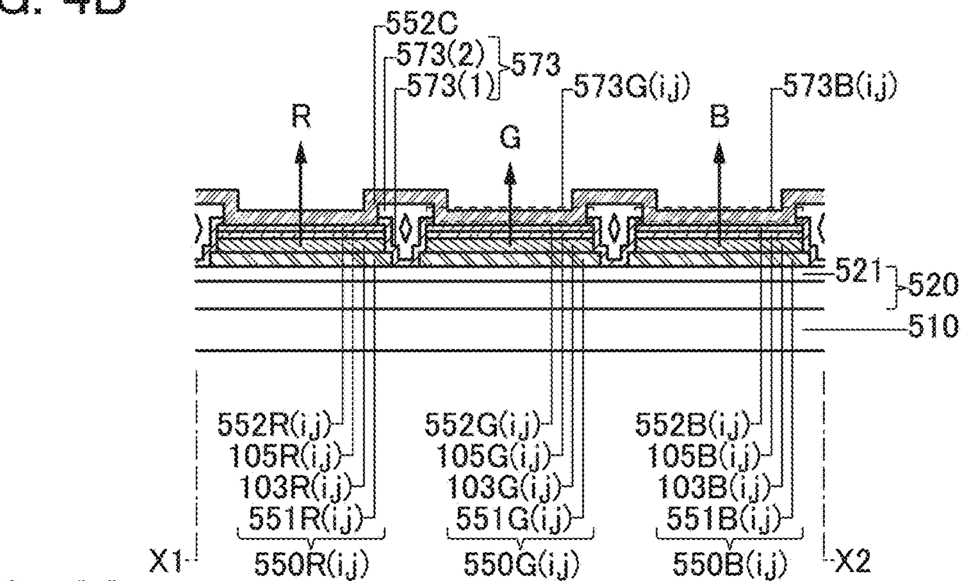
Figure 4C:
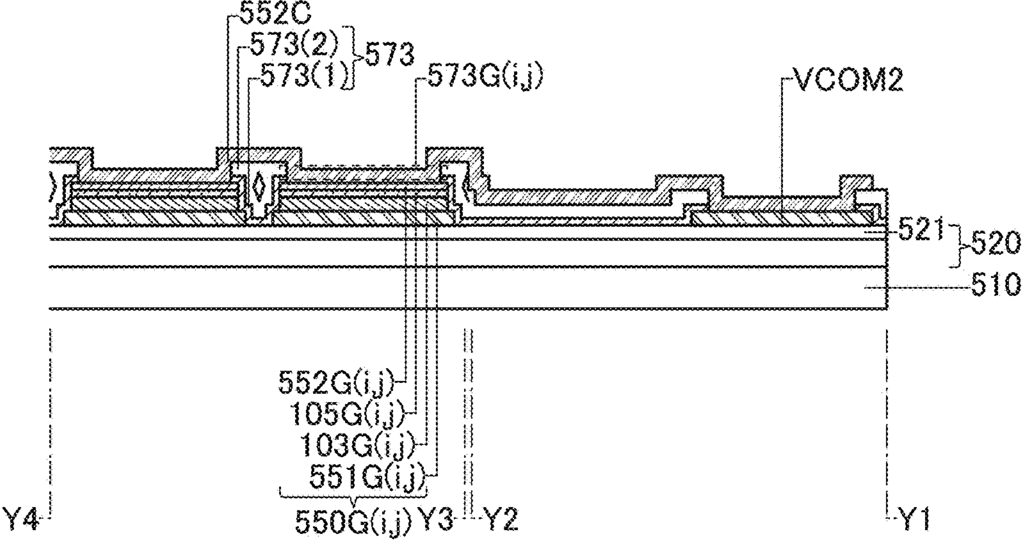

FIGS. 4A to 4C illustrate a structure of a display panel of one embodiment of the present invention. FIG. 4A is a perspective view illustrating part of the display panel of one embodiment of the present invention, FIG. 4B is a cross-sectional view taken along the cutting line X1-X2 in FIG. 4A, and FIG. 4C is a cross-sectional view taken along the cutting line Y1-Y2 and the cutting line Y3-Y4 in FIG. 4A.

Figure 5:
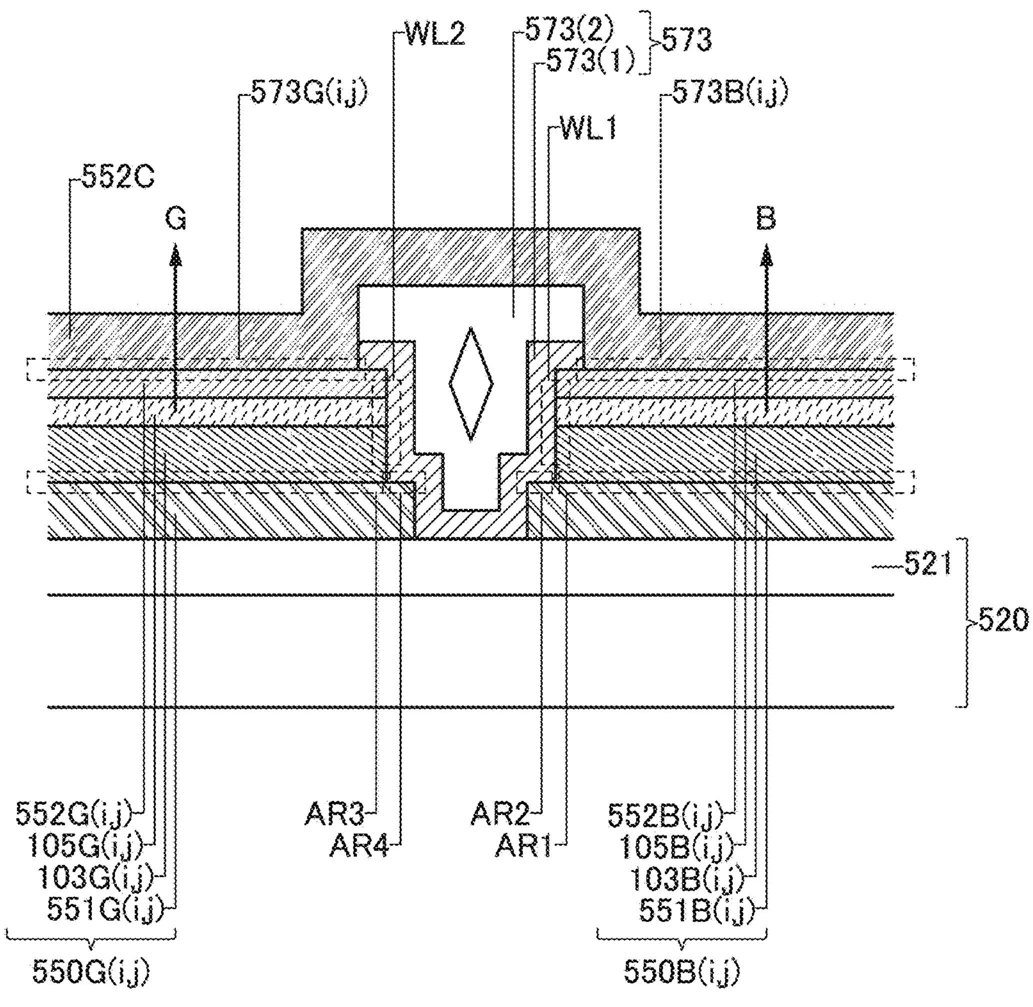
FIG. 5 illustrates part of FIG. 4B.

FIG. 5 is a schematic cross-sectional view of a pixel in a display panel of one embodiment of the present invention. FIG. 5 is a view illustrating part of the pixel illustrated in FIG. 4B.

In this specification and the like, a device using a metal mask or a fine metal mask (FMM) is referred to as a device with a metal mask (MM) structure in some cases. Also in this specification and the like, a device that does not use a metal mask or an FMM is referred to as a device with a metal maskless (MML) structure in some cases.

In this specification and the like, a structure in which light-emitting layers are separately formed or patterned to make light-emitting devices for emission colors (e.g., blue (B), green (G), and red (R)) is called a side by side (SBS) structure in some cases. In this specification and the like, a light-emitting device capable of emitting white light is called a white light-emitting device in some cases. Note that a white light-emitting device can be a full-color display device by being combined with a coloring layer (e.g., a color filter).

The light-emitting devices can be roughly classified into a single structure and a tandem structure. It is preferable that a device having a single structure include one light-emitting unit between a pair of electrodes and the light-emitting unit include one or more light-emitting layers. To obtain white light emission, two or more light-emitting layers may be selected such that emission colors of the light-emitting layers are complementary colors. Thus, the emission colors of the first light-emitting layer and the second light-emitting layer are made complementary, so that the whole light-emitting device can emit white light, for example. This can be applied to a light-emitting device including three or more light-emitting layers.

It is preferable that a device having a tandem structure include two or more light-emitting units between a pair of electrodes and each light-emitting unit include one or more light-emitting layers. To obtain white light emission, white light may be obtained by combining light emitted from light-emitting layers of a plurality of light-emitting units. Note that the structure that can provide white light emission is similar to that of the single structure. In the device having a tandem structure, an intermediate layer such as a charge-generation layer is preferably provided between the plurality of light-emitting units.

When the above-described white light-emitting device (including a single structure or a tandem structure) and a light-emitting device having an SBS structure are compared, the light-emitting device having an SBS structure can have lower power consumption than the white light-emitting device. In the case where power consumption is required to be low, the light-emitting device having an SBS structure is preferably used. In contrast, the white light-emitting device is preferable in that the manufacturing cost is low and the manufacturing yield is high because a process for manufacturing the white light-emitting device is easier than that for the light-emitting device having an SBS structure.

Note that in this specification, an integer variable of 1 or more may be used for reference numerals. For example, "(p)" where p is an integer variable of 1 or more may be used for part of a reference numeral that specifies any one of components (p components at a maximum). For another example, "(m,n)" where each of m and n is an integer variable of 1 or more may be used for part of a reference numeral that specifies any one of components (m×n components at a maximum).

Structure Example 1 of Display Panel 700

A display panel 700 includes a display region 231, and the display region 231 includes a set of pixels 703(*i,j*) (see FIG. 1A). The display region 231 also includes a set of pixels 703(*i*+1,j) adjacent to the set of pixels 703(*i,j*) (see FIG. 1B).

Structure Example 1 of Display Region 231

For example, the display region 231 includes 500 or more pixel sets per inch. Furthermore, the display region 231 includes 1000 or more pixel sets per inch, preferably 5000 or more pixel sets per inch, further preferably 10000 or more pixel sets per inch. Thus, for example, the use of the display region 231 for a goggle-type display device can reduce a screen-door effect.

Structure Example 2 of Display Region 231

For example, the display region 231 includes a plurality of pixels in a matrix. For example, the display region 231 includes 7600 or more pixels in the row direction and 4300 or more pixels in the column direction. Specifically, the region 231 includes 7680 pixels in the row direction and 4320 pixels in the column direction. Consequently, a high-resolution image can be displayed.

Structure Example 1 of Pixel 703(*i,j*)

A plurality of pixels can be used as the pixel 703(*i,j*) (see FIG. 1B). For example, a plurality of pixels that show colors of different hues can be used. Note that the plurality of pixels can be referred to as subpixels. In addition, a set of subpixels can be referred to as a pixel.

Such a structure enables additive mixture or subtractive mixture of colors emitted from the plurality of pixels. Alternatively, it is possible to express a color of a hue that an individual pixel cannot emit.

Specifically, a pixel 702B(i,j) for emitting blue light, the pixel 702G(i,j) for emitting green light, and a pixel 702R(i,j) for emitting red light can be used in the pixel 703(*i,j*). The pixel 702B(i,j), the pixel 702G(i,j), and the pixel 702R(i,j) can each be referred to as a subpixel.

In another example, a pixel for white emission or the like in addition to the above set can be used in the pixel 703(*i,j*). Moreover, a pixel for cyan emission, a pixel for magenta emission, and a pixel for yellow emission can be used in the pixel 703(*i,j*).

As another example, a pixel emitting infrared rays can be used in the pixel 703(*i,j*) in addition to the above set. Specifically, a pixel that emits light including light with a wavelength of greater than or equal to 650 nm and less than or equal to 1000 nm can be used in the pixel 703(*i,j*).

Structure Example 2 of Display Panel 700

The display panel 700 includes a light-emitting device 550 B(i,j) and a light-emitting device 550 G(i,j) (see FIG. 3A). The display panel 700 includes a base 510, a functional layer 520, an insulating film 705, and a base 770.

The light-emitting device 550 B(i,j) and the light-emitting device 550 G(i,j) are sandwiched between the base 770 and the functional layer 520.

The functional layer 520 is sandwiched between the base 770 and the base 510. The insulating film 705 is sandwiched between the functional layer 520 and the base 770 and has a function of bonding the functional layer 520 and the base 770 together.

The functional layer 520 includes a pixel circuit 530B(i,j) and a pixel circuit 530G(i,j). The pixel circuit 530B(i,j) is electrically connected to a light-emitting device 550B(i,j) through an opening 591B, and the pixel circuit 530G(i,j) is electrically connected to a light-emitting device 550G(i,j) through an opening 591G.

Note that the display panel displays information through the base 770 (see FIG. 3A). In other words, the light-emitting device 550B(i,j) emits light toward the direction in which the functional layer 520 is not provided. The light-emitting device 550B(i,j) can be referred to as a top emission light-emitting device.

The base 510 includes a driver circuit GD and a terminal 519B, and further a driver circuit SD (not illustrated).

<<Base 510 and Base 770>>

A light-transmitting material can be used for the base 510 or the base 770.

For example, a flexible material can be used for the base 510 or the base 770. Thus, a functional panel having flexibility can be provided.

For example, a material with a thickness greater than or equal to 0.1 mm and less than or equal to 0.7 mm can be used. Specifically, a material polished to a thickness of approximately 0.1 mm can be used. As a result, the base 510 or the base 770 can be lightweight.

A glass substrate having any of the following sizes, for example, can be used as the base 510 or the base 770: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). With the use of such a large substrate, a large-sized display device can be fabricated.

For the base 510 or the base 770, an organic material, an inorganic material, a composite material of an organic material and an inorganic material, or the like can be used.

For example, an inorganic material such as glass, ceramic, or metal can be used. Specifically, non-alkali glass, soda-lime glass, potash glass, crystal glass, aluminosilicate glass, tempered glass, chemically tempered glass, quartz, sapphire, or the like can be used for the base 510 or the base 770. Alternatively, aluminosilicate glass, tempered glass, chemically tempered glass, sapphire, or the like can be favorably used for the base 510 or the base 770 that is on the side closer to a user of the functional panel. This can prevent breakage or damage of the functional panel caused by the use.

Specifically, an inorganic oxide film, an inorganic nitride film, an inorganic oxynitride film, or the like can be used. For example, a silicon oxide film, a silicon nitride film, a silicon oxynitride film, or an aluminum oxide film can be used. Stainless steel, aluminum, or the like can be used for the base 510 or the base 770.

For example, a single crystal semiconductor substrate or a polycrystalline semiconductor substrate made of silicon or silicon carbide, a compound semiconductor substrate made of silicon germanium or the like, or an SOI substrate can be used as the base 510 or the base 770. Thus, a semiconductor element can be formed over the base 510 or the base 770.

For example, an organic material such as a resin, a resin film, or plastic can be used for the base 510 or the base 770. Specifically, a material containing polyester, polyolefin, polyamide (e.g., nylon or aramid), polyimide, polycarbonate, polyurethane, an acrylic resin, an epoxy resin, or a resin having a siloxane bond, such as silicone, can be used for the base 510 or the base 770. For example, a resin film, a resin plate, a layered material, or the like containing any of these materials can be used. As a result, the base 510 or the base 770 can be lightweight. Alternatively, for example, the functional panel can be less likely to suffer from damage by dropping or the like.

Specifically, polyethylene terephthalate (PET), polyethylene naphthalate (PEN), polyethersulfone (PES), a cyclo-olefin polymer (COP), a cyclo-olefin copolymer (COC), or the like can be used for the base 510 or the base 770.

For example, a composite material formed by attaching a metal plate, a thin glass plate, or a film of an inorganic material or the like with a resin film or the like can be used for the base 510 or the base 770. For example, a composite material formed by dispersing a fibrous or particulate metal, glass, inorganic material, or the like into a resin can be used for the base 510 or the base 770. For example, a composite material formed by dispersing a fibrous or particulate resin, organic material, or the like into an inorganic material can be used for the base 510 or the base 770.

Furthermore, a single-layer material or a material in which a plurality of layers are stacked can be used for the base 510 or the base 770. For example, a material in which insulating films and the like are stacked can be used. Specifically, a material in which one or more films selected from a silicon oxide layer, a silicon nitride layer, a silicon oxynitride layer, and the like are stacked can be used. Thus, diffusion of impurities contained in the base can be prevented, for example. Alternatively, diffusion of impurities contained in glass or a resin can be prevented. Alternatively, diffusion of impurities that pass through a resin can be prevented.

Alternatively, paper, wood, or the like can be used for the base 510 or the base 770.

For example, a material having heat resistance high enough to withstand heat treatment in the fabrication process can be used for the base 510 or the base 770. Specifically, a material that is resistant to heat applied in the process of forming the transistor, the capacitor, and the like directly on the base can be used for the base 510 or the base 770.

For example, it is possible to employ a method in which an insulating film, a transistor, a capacitor, and the like are formed over a process substrate that is resistant to heat applied in the fabrication process, and then the formed insulating film, the transistor, the capacitor, and the like are transferred to the base 510 or the base 770, for example. Thus, the insulating film, the transistor, the capacitor, and the like can be formed over a flexible substrate, for example.

Structure Example of Driver Circuit GD

The driver circuit GD has a function of supplying a first selection signal and a second selection signal. For example, the driver circuit GD is electrically connected to the conductive film G1(*i*) to supply the first selection signal, and is electrically connected to the conductive film G2(*i*) to supply the second selection signal.

Structure Example of Driver Circuit SD

The driver circuit SD has a function of supplying an image signal and a control signal, and the control signal includes a first level and a second level. The driver circuit SD is electrically connected to a conductive film S1*g*(j) to supply the image signal, and is electrically connected to a conductive film S2*g*(j) to supply the control signal, for example.

Structure Example 3 of Display Panel 700

The functional panel 700 includes a conductive film G1(*i*), a conductive film G2(*i*), a conductive film S1*g*(j), a conductive film S2*g*(j), a conductive film ANO, and a conductive film VCOM2 (see FIG. 2).

Note that the conductive film G1(*i*) is supplied with a first selection signal, the conductive film G2(*i*) is supplied with a second selection signal, the conductive film S1*g*(j) is supplied with an image signal, and the conductive film S2*g*(j) is supplied with a control signal, for example.

Structure Example 2 of Pixel 703(*i,j*)

A set of pixels 703(*i,j*) includes the pixel 702G(i,j) (see FIG. 1B). The pixel 702G(i,j) includes the pixel circuit 530G(i,j) and the light-emitting device 550G(i,j) (see FIG. 2).

Structure Example 1 of Pixel Circuit 530G(i,j)

The pixel circuit 530G(i,j) is supplied with the first selection signal and obtains an image signal on the basis of the first selection signal. For example, the first selection signal can be supplied using the conductive film G1(*i*) (see FIG. 2). The image signal can be supplied using the conductive film S1*g*(j). Note that the operation of supplying the first selection signal and making the pixel circuit 530G(i,j) obtain an image signal can be referred to as "writing".

Structure Example 2 of Pixel Circuit 530G(i,j)

The pixel circuit 530G(i,j) includes a switch SW21, a switch SW22, a transistor M21, a capacitor C21, and a node N21 (see FIG. 2). The pixel circuit 530G(i,j) includes a node N22, a capacitor C22, and a switch SW23.

The transistor M21 includes a gate electrode electrically connected to the node N21, the first electrode electrically connected to the light-emitting device 550G(i,j), and the second electrode electrically connected to the conductive film ANO.

The switch SW21 includes a first terminal electrically connected to the node N21 and a second terminal electrically connected to the conductive film S1*g*(j), and has a function of controlling its on/off state on the basis of the potential of the conductive film G1(*i*).

The switch SW22 includes a first terminal electrically connected to the conductive film S2*g*(j), and has a function of controlling its on/off state on the basis of the potential of the conductive film G2(*i*).

The capacitor C21 includes a conductive film electrically connected to the node N21 and a conductive film electrically connected to a second electrode of the switch SW22.

Accordingly, an image signal can be stored in the node N21. Alternatively, the potential of the node N21 can be changed using the switch SW22. Alternatively, the intensity of light emitted from the light-emitting device 550G(i,j) can be controlled with the potential of the node N21.

Structure Example of Transistor

A bottom-gate transistor, a top-gate transistor, or the like can be used in the functional layer 520. Specifically, a transistor can be used as a switch.

The transistor M21 includes a semiconductor film 508, a conductive film 504, a conductive film 507A, and a conductive film 507B (see FIG. 3B). The transistor M21 is formed over an insulating film 501C, for example.

The semiconductor film 508 includes a region 508A electrically connected to the conductive film 507A and a region 508B electrically connected to the conductive film 507B. The semiconductor film 508 includes a region 508C between the region 508A and the region 508B.

The conductive film 504 includes a region overlapping with the region 508C and has a function of a gate electrode.

An insulating film 506 includes a region sandwiched between the semiconductor film 508 and the conductive film 504. The insulating film 506 has a function of a gate insulating film.

The conductive film 507A has one of a function of a source electrode and a function of a drain electrode, and the conductive film 507B has the other thereof. The conductive film 507A is electrically connected to the conductive film 512A, and the conductive film 507B is electrically connected to the conductive film 512B.

A conductive film 524 can be used in the transistor M21. The semiconductor film 508 is sandwiched between the conductive film 504 and the conductive film 524. The conductive film 524 has a function of a second gate electrode. The insulating film 501D is sandwiched between the semiconductor film 508 and the conductive film 524 and has a function of a second gate insulating film. An insulating film 518 covers the transistor M21, and the insulating film 501C is sandwiched between an insulating film 501B and the insulating film 501D. An insulating film 516 includes an insulating film 516A and an insulating film 516B.

Note that in a step of forming the semiconductor film used in the transistor of the pixel circuit, the semiconductor film used in the transistor of the driver circuit can be formed. A semiconductor film with the same composition as the semiconductor film used in the transistor of the pixel circuit can be used for the driver circuit, for example.

Structure Example of Semiconductor Film 508

For example, a metal oxide can be used for the semiconductor film 508. In this case, the pixel circuit can hold an image signal for a longer time than a pixel circuit including a transistor that uses, e.g., silicon for the semiconductor film. Specifically, a selection signal can be supplied at a frequency of lower than 30 Hz, preferably lower than 1 Hz, further preferably less than once per minute while flickering is suppressed. Consequently, fatigue of a user of the data processing device can be reduced. Furthermore, power consumption for driving can be reduced.

For example, a transistor using an oxide semiconductor can be used. Specifically, an oxide semiconductor containing indium, an oxide semiconductor containing indium, gallium, and zinc, or an oxide semiconductor containing indium, gallium, zinc, and tin can be used for the semiconductor film.

For example, a transistor having a lower leakage current in an off state than a transistor using silicon for a semiconductor film can be used. Specifically, a transistor using an oxide semiconductor as a semiconductor film can be used as a switch or the like. In that case, the potential of the floating node can be held for a longer time than in a circuit in which a transistor using silicon is used as a switch.

Structure Example 1 of Light-Emitting Device 550G(i,j)

The light-emitting device 550G(i,j) is electrically connected to the pixel circuit 530G(i,j) (see FIG. 2). The light-emitting device 550G(i,j) includes the electrode 551G (i,j) electrically connected to the pixel circuit 530G(i,j), and the electrode 552 electrically connected to the conductive film VCOM2. Note that the light-emitting device 550G(i,j) has a function of operating on the basis of the potential of the node N21.

For example, an organic electroluminescent element, an inorganic electroluminescent element, a light-emitting diode, or a quantum-dot LED (QDLED) can be used as the light-emitting device 550G(i,j).

Structure Example 4 of Display Panel 700

The display panel 700 described in this embodiment includes the light-emitting device 550B(i,j), the light-emitting device 550G(i,j), an insulating film 573, and a conductive film 552C (see FIG. 4B). In addition, the display panel 700 further includes a light-emitting device 550R(i,j). For example, the light-emitting devices can be provided at a 2.8 μm pitch along with the cutting line X1-X2 direction. In addition, the light-emitting devices can be provided at a 8.4 μm pitch along the cutting line Y3-Y4 direction. Furthermore, a space of 0.55 μm can be provided between the light-emitting devices. Accordingly, the resolution of the display panel can be improved. Moreover, the aperture ratio can be increased.

Structure Example 1 of Light-Emitting Device 550B(i,j)

The light-emitting device 550B(i,j) includes an electrode 551B(i,j) and an electrode 552B(i,j).

The electrode 551B(i,j) includes a region AR1 that overlaps with the electrode 552B(i,j) (see FIG. 5). The electrode 551B(i,j) includes a region AR2 outside the region AR1. In other words, the region AR2 does not overlap with the electrode 552B(i,j).

Structure Example 2 of Light-Emitting Device 550G(i,j)

The light-emitting device 550G(i,j) includes an electrode 551G(i,j) and an electrode 552G(i,j) (see FIG. 4B).

The electrode 551G(i,j) includes a region AR3 that overlaps with the electrode 552G(i,j) (see FIG. 5). The electrode 551G(i,j) includes a region AR4 outside the region AR3. In other words, the region AR4 does not overlap with the electrode 552G(i,j).

Structure Example 1 of Insulating Film 573

The insulating film 573 is in contact with the region AR2 and the region AR4. The insulating film 573 covers an end portion of the electrode 551B(i,j) and an end portion of the electrode 551G(i,j).

The insulating film 573 includes an opening 573B(i,j) and an opening 573G(i,j) (see FIG. 4B and FIG. 5). The opening 573B(i,j) overlaps with the electrode 552B(i,j), and the opening 573G(i,j) overlaps with the electrode 552G(i,j).

Structure Example of Conductive Film 552C

The conductive film 552C is electrically connected to the electrode 552B(i,j) in the opening 573B(i,j), and the conductive film 552C is electrically connected to the electrode 552G(i,j) in the opening 573G(i,j).

This structure can prevent a short circuit between the region AR2 in the electrode 551B(i,j) and the electrode 552B(i,j). Furthermore, a short circuit between the region AR2 in the electrode 551B(i,j) and the conductive film 552C can be prevented. A short circuit between the region AR4 in the electrode 551G(i,j) and the electrode 552G(i,j) can be prevented. A short circuit between the region AR4 in the electrode 551G(i,j) and the conductive film 552C can be prevented. In addition, the potential that is equal to the potential of the electrode 552B(i,j) can be supplied to the electrode 552G(i,j). Moreover, a display defect or display unevenness can be prevented. As a result, a novel display panel that is highly convenient, useful, or reliable can be provided.

Structure Example 2 of Light-Emitting Device 550B(i,j)

The light-emitting device 550B(i,j) includes the unit 103B(i,j) (see FIG. 4B).

The unit 103B(i,j) is sandwiched between the electrode 552B(i,j) and the electrode 551B(i,j) and has a function of emitting first light B. For example, the unit 103B(j) can emit blue light.

Structure Example of Unit 103B(i,j)

The unit 103B(i,j) has a single-layer structure or a stacked-layer structure. For example, the unit 103B(i,j) includes a layer 111, a layer 112, and a layer 113, for example (see FIG. 17A).

The layer 111 includes a region sandwiched between the layer 112 and the layer 113. The layer 112 includes a region sandwiched between the electrode 101 and the layer 111. The layer 113 includes a region sandwiched between the electrode 102 and the layer 111.

The unit 103B(i,j) can include, for example, a layer selected from functional layers such as a light-emitting layer, a hole-transport layer, an electron-transport layer, and a carrier-blocking layer. The unit 103B(i,j) can also include a layer selected from functional layers such as a hole-injection layer, an electron-injection layer, an exciton-blocking layer, and a charge-generation layer.

Structure Example 3 of Light-Emitting Device 550G(i,j)

The light-emitting device 550G(i,j) includes the unit 103G(i,j) (see FIG. 4B).

The unit 103G(i,j) is sandwiched between the electrode 552G(i,j) and the electrode 551G(i,j) and has a function of emitting second light G. Note that the second light G has a hue different from that of the first light B. For example, the unit 103G(i,j) can emit green light.

Structure Example 3 of Light-Emitting Device 550B(i,j)

The light-emitting device 550B(i,j) includes a layer 105 B(11).

The layer 105B(i,j) is sandwiched between the electrode 552B(i,j) and the unit 103B(i,j) and contains a material including an electron-injection property.

Structure Example of Layer 105B(i,j)

For example, an electron-injection material can be used for the layer 105B(i,j). The layer 105B(i,j) can also be referred to as an electron-injection layer.

Specifically, an electron donor substance can be used for the layer 105B(i,j). Alternatively, a material in which an electron donor substance and an electron-transport material are combined can be used for the layer 105B(i,j). Alternatively, an electrode can be used for the layer 105B(i,j). This can facilitate the injection of electrons from the electrode 552B(i,j), for example. Alternatively, not only a material having a low work function but also a material having a high work function can be used for the electrode 552B(i,j). Alternatively, a material used for the electrode 552B(i,j) can be selected from a wide range of materials regardless of its work function. Specifically, Al, ITO, indium oxide-tin oxide containing silicon or silicon oxide, and the like can be used for the electrode 552B(i,j). Alternatively, the driving voltage of the light-emitting device can be reduced.

[Electron Donor Substance]

For example, an alkali metal, an alkaline earth metal, a rare earth metal, or a compound thereof (an oxide, a halide, a carbonate, or the like) can be used for the electron donor substance. Alternatively, an organic compound such as tetrathianaphthacene (abbreviation: TTN), nickelocene, or decamethylnickelocene can be used as the electron donor substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material composed of two or more kinds of substances can be used as the electron-injection material. For example, an electron donor substance and an electron-transport material can be used for the composite material.

[Electron-Transport Material]

For example, a metal complex or an organic compound having a π-electron deficient heteroaromatic ring skeleton can be used as the electron-transport material.

A material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the electron-transport property in the electron-transport layer can be suppressed. Alternatively, the amount of electrons injected into the light-emitting layer can be controlled. Alternatively, the light-emitting layer can be prevented from having excess electrons.

As the metal complex, bis(10-hydroxybenzo[h]quinolinato)beryllium(II) (abbreviation: $BeBq_2$), bis(2-methyl-8-quinolinolato) (4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As the organic compound having a π-electron deficient heteroaromatic ring skeleton, for example, a heterocyclic compound having a polyazole skeleton, a heterocyclic compound having a diazine skeleton, a heterocyclic compound having a pyridine skeleton, a heterocyclic compound having a triazine skeleton, or the like can be used. In particular, the heterocyclic compound having a diazine skeleton or the heterocyclic compound having a pyridine skeleton has favorable reliability and thus are preferable. In addition, the heterocyclic compound having a diazine (pyrimidine or pyrazine) skeleton has a high electron-transport property to contribute to a reduction in driving voltage.

As the heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2''-(1,3,5-benzenetriyl)-tris(1-phenyl-1H-benzimidazole) (abbreviation: TPBI), or 2-[3-(dibenzothiophen-4-yl)phenyl]-1-phenyl-1H-benzimidazole (abbreviation: mDBTBIm-II) can be used, for example.

As the heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn) can be used, for example.

As the heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As the heterocyclic compound having a triazine skeleton, 2-[3'-(9,9-dimethyl-9H-fluoren-2-yl)-1,1'-biphenyl-3-yl]-4,6-diphenyl-1,3,5-triazine (abbreviation: mFBPTzn), 2-[(1,1'-biphenyl)-4-yl]-4-phenyl-6-[9,9'-spirobi(9H-fluoren)-2-yl]-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02) can be used, for example.

Structure Example 2 of Composite Material

A material including a fluoride of an alkali metal in a microcrystalline state and an electron-transport material can be used as the composite material. Alternatively, a material including a fluoride of an alkaline earth metal in a microcrystalline state and an electron-transport material can be used as the composite material. In particular, a composite material including a fluoride of an alkali metal or an alkaline earth metal at 50 wt % or higher can be suitably used. Alternatively, a composite material including an organic compound having a bipyridine skeleton can be suitably used. Thus, the refractive index of the layer 105B(i,j) can be reduced. The external quantum efficiency of the light-emitting device can be improved.

[Electride]

For example, a substance obtained by adding electrons at high concentration to a mixed oxide of calcium and aluminum can be used as the electron-injection material.

Structure Example 4 of Light-Emitting Device 550G(i,j)

The light-emitting device 550G(i,j) includes the layer 105G(i,j).

The layer 105G(i,j) is sandwiched between the electrode 552G(i,j) and the unit 103G(i,j) and includes the same material having an electron-injection property as the layer 105B(i,j).

Thus, light with a predetermined hue can be shown by an additive mixture method with the use of the light-emitting device 550B(i,j) and the light-emitting device 550G(i,j). As a result, a novel display panel that is highly convenient, useful, or reliable can be provided.

Structure Example 2 of Insulating Film 573

The electrode 552G(i,j) has a sidewall facing the sidewall of the electrode 552B(i,j) (see FIG. 5). The unit 103G(i,j) has a sidewall facing the sidewall of the unit 103B(i,j). For example, a sidewall WL1 includes a sidewall of the electrode 552B(i,j) and a sidewall of the unit 103B(i,j), and a sidewall WL2 includes a sidewall of the electrode 552G(i,j) and a sidewall of the unit 103G(i,j). The sidewall of the electrode 552B(i,j) faces the sidewall of the electrode 552G(i,j), and the sidewall of the unit 103B(i,j) faces the sidewall of the unit 103G(i,j). Note that sidewalls having angles orthogonal to the base are illustrated for convenience, and the angle between the sidewall and the base may be an angle of 90° or smaller, without limitation to the orthogonal angle. In addition, the same applies to an angle between a sidewall of another component and the base.

The insulating film 573 is in contact with the sidewall of the electrode 552B(i,j), the sidewall of the electrode 552G(i,j), the sidewall of the unit 103B(i,j), and the sidewall of the unit 103G(i,j).

This structure can suppress diffusion of surrounding impurities, which would damage the reliability of the light-emitting device 550B(i,j), into the unit 103B(i,j) through the sidewall of the unit 103B(i,j). This structure can also suppress diffusion of surrounding impurities, which would damage the reliability of the light-emitting device 550G(i,j), into the unit 103G(i,j) through the sidewall of the unit 103G(i,j). Furthermore, the insulating film 573 can prevent a current from flowing between the unit 103B(i,j) and the unit 103G(i,j). In addition, crosstalk between the light-emitting device 550B(i,j) and the light-emitting device 550G (i,j) can be prevented. As a result, a novel display panel that is highly convenient, useful, or reliable can be provided.

Structure Example 3 of Insulating Film 573

The insulating film 573 includes an insulating film 573(1) and an insulating film 573(2) (FIG. 4B and FIG. 5). In other words, a layered material of a plurality of films can be used for the insulating film 573.

The insulating film 573(1) includes a region sandwiched between the sidewall of the electrode 552B(i,j) and an insulating film 573(2), a region sandwiched between the sidewall of the electrode 552G(i,j) and the insulating film 573(2), a region sandwiched between the sidewall of the unit 103B(i,j) and the insulating film 573(2), and a region sandwiched between the sidewall of the unit 103G(i,j) and the insulating film 573(2).

Thus, for example, a film that can cover a complicated cross-sectional shape can be used for the insulating film 573(1) and a film whose deposition rate is higher than that of the insulating film 573(1) can be used for the insulating film 573(2). In addition, a material that can capture impurities, which would damage the reliability of the light-emitting device, can be used for the insulating film 573(1), and a material that can suppress diffusion of such impurities, can be used for the insulating film 573(2). As a result, a novel display panel that is highly convenient, useful, or reliable can be provided.

Structure Example 5 of Display Panel 700

The display panel 700 described in this embodiment includes an insulating film 521 (see FIG. 4B and FIG. 5). For example, the insulating film 521 is provided in the functional layer 520, and the light-emitting device 550B(i,j) is provided in contact with the insulating film 521.

The insulating film 521 is in contact with the electrode 551B(i,j), the electrode 551G(i,j), and the insulating film 573.

This structure can suppress diffusion of surrounding impurities, which would damage the reliability of the light-emitting device 550B(i,j), into the unit 103B(i,j) through the sidewall of the unit 103B(i,j). This structure can also suppress diffusion of surrounding impurities, which would damage the reliability of the light-emitting device 550G(i,j), into the unit 103G(i,j) through the sidewall of the unit 103G(i,j). As a result, a novel display panel that is highly convenient, useful, or reliable can be provided.

Note that this embodiment can be combined with any of the other embodiments in this specification as appropriate.

Embodiment 2

In this embodiment, a method for manufacturing a display panel of one embodiment of the present invention will be described with reference to FIGS. 6A and 6B, FIGS. 7A to 7C, FIGS. 8A to 8C, FIGS. 9A to 9D, FIGS. 10A to 10C, FIGS. 11A to 11C, FIGS. 12A to 12C, FIGS. 13A to 13C, FIGS. 14A to 14D, FIGS. 15A to 15C, and FIGS. 16A to 16C.

FIGS. 6A and 6B, FIGS. 7A to 7C, FIGS. 8A to 8C, FIGS. 9A to 9D, FIGS. 10A to 10C, and FIGS. 11A to 11C illustrate a method for manufacturing a display panel of one embodiment of the present invention.

FIGS. 12A to 12C, FIGS. 13A to 13C, FIGS. 14A to 14D, FIGS. 15A to 15C, and FIGS. 16A to 16C illustrate a method for manufacturing a display panel of one embodiment of the present invention, with cross-sectional views different from those in FIGS. 6A and 6B, FIGS. 7A to 7C, FIGS. 8A to 8C, FIGS. 9A to 9D, FIGS. 10A to 10C, and FIGS. 11A to 11C.

Example of Manufacturing Method of Display Panel

A method for manufacturing a display panel of one embodiment of the present invention includes the following first to twentieth steps. For example, the display panel 700 of one embodiment of the present invention described with reference to FIGS. 4A to 4C can be manufactured.

<<First Step>>

Figure 6A:
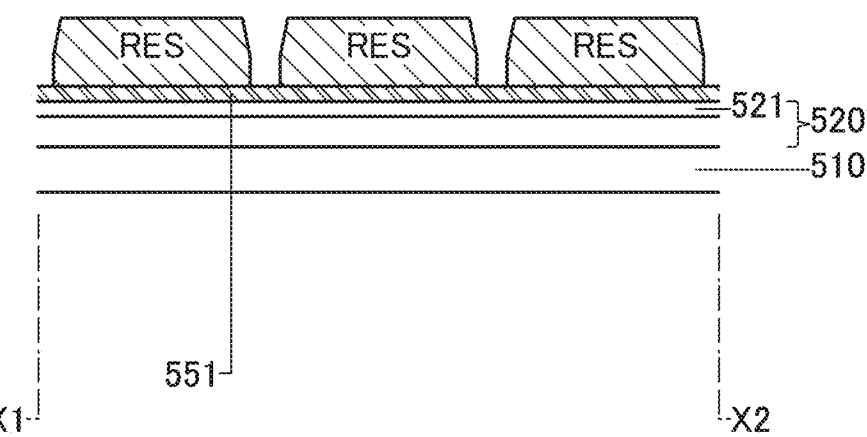
FIGS. 6A and 6B illustrate a method for manufacturing a display panel according to an embodiment.
Figure 6B:
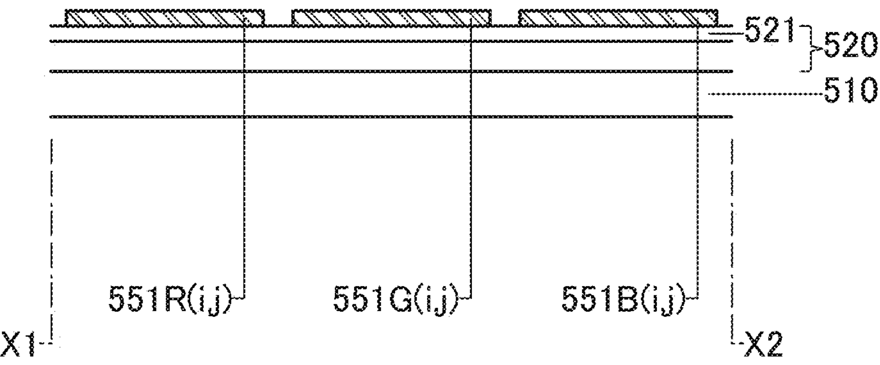

In the first step, the electrode 551R(i,j), the electrode 551G(i,j), and the electrode 551B(i,j) are formed (see FIGS. 6A and 6B). For example, a conductive film 551 and a resist RES are formed over the functional layer 520 formed over the base 510, and processed into a predetermined shape by photolithography.

<<Second Step>>

Figure 7A:
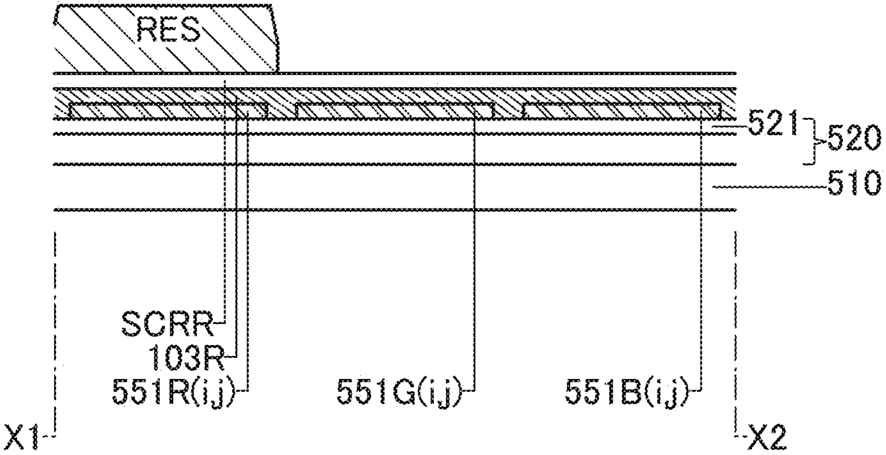
FIGS. 7A to 7C illustrate the method for manufacturing the display panel according to the embodiment.
Figure 12A:
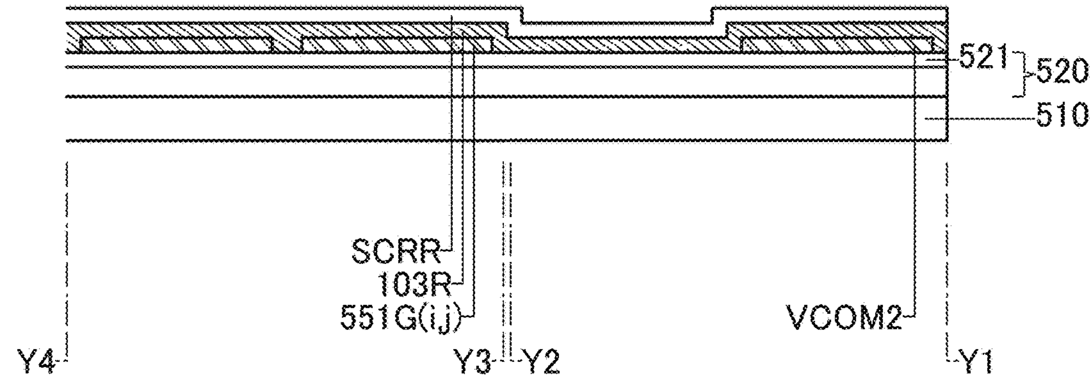
FIGS. 12A to 12C illustrate the method for manufacturing the display panel according to the embodiment.

In the second step, the unit 103R is formed over the electrodes 551R(i,j), 551G(i,j), and 551B(i,j) (see FIG. 7A and FIG. 12A). For example, the unit 103R is formed by a vacuum evaporation method so as to cover the electrodes 551R(i,j), 551G(i,j), and 551B(i,j).

<<Third Step>>

In the third step, a sacrifice layer SCRR is formed over the unit 103R.

The sacrifice layer SCRR has a function of reducing the physical load and a chemical load which are applied to the unit 103R during the manufacturing process of the display panel. Note that the sacrifice layer that is described in this specification can be rephrased with a mask layer.

For example, a material having resistance to etching conditions for processing the unit 103R can be used for the sacrifice layer SCRR. A material that can be formed under conditions such that a physical load and a chemical load applied to the unit 103R are small can be suitably used for the sacrifice layer SCRR. In addition, a material that can be etched under conditions such that a physical load and a chemical load applied to the unit 103R are small can be suitably used for the sacrifice layer SCRR.

Specifically, for the formation of the sacrifice layer SCRR, for example, a sputtering method or an atomic layer deposition (ALD) method such as thermal atomic layer deposition or plasma enhanced atomic layer deposition (PEALD), or a vacuum evaporation method can be employed. A formation method that gives fewer damages to an EL layer is preferred, and the ALD method or the vacuum evaporation method is more suitable for the formation of the sacrifice layer SCRR than the sputtering method.

For the sacrifice layer SCRR, a film which can be removed by a wet etching method is preferably used. By performing the wet etching method, damage to the unit 103R can be reduced in processing the sacrifice layer SCRR as compared with the formation by a dry etching method. When an etching method is employed, a chemical solution of a developer, tetramethyl ammonium hydroxide aqueous solution (TMAH), dilute hydrofluoric acid, oxalic acid, phosphoric acid, nitric acid or acetic acid, or a mixed solution of any of the solutions is preferably used.

As the sacrifice layer SCRR, for example, an inorganic film such as a metal film, an alloy film, a metal oxide film, a semiconductor film, or an inorganic insulating film can be used.

Alternatively, a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials can be used for the sacrifice layer SCRR.

Alternatively, a metal oxide such as an In—Ga—Zn oxide can be used for the sacrifice layer SCRR. Furthermore, an indium oxide, an In—Zn oxide, an In—Sn oxide, an indium titanium oxide (In—Ti oxide), an indium tin zinc oxide (In—Sn—Zn oxide), an indium titanium zinc oxide (In—Ti—Zn oxide), an indium gallium tin zinc oxide (In—Ga—Sn—Zn oxide) or the like can be used. Alternatively, indium tin oxide containing silicon or the like can be used.

In addition, in place of gallium described above, an element M (M is one or more of aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used. In particular, M is preferably one or more of gallium, aluminum, and yttrium.

For example, an inorganic insulating material such as aluminum oxide, hafnium oxide, or silicon oxide can be used for the sacrifice layer SCRR. Specifically, an aluminum oxide film formed by the ALD method is preferred for the sacrifice layer SCRR because damages to an underlying layer (especially EL layer or the like) can be reduced.

<<Fourth Step>>

Figure 7B:
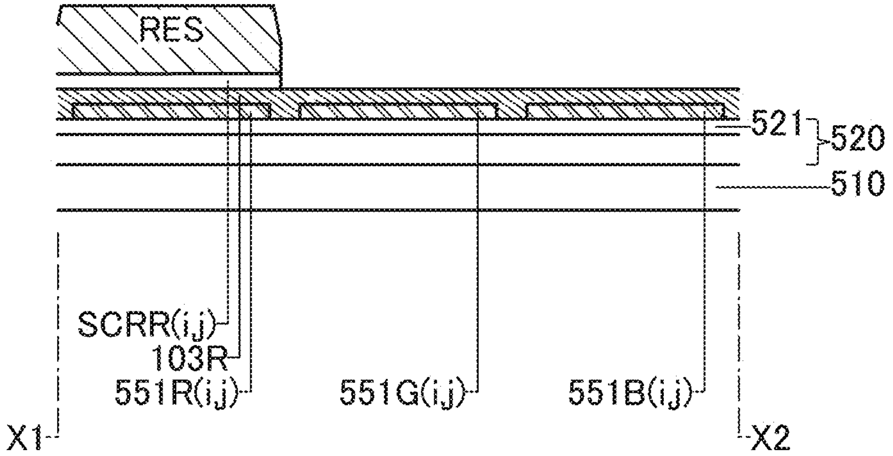
Figure 12B:
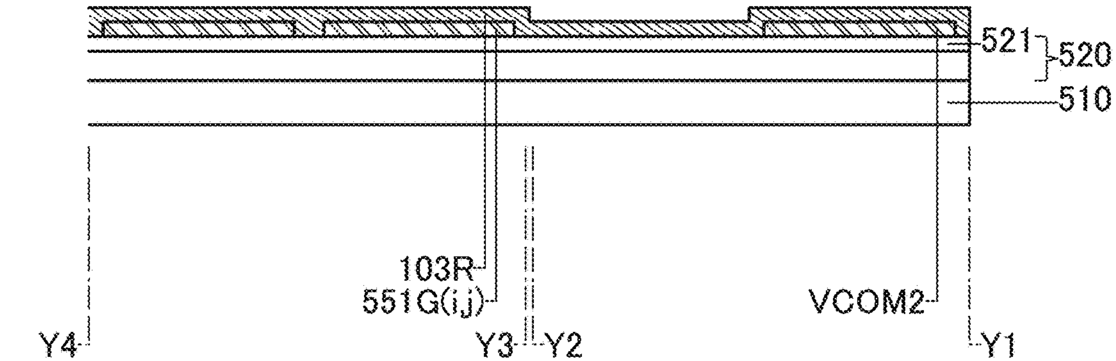

In the fourth step, a resist RES is formed, and parts of the sacrifice layer SCRR over the electrode 551G(i,j) and the electrode 551B(i,j) are removed by a photoetching method, so that the sacrifice layer SCRR(i,j) is formed into a predetermined shape (see FIG. 7B and FIG. 12B).

The sacrifice layer SCRR(i,j) is formed into, for example, a shape that is larger than the external shape of the electrode 551R(i,j) and that does not overlap with the adjacent electrode 551G(i,j).

<<Fifth Step>>

Figure 7C:
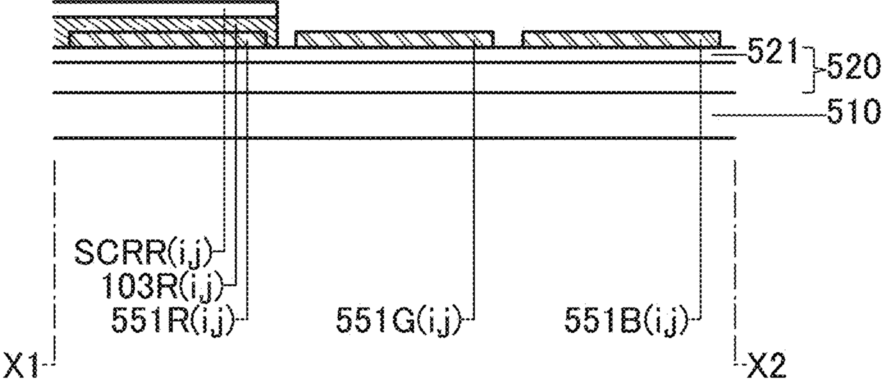
Figure 12C:
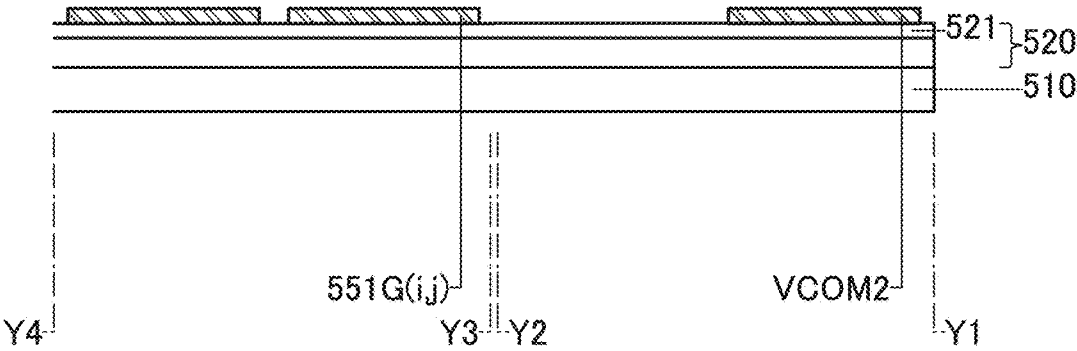

In the fifth step, parts of the unit 103R over the electrode 551G(i,j) and the electrode 551B(i,j) are removed by an etching method, so that the unit 103R(i,j) can have a predetermined shape which overlaps with the sacrifice layer SCRR(i,j) (see FIG. 7C and FIG. 12C).

For example, the unit 103R(i,j) has a shape that covers even an end portion of the electrode 551R(i,j).

<<Sixth Step>>

Figure 13A:
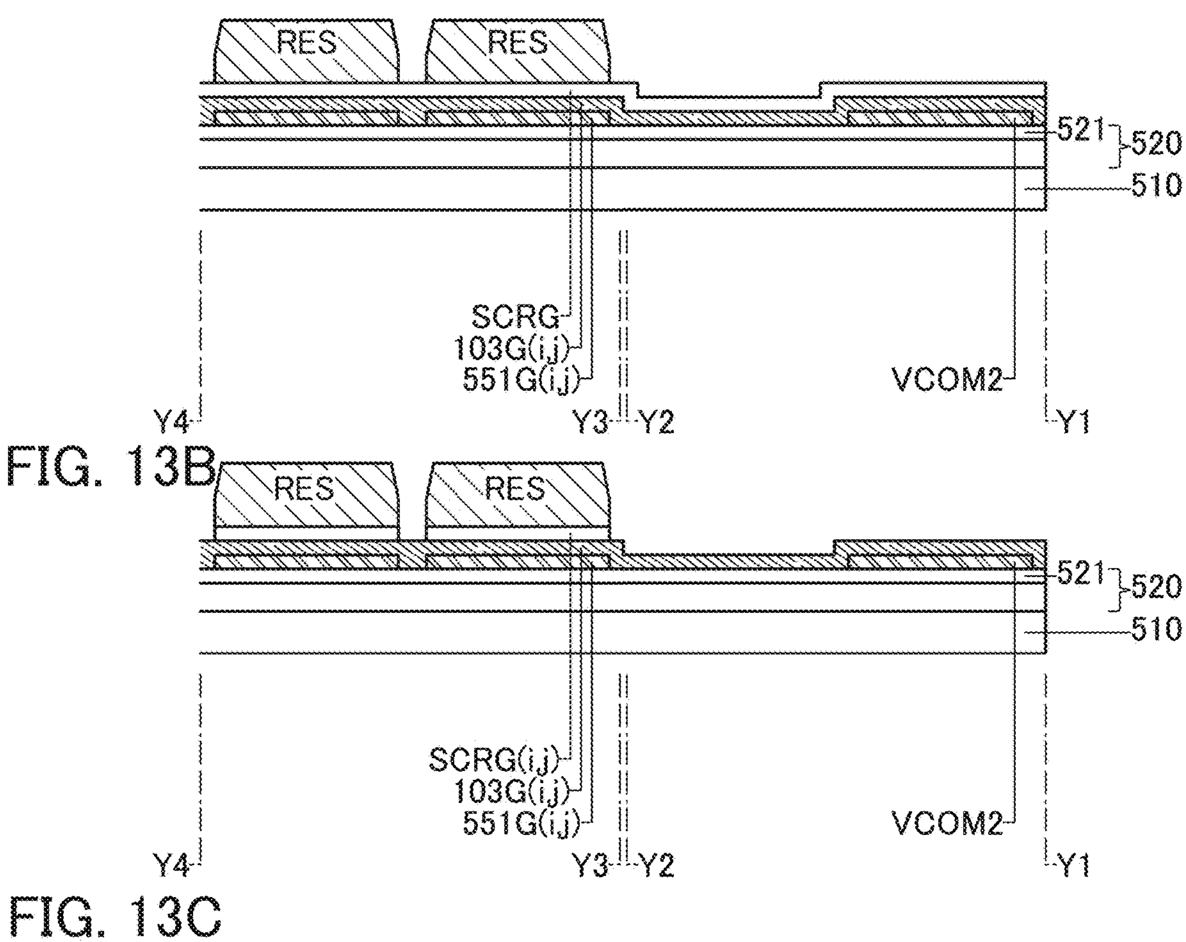

In the sixth step, the unit 103G is formed over the sacrifice layer SCRR(i,j), the electrode 551G(i,j), and the electrode 551B(i,j) (see FIG. 8A and FIG. 13A). For example, the unit 103G is formed by a vacuum evaporation method to cover the sacrifice layer SCRR(i,j), the electrode 551G(i,j), and the electrode 551B(i,j).

<<Seventh Step>>

In the seventh step, the sacrifice layer SCRG is formed over the unit 103G. The sacrifice layer SCRG has a function of alleviating the physical load and the chemical load applied to the unit 103G in the process of manufacturing the display panel. For example, a material that can be used for the sacrifice layer SCRR can be used for the sacrifice layer SCRG.

<<Eighth Step>>

In the eighth step, a resist RES is formed, and then parts of the sacrifice layer SCRG over the sacrifice layer SCRR (i,j) and the electrode 551B(i,j) are removed by a photoetching method, so that the sacrifice layer SCRG(i,j) is formed into a predetermined shape (see FIG. 8B and FIG. 13B).

For example, the sacrifice layer SCRG(i,j) is formed to be larger than the external shape of the electrode 551G(i,j) and to overlap with neither the adjacent electrode 551R(i,j) nor the adjacent electrode 551B(i,j).

In addition, the metal oxide containing indium, gallium, and zinc can be removed using an etchant including oxalic acid.

<<Ninth Step>>

Figure 13C:
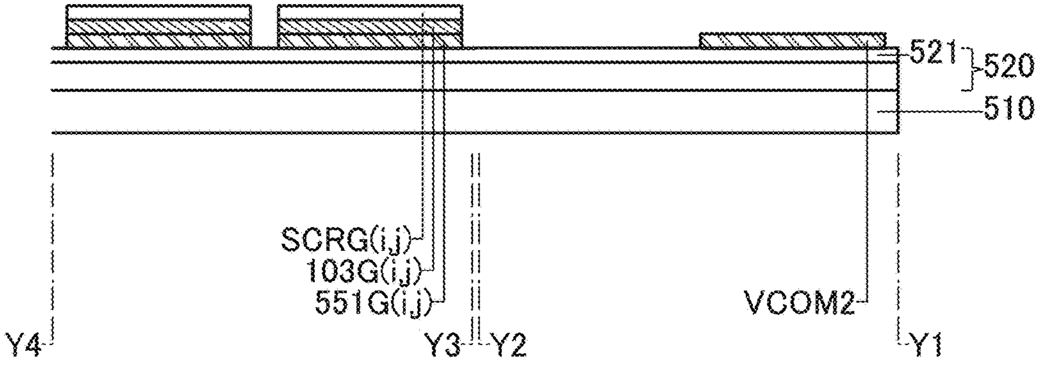

In the ninth step, parts of the unit 103G over the sacrifice layer SCRR(i,j) and over the electrode 551B(i,j) are removed by an etching method, whereby the unit 103G(i,j) is formed into a predetermined shape overlapping with the sacrifice layer SCRG(i,j) (see FIGS. 8C and 13C)

For example, the unit 103G(i,j) has a shape that covers even end portions of the electrode 551G(i,j).

<<Tenth Step>>

Figures 9A, 9B, 9C, 9D:
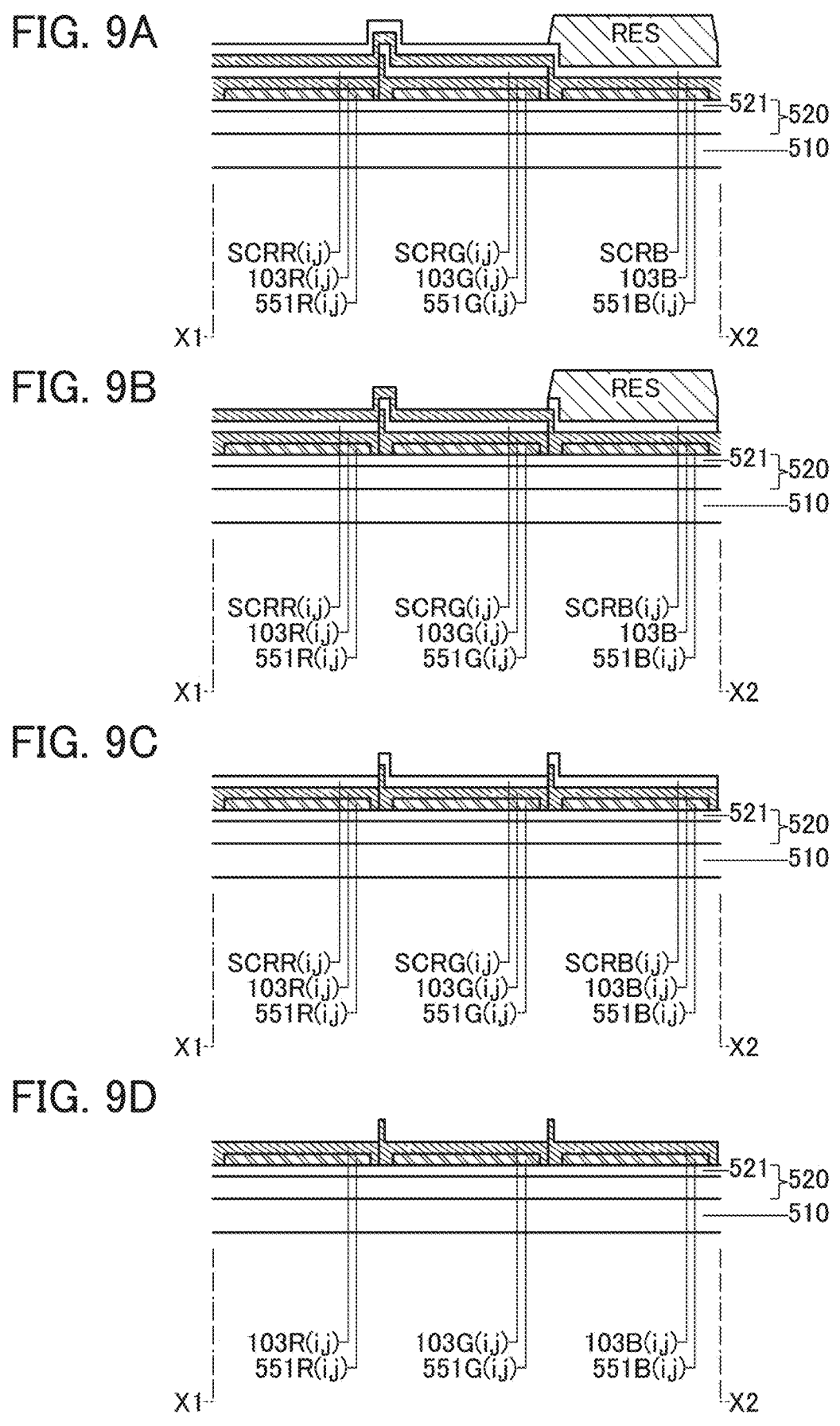
Figure 14A:
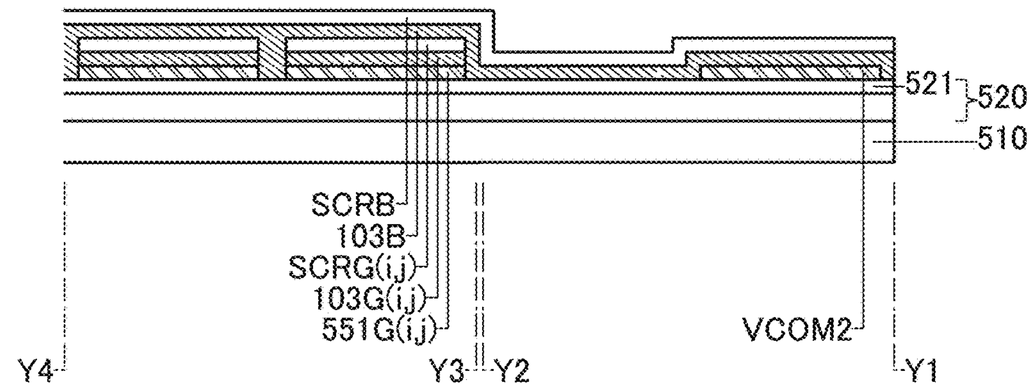
FIGS. 14A to 14D illustrate the method for manufacturing the display panel according to the embodiment.

In the tenth step, the unit 103B is formed over the sacrifice layer SCRR(i,j), the sacrifice layer SCRG(i,j), and the electrode 551B(i,j) (see FIG. 9A and FIG. 14A). For example, the unit 103B is formed by a vacuum evaporation method to cover the sacrifice layer SCRR(i,j), the sacrifice layer SCRG(i,j), and the electrode 551B(i,j).

<<Eleventh Step>>

In the eleventh step, the sacrifice layer SCRB is formed over the unit 103B. The sacrifice layer SCRB has a function of alleviating the physical load and the chemical load applied to the unit 103B in the process of manufacturing the display panel. For example, a material that can be used for the sacrifice layer SCRR can be used for the sacrifice layer SCRB.

<<Twelfth Step>>

Figure 14B:
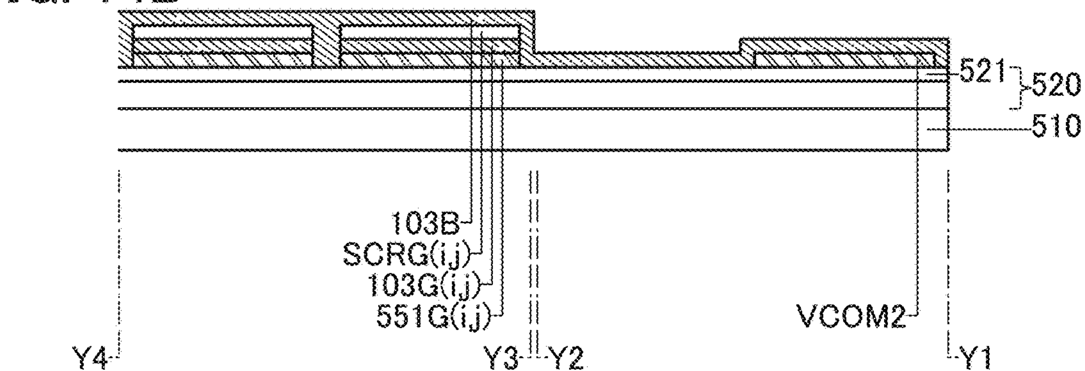

In the twelfth step, a resist RES is formed, and parts of the sacrifice layer SCRB over the sacrifice layer SCRR(i,j) and the sacrifice layer SCRG(i,j) are removed by a photoetching method, whereby the sacrifice layer SCRB(i,j) is formed into a predetermined shape (see FIGS. 9B and 14B)

For example, the sacrifice layer SCRB(i,j) is formed to be larger than the external shape of the electrode 551B(i,j) and not to overlap with the adjacent electrode 551G(i,j).

<<Thirteenth Step>>

Figure 14C:
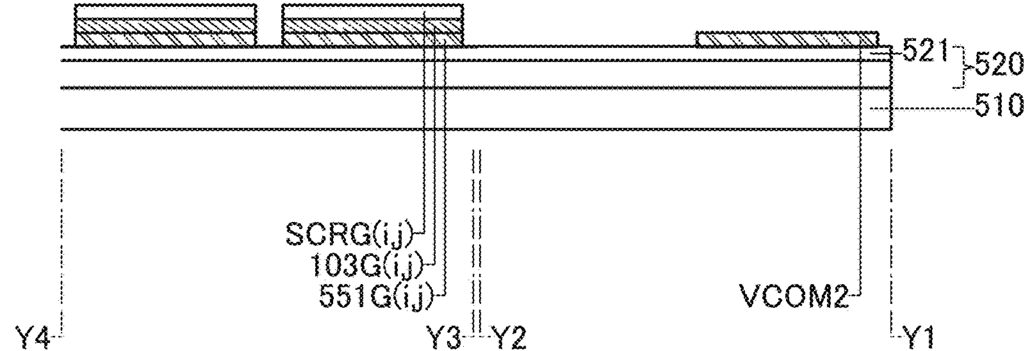

In the thirteenth step, the unit 103B over the sacrifice layer SCRR(i,j) and the unit 103B over the sacrifice layer SCRG(i,j) are removed by an etching method, whereby the unit 103B(i,j) is formed into a predetermined shape overlapping with the sacrifice layer SCRB(i,j) (see FIG. 9C and FIG. 14C).

For example, the unit 103B(i,j) has a shape that covers even end portions of the electrode 551B(i,j).

<<Fourteenth Step>>

Figure 14D:
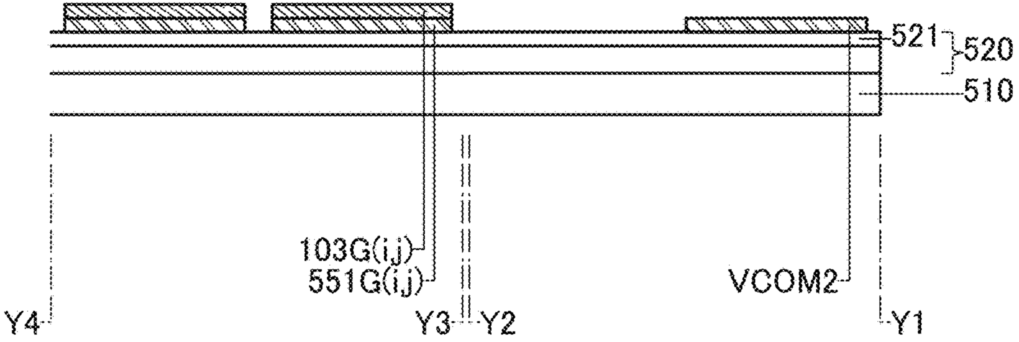

In the fourteenth step, the sacrifice layer SCRR(i,j), the sacrifice layer SCRG(i,j), and the sacrifice layer SCRB(i,j) are removed by an etching method (see FIG. 9D and FIG. 14D).

<<Fifteenth Step>>

In the fifteenth step, the layer 105 is formed over the unit 103R(i,j), the unit 103G(i,j), and the unit 103B(i,j) (see FIG. 10A and FIG. 15A). For example, the layer 105 is formed by a vacuum evaporation method to cover the unit 103R(i,j), the unit 103G(i,j), and the unit 103B(i,j).

<<Sixteenth Step>>

In the sixteenth step, the electrode 552 is formed over the layer 105. For example, the electrode 552 is formed by a vacuum evaporation method to cover the unit 103R(i,j), the unit 103G(i,j), and the unit 103B(i,j).

A layered material can be used for the electrode 552. For example, the electrode 552 can be formed in such a manner that a conductive film is formed by a vacuum evaporation method and then another conductive film is stacked thereover by a sputtering method.

<<Seventeenth Step>>

In the seventeenth step, a resist RES is formed, and photoetching is performed to make slits in the surroundings of the electrode 551R(i,j), the electrode 551G(i,j), and the electrode 551B(i,j) (see FIG. 10B and FIG. 15B). Through the above steps, the light-emitting device 550R(i,j), the light-emitting device 550G(i,j), and the light-emitting device 550B(i,j) can be formed (see FIG. 10C and FIG. 15C).

Specifically, the electrode 552 is separated into the electrode 552R(i,j), the electrode 552G(i,j), and the electrode 552B(i,j) and the layer 105 is separated into the layer 105R(i,j), the layer 105G(i,j) and the layer 105B(i,j).

Processing is performed so that the external shape of the unit 103R(i,j) can be smaller than the external shape of the electrode 551R(i,j), the external shape of the unit 103G(i,j) can be smaller than the external shape of the electrode 551G(i,j), and the external shape of the unit 103B(i,j) can be smaller than the external shape of the electrode 551B(i,j).

<<Eighteenth Step>>

Figure 16A:
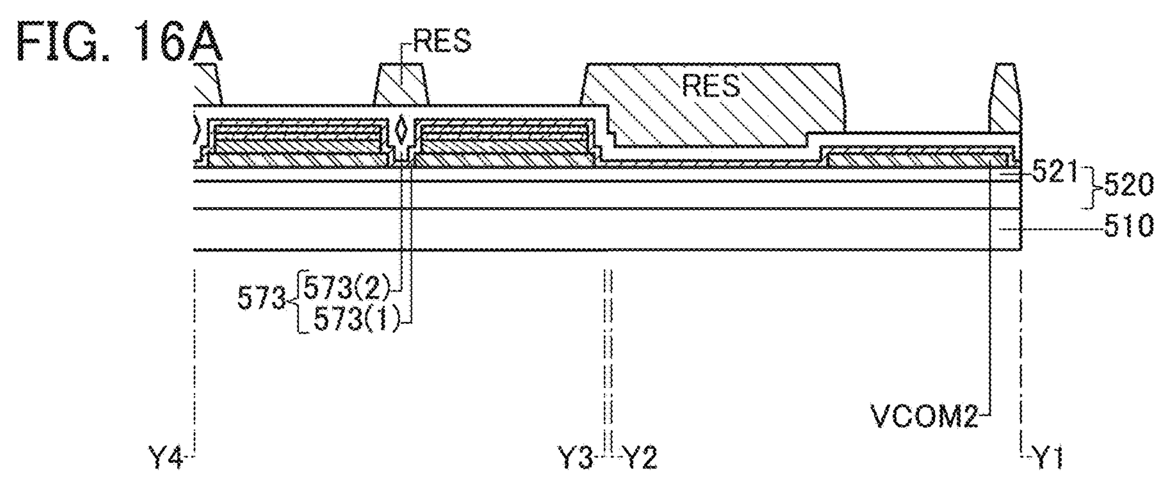
FIGS. 16A to 16C illustrate the method for manufacturing the display panel according to the embodiment.
Figure 16B:
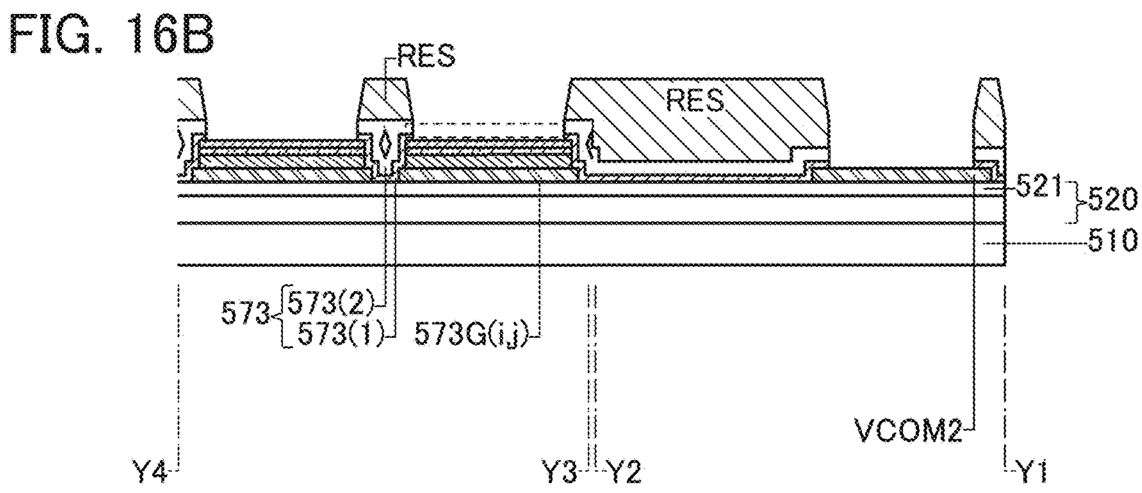

In the eighteenth step, the insulating film 573 is formed to cover the light-emitting device 550R(i,j), the light-emitting device 550G(i,j), the light-emitting device 550B(i,j), and sidewalls of the slits (see FIG. 11A and FIG. 16A). The insulating film 573 is formed by, for example, a sputtering method, a CVD method, an MBE method, a PLD method, an ALD method, or the like.

For example, a stacked film of an aluminum oxide film formed by an ALD method and an aluminum oxide film formed by a sputtering method can be used for the insulating film 573. Thus, when a pin hole or disconnected part on a step occurs in the film formed by a sputtering method, a portion overlapping with the pin hole or the disconnected part can be filled with an ALD-deposited film with excellent coverage.

For example, aluminum oxide can be deposited by a pulsed DC sputtering method using an aluminum target in an atmosphere containing an oxygen gas. Thus, the insulating film 573 can be formed by a sputtering method without using a gas containing a hydrogen molecule as a deposition gas. In addition, the hydrogen concentration of the insulating film 573 can be reduced. Furthermore, more impurities such as water included in the light-emitting device 550R(i,j), the light-emitting device 550G(i,j), the light-emitting device 550B(i,j) can be captured or fixed.

Alternatively, a stacked-layer film in which aluminum oxide and silicon nitride ($SiN_x$; x is an arbitrary number larger than 0) are stacked can be used for the insulating film 573, for example. Silicon nitride serves as an insulating film containing at least nitrogen and silicon. Silicon nitride is highly capable of preventing diffusion of impurities such as water.

Alternatively, for example, a stacked-layer film of silicon nitride film formed by a sputtering method and silicon nitride formed by a PEALD method can be used for the insulating film 573. Thus, when a pin hole or a disconnected part on a step occurs in the film formed by a sputtering method, a portion overlapping with the pin hole or the disconnected part can be filled with an ALD-deposited film with excellent coverage.

<<Nineteenth Step>>

In the nineteenth step, a resist RES is formed, and the opening 573R(i,j) is formed in the insulating film 573 over the light-emitting device 550R(i,j) by a photoetching method. In addition, the opening 573G(i,j) is formed in the insulating film 573 over the light-emitting device 550G(i,j). In addition, the opening 573B(i,j) is formed in the insulating film 573 over the light-emitting unit 550B(i,j) (see FIG. 11B and FIG. 16B).

<<Twentieth Step>>

Figure 16C:
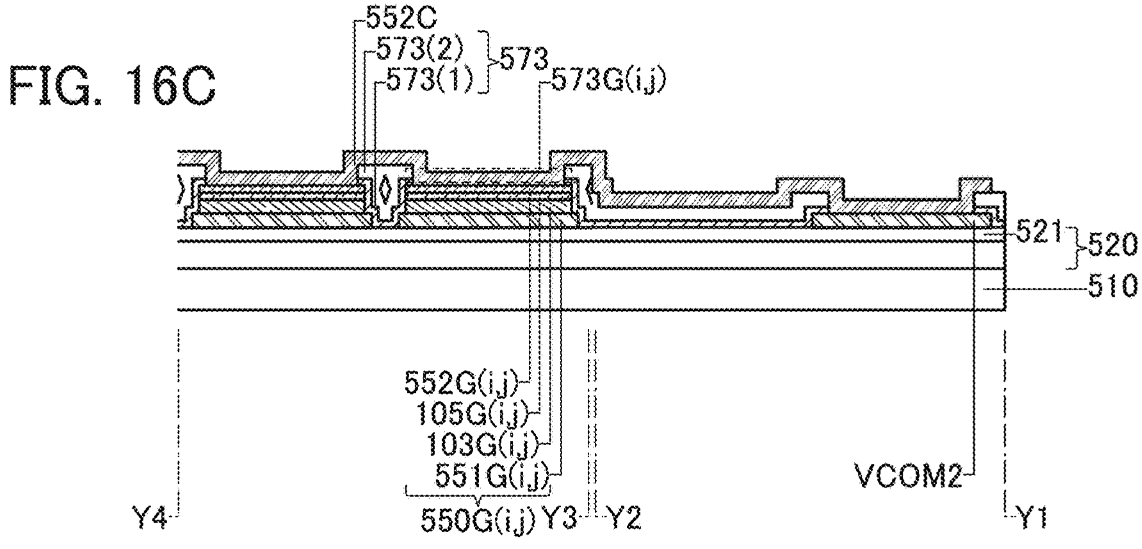

In the twentieth step, the conductive film 552C is formed to cover the opening 573R(i,j), the opening 573G(i,j), and the opening 573B(i,j) (see FIG. 11C and FIG. 16C). The conductive film 552C is formed over and in contact with the conductive film VCOM2, and the conductive film 552C is electrically connected to the conductive film VCOM2.

Thus, a display panel including a plurality of light-emitting devices can be manufactured without using a metal mask. As a result, a method for manufacturing a novel display panel that is highly convenient, useful, or reliable can be provided.

Embodiment 3

In this embodiment, a structure of a light-emitting device 150 that can be used for a display panel of one embodiment of the present invention will be described with reference to FIGS. 17A and 17B, FIGS. 18A and 18B, and FIG. 19A. Note that the structure that can be used for the light-emitting device 150 can be used for the light-emitting device 550B (i,j), the light-emitting device 550G(i,j), or the light-emitting device 550R(i,j), for example, described in Embodiment 1.

Figures 17A, 17B:
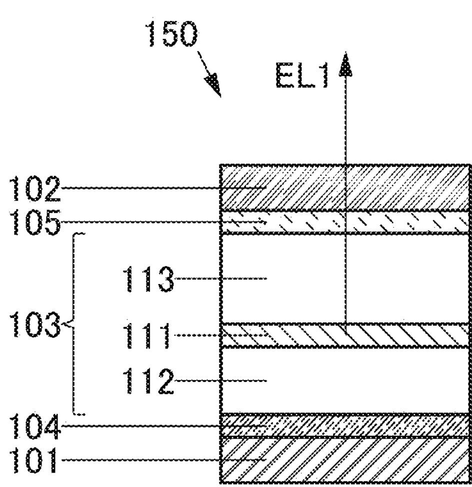
FIGS. 17A and 17B illustrate a structure of a light-emitting device according to one embodiment.

FIG. 17A is a cross-sectional view illustrating a structure of the light-emitting device in accordance with one embodiment, and FIG. 17B is an energy diagram that illustrates the structure of the light-emitting device in accordance with an embodiment.

Figure 19A:
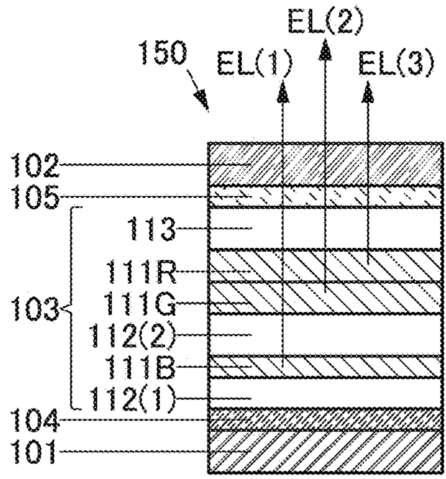
FIGS. 19A and 19B each illustrate a structure of a light-emitting device according to one embodiment.

FIG. 19A illustrates a cross-sectional structure of a light-emitting device in accordance with an embodiment.

Structure Example of Light-Emitting Device 150

The light-emitting device 150 described in this embodiment includes the electrode 101, the electrode 102, and the unit 103. The electrode 102 includes a region overlapping with the electrode 101, and the unit 103 includes a region sandwiched between the electrode 101 and the electrode 102. Note that the structure that can be used for the unit 103 can be employed for, for example, the unit 103B(i,j), the unit 103G(i,j), or the unit 103R(i,j) described in Embodiment 1.

Structure Example 1 of Unit 103

The unit 103 has a single-layer structure or a stacked-layer structure. For example, the unit 103 includes a layer 111, a layer 112, and the layer 113 (see FIG. 17A). The unit 103 has a function of emitting light EL1.

The layer 111 includes a region sandwiched between the layer 112 and the layer 113. The layer 112 includes a region sandwiched between the electrode 101 and the layer 111. The layer 113 includes a region sandwiched between the electrode 102 and the layer 111.

The unit 103 can include, for example, a layer selected from a light-emitting layer, a hole-transport layer, an electron-transport layer, a carrier-blocking layer, and the like. The unit 103 can include a layer selected from a hole-injection layer, an electron-injection layer, an exciton-blocking layer, a charge-generation layer, and the like.

Structure Example of Layer 112

A hole-transport material can be used for the layer 112, for example. The layer 112 can be referred to as a hole-transport layer. A material having a wider bandgap than the light-emitting material contained in the layer 111 is preferably used for the layer 112. Thus, transfer of energy from excitons generated in the layer 111 to the layer 112 can be suppressed.

[Hole-Transport Material]

A material having a hole mobility of $1\times10^{-6}$ $cm^2/Vs$ or higher can be suitably used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

Structure Example of Layer 113

An electron-transport material, a material having an anthracene skeleton, and a mixed material can be used for the layer 113, for example. The layer 113 can be referred to as an electron-transport layer. A material having a wider bandgap than the light-emitting material contained in the layer 111 is preferably used for the layer 113. Thus, energy transfer from excitons generated in the layer 111 to the layer 113 can be inhibited.

[Electron-Transport Material]

For example, a metal complex or an organic compound having a π-electron deficient heteroaromatic ring skeleton can be used as the electron-transport material.

As the electron-transport material, a material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used. In this case, the electron-transport property in the electron-transport layer can be suppressed, the amount of electrons injected into the light-emitting layer can be controlled, or the light-emitting layer can be prevented from having excess electrons.

As the organic compound having a π-electron deficient heteroaromatic ring skeleton, for example, a heterocyclic compound having a polyazole skeleton, a heterocyclic compound having a diazine skeleton, a heterocyclic compound having a pyridine skeleton, a heterocyclic compound having a triazine skeleton, or the like can be used. In particular, the heterocyclic compound having a diazine skeleton and the heterocyclic compound having a pyridine skeleton have favorable reliability and thus are preferable. In addition, the heterocyclic compound having a diazine (pyrimidine or pyrazine) skeleton has a high electron-transport property to contribute to a reduction in driving voltage.

[Material Having Anthracene Skeleton]

An organic compound having an anthracene skeleton can be used for the layer 113. In particular, an organic compound having both an anthracene skeleton and a heterocyclic skeleton can preferably be used.

For example, it is possible to use an organic compound having both an anthracene skeleton and a nitrogen-containing five-membered ring skeleton. Alternatively, it is possible to use an organic compound having both an anthracene skeleton and a nitrogen-containing five-membered ring skeleton where two heteroatoms are included in a ring. Specifically, it is preferable to use, as the heterocyclic skeleton, a pyrazole ring, an imidazole ring, an oxazole ring, a thiazole ring, or the like.

For example, it is possible to use an organic compound having both an anthracene skeleton and a nitrogen-containing six-membered ring skeleton. Alternatively, it is possible to use an organic compound having both an anthracene skeleton and a nitrogen-containing six-membered ring skeleton where two heteroatoms are included in a ring. Specifically, it is preferable to use, as the heterocyclic skeleton, a pyrazine ring, a pyrimidine ring, a pyridazine ring, or the like.

Structure Example of Mixed Material

A material in which a plurality of kinds of substances are mixed can be used for the layer 113. Specifically, a mixed material which includes an alkali metal, an alkali metal compound, or an alkali metal complex and an electron-transport substance can be used for the layer 113. Note that the electron-transport material preferably has a HOMO level of −6.0 eV or higher.

For example, a composite material of an electron-acceptor substance and a hole-transport material can be used for the layer 104. Specifically, a composite material of an electron-acceptor substance and a substance having a relatively deep HOMO level, HOMO1, which is from −5.7 eV through −5.4 eV, can be used for the layer 104 (see FIG. 17B). The mixed material can be suitably used for the layer 113 in combination with a structure using such a composite material for a layer 104. This leads to an increase in the reliability of the light-emitting device.

Furthermore, a structure using a hole-transport material for the layer 112 can be suitably combined with the structure using the mixed material for the layer 113 and the composite material for the layer 104. For example, a substance having a HOMO level, HOMO2, which is differs by −0.2 eV to 0 eV, inclusive, from the relatively deep HOMO1, can be used for the layer 112 (see FIG. 17B). This leads to an increase in the reliability of the light-emitting device.

The concentration of the alkali metal, the alkali metal compound, or the alkali metal complex preferably changes in the thickness direction of the layer 113 (including the case where the concentration is 0).

For example, a metal complex having a 8-hydroxyquinolinato structure can be used. A methyl-substituted product of the metal complex having a 8-hydroxyquinolinato structure (e.g., a 2-methyl-substituted product or a 5-methyl-substituted product) or the like can also be used.

Structure Example 1 of Layer 111

A light-emitting material or a light-emitting material and a host material can be used for the layer 111, for example. The layer 111 can be referred to as a light-emitting layer. Note that the layer 111 is preferably provided in a region where holes and electrons are recombined. Thus, energy generated by recombination of carriers can be efficiently converted into light and emitted. Furthermore, the layer 111 is preferably provided to be distanced from a metal used for the electrode or the like. Thus, a quenching phenomenon caused by the metal used for the electrode or the like can be inhibited.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as light EL1 from the light-emitting material (see FIG. 17A).

[Fluorescent Substance]

A fluorescent substance can be used for the layer 111. For example, any of the following fluorescent substances can be used for the layer 111. Note that the fluorescent substance that can be used for the layer 111 is not limited to the following, and a variety of known fluorescent substances can be used.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

[Phosphorescent Substance]

A phosphorescent substance can be used for the layer 111. For example, the following phosphorescent substances can be used for the layer 111. Note that the phosphorescent substance that can be used for the layer 111 is not limited to the following, and a variety of known phosphorescent substances can be used.

Any of the following can be used for the layer 111: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Substance Exhibiting Thermally Activated Delayed Fluorescence (TADF)]

A TADF material can be used for the layer 111. For example, any of the TADF materials given below can be used as the light-emitting material. Note that without being limited thereto, a variety of known TADF materials can be used as the light-emitting material.

In the TADF material, the difference between the S1 level and the T1 level is small, and reverse intersystem crossing (upconversion) from the triplet excited state into the singlet excited state can be performed with a small amount of thermal energy. Thus, the singlet excited state can be efficiently generated from the triplet excited state. In addition, the triplet excitation energy can be converted into luminescence.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 10 K to 77 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

When a TADF material is used as the light-emitting substance, the S1 level of the host material is preferably higher than that of the TADF material. In addition, the T1 level of the host material is preferably higher than that of the TADF material.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used for the TADF material.

Furthermore, a heterocyclic compound including one or both of a π-electron rich heteroaromatic ring and a π-electron deficient heteroaromatic ring can be used, for example, for the TADF material.

Such a heterocyclic compound is preferable because the heterocyclic compound has excellent electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high electron-acceptor properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; therefore, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferred because the electron-donating property of the π-electron rich heteroaromatic ring and the electron-acceptor property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane or boranthrene, an aromatic ring or a heteroaromatic ring having a cyano group or a nitrile group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Structure Example 2 of Layer 111

A carrier-transport material can be used as the host material. For example, a hole-transport material, an electron-transport material, a substance exhibiting TADF (thermally activated delayed fluorescence), a material having an anthracene skeleton, or a mixed material can be used as the host material. A material having a wider bandgap than the light-emitting material contained in the layer 111 is preferably used as the host material. Thus, transfer of energy from excitons generated in the layer 111 to the host material can be suppressed.

[Hole-Transport Material]

A material having a hole mobility of $1\times10^{-6}$ $cm^2/Vs$ or higher can be suitably used as the hole-transport material.

For example, a hole-transport material that can be used for the layer 112 can be used for the layer 111. Specifically, a hole-transport material that can be used for the hole-transport layer can be used for the layer 111.

[Electron-Transport Material]

For example, an electron-transport material that can be used for the layer 113 can be used for the layer 111. Specifically, an electron-transport material that can be used for the electron-transport layer can be used for the layer 111.

[Material Having Anthracene Skeleton]

An organic compound having an anthracene skeleton can be used as the host material. In particular, when a fluorescent substance is used as the light-emitting substance, an organic compound having an anthracene skeleton is suitable. Thus, a light-emitting device with high emission efficiency and high durability can be achieved.

Among the organic compounds having an anthracene skeleton, an organic compound having a diphenylanthracene skeleton, in particular, an organic compound having a 9,10-diphenylanthracene skeleton, is chemically stable and thus is preferably used. The host material preferably has a carbazole skeleton in order to improve the hole-injection and hole-transport properties. In particular, the host material preferably has a dibenzocarbazole skeleton because the HOMO level thereof is shallower than that of carbazole by approximately 0.1 eV, so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferably used as the host material.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protecting group around a luminophore (a skeleton which causes light emission) of the fluorescent substance. As the protecting group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protecting groups. The substituents having no π bond are poor in carrier-transport performance, whereby the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a condensed aromatic ring or a condensed heteroaromatic ring.

Examples of the condensed aromatic ring or the condensed heteroaromatic ring include a phenanthrene skeleton, a stilbene skeleton, an acridone skeleton, a phenoxazine skeleton, and a phenothiazine skeleton. Specifically, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, the TADF material that can be used as the light-emitting material can be used as the host material.

Structure Example 1 of Mixed Material

A material in which a plurality of kinds of substances are mixed can be used as the host material. For example, an electron-transport material and a hole-transport material can be used for the mixed material. The weight ratio between the hole-transport material and the electron-transport material contained in the mixed material may be (the hole-transport material/the electron-transport material)=(1/19) or more and (19/1) or less. Accordingly, the carrier-transport property of the layer 111 can be easily adjusted. A recombination region can also be controlled easily.

Structure Example 2 of Mixed Material

In addition, a material mixed with a phosphorescent substance can be used as the host material. When a fluorescent substance is used as the light-emitting substance, a phosphorescent substance can be used as an energy donor for supplying excitation energy to the fluorescent substance.

A mixed material containing a material to form an exciplex can be used as the host material. For example, a material in which an emission spectrum of an exciplex to be formed overlaps with a wavelength of the absorption band on the lowest energy side of the light-emitting substance can be used as the host material. This enables smooth energy transfer and improves emission efficiency. The driving voltage can be suppressed.

A phosphorescent substance can be used as at least one of the materials forming an exciplex. Accordingly, reverse intersystem crossing can be utilized. Triplet excitation energy can be efficiently converted into singlet excitation energy.

A combination of an electron-transport material and a hole-transport material having a HOMO level higher than or equal to that of the electron-transport material is preferable for forming an exciplex. The LUMO level of the hole-transport material is preferably higher than or equal to the LUMO level of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the hole-transport material and the electron-transport material are mixed is shifted to a longer wavelength side than the emission spectra of each of the materials (or has another peak on the longer wavelength side) observed in comparison of the emission spectra of the hole-transport material, the electron-transport material, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed in comparison of transient PL of the hole-transport material, the electron-transport material, and the mixed film of the materials. The transient PL can be rephrased as transient electroluminescence (EL). That is, the formation of an exciplex can also be confirmed by a difference in transient response observed in comparison of the transient EL of the hole-transport material, the electron-transport material, and the mixed film of the materials.

Structure Example 2 of Unit 103

A layer that emits light EL(1), a layer that emits light EL(2), and a layer emitting light EL(3) can be used in one unit 103 (see FIG. 19A).

For example, a stacked structure of the layer 111B containing a blue-light-emitting material, the layer 111G containing a green-light-emitting material, and the layer 111R containing a red-light-emitting material can be used for the unit 103. Thus, white light can be emitted.

A layer containing a hole-transport material, a layer containing an electron-transport material, and a layer containing a material having a bipolar property can be used for the unit 103.

For example, a hole-transport material can be used for the layer 112(1), an electron-transport material can be used for the layer 113, and a bipolar material can be used for the layer 112(2). Thus, the recombination region of carriers can be enlarged.

Note that this embodiment can be combined with any of the other embodiments in this specification as appropriate.

Embodiment 4

In this embodiment, a structure of the light-emitting device 150 of one embodiment of the present invention is described with reference to FIG. 17A. Note that the structure that can be used for the light-emitting device 150 can be employed for, for example, the light-emitting device 550B(i,j), the light-emitting device 550G(i,j), or the light-emitting device 550R(i,j) described in Embodiment 1.

Structure Example of Light-Emitting Device 150

The light-emitting device 150 described in this embodiment includes the electrode 101, the electrode 102, the unit 103, and the layer 104. The electrode 102 includes a region overlapping with the electrode 101, and the unit 103 includes a region sandwiched between the electrode 101 and the electrode 102. The layer 104 includes a region sandwiched between the unit 103 and the electrode 101. For example, the structure described in Embodiment 3 can be used for the unit 103. For example, the structure that can be used for the electrode 101 can be employed for the electrode 551B(i,j), the electrode 551G(i,j), or the electrode 551R(i,j) described in Embodiment 1. For example, the structure that can be used for the layer 104 can be employed for the layer 104B(i,j), the layer 104G(i,j), or the layer 104R(i,j) described in Embodiment 1.

Structure Example of Electrode 101

For example, a conductive material can be used for the electrode 101. Specifically, a single layer or a stacked layer of a metal, an alloy, or a film containing a conductive compound can be used for the electrode 101.

A film that efficiently reflects light can be used for the electrode 101, for example. Specifically, an alloy containing silver, copper, and the like, an alloy containing silver, palladium, and the like, or a metal film of aluminum or the like can be used for the electrode 101.

For example, a metal film that transmits part of light and reflects another part of light can be used for the electrode 101. Thus, a microcavity structure can be provided in the light-emitting device 150. Alternatively, light with a predetermined wavelength can be extracted more efficiently than light with the other wavelengths. Alternatively, light with a narrow spectral half-width can be extracted. Alternatively, light of a bright color can be extracted.

A film having a visible-light-transmitting property can be used for the electrode 101, for example. Specifically, a single layer or a stacked layer of a metal film, an alloy film, a conductive oxide film, or the like that is thin enough to transmit light can be used for the electrode 101.

In particular, a material having a work function higher than or equal to 4.0 eV can be suitably used.

For example, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

For another example, gold (Au), platinum (Pt), nickel (Ni), tungsten (W), chromium (Cr), molybdenum (Mo), iron (Fe), cobalt (Co), copper (Cu), palladium (Pd), a nitride of a metal material (e.g., titanium nitride), or the like can be used. Graphene can also be used.

Note that this embodiment can be combined with any of the other embodiments in this specification as appropriate.

Embodiment 5

In this embodiment, a structure of the light-emitting device 150 of one embodiment of the present invention will be described with reference to FIG. 17A. Note that the structure that can be used for the light-emitting device 150 can be employed for, for example, the light-emitting device 550B(i,j), the light-emitting device 550G(i,j), or the light-emitting device 550R(i,j) described in Embodiment 1.

Structure Example of Light-Emitting Device 150

The light-emitting device 150 described in this embodiment includes the electrode 101, the electrode 102, the unit 103, and the layer 105. The electrode 102 includes a region overlapping with the electrode 101, and the unit 103 includes a region sandwiched between the electrode 101 and the electrode 102. The layer 105 includes a region sandwiched between the unit 103 and the electrode 102. For example, the structure described in Embodiment 3 can be used for the unit 103. In addition, the structure that can be used for the electrode 102 can be employed for, for example, the electrode 552B(i,j), 552G(i,j), or 552R(i,j) described in Embodiment 1. The material that can be used for the layer 105 can be employed for, for example, the layer 105B(i,j), 105G(i,j), or 105R(i,j) described in Embodiment 1.

Structure Example of Electrode 102

For example, a conductive material can be used for the electrode 102. Specifically, a single layer or a stacked layer of a metal, an alloy, or a material containing a conductive compound can be used for the electrode 102.

For example, the material that can be used for the electrode 101 described in Embodiment 4 can be used for the electrode 102. In particular, a material with a lower work function than the electrode 101 can be suitably used for the electrode 102. Specifically, a material having a work function lower than or equal to 3.8 eV is preferably used.

For example, an element belonging to Group 1 or Group 2 of the periodic table, a rare earth metal, or an alloy containing any of these elements can be used for the electrode 102.

Specifically, lithium (Li), cesium (Cs), or the like; magnesium (Mg), calcium (Ca), strontium (Sr), or the like; europium (Eu), ytterbium (Yb), or the like or an alloy containing any of these (MgAg or AlLi) can be used for the electrode 102. Alternatively, a layered material of the alloy containing any of these and a conductive oxide can be used for the electrode 102. Specifically, a layered material of MgAg and ITO can be used for the electrode 102.

Structure Example of Layer 105

For example, an electron-injection material can be used for the layer 105. The layer 105 can also be referred to as an electron-injection layer.

Specifically, an electron-donor substance can be used for the layer 105. Alternatively, a material in which an electron-donor substance and an electron-transport material are combined can be used for the layer 105. Alternatively, an electrode can be used for the layer 105. This can facilitate the injection of electrons from the electrode 102, for example. Alternatively, not only a material having a low work function but also a material having a high work function can also be used for the electrode 102. Alternatively, a material used for the electrode 102 can be selected from a wide range of materials regardless of its work function. Specifically, Al, Ag, ITO, indium oxide-tin oxide containing silicon or silicon oxide, and the like can be used for the electrode 102. Alternatively, the driving voltage of the light-emitting device can be reduced.

[Electron-Donor Substance]

For example, an alkali metal, an alkaline earth metal, a rare earth metal, or a compound thereof (an oxide, a halide, a carbonate, or the like) can be used for the electron-donor substance. Alternatively, an organic compound such as tetrathianaphthacene (abbreviation: TTN), nickelocene, or decamethylnickelocene can be used as the electron-donor substance.

Structure Example 1 of Composite Material

A material composed of two or more kinds of substances can be used as the electron-injection material. For example, an electron-donor substance and an electron-transport material can be used for the composite material.

[Electron-Transport Material]

For example, a metal complex or an organic compound having a π-electron deficient heteroaromatic ring skeleton can be used as the electron-transport material.

For example, an electron-transport material capable of being used for the unit 103 can be used as the composite material.

Structure Example 2 of Composite Material

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or an alkaline earth metal at 50 wt % or higher can be suitably used. Alternatively, a composite material including an organic compound having a bipyridine skeleton can be suitably used. Thus, the refractive index of the layer 104 can be reduced. The external quantum efficiency of the light-emitting device can be improved.

[Electrode]

For example, a substance obtained by adding electrons at high concentration to a mixed oxide of calcium and aluminum can be used, for example, as the electron-injection material.

Note that this embodiment can be combined with any of the other embodiments in this specification as appropriate.

Embodiment 6

In this embodiment, a structure of the light-emitting device 150 of one embodiment of the present invention is described with reference to FIG. 18A.

Figure 18A:
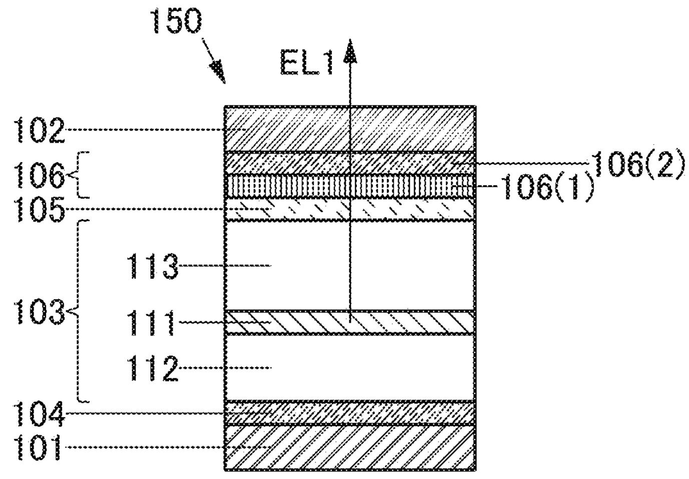
FIGS. 18A and 18B each illustrate a structure of a light-emitting device according to one embodiment.

FIG. 18A is a cross-sectional view illustrating a structure of a light-emitting device of one embodiment of the present invention.

Structure Example of Light-Emitting Device 150

The light-emitting device 150 described in this embodiment includes the electrode 101, the electrode 102, the unit 103, and an intermediate layer 106 (see FIG. 18A). The electrode 102 includes a region overlapping with the electrode 101, and the unit 103 includes a region between the electrode 101 and the electrode 102. The intermediate layer 106 includes a region between the unit 103 and the electrode 102.

Structure Example of Intermediate Layer 106

The intermediate layer 106 includes a layer 106(1) and a layer 106(2). The layer 106(2) includes a region between the layer 106(1) and the electrode 102.

Structure Example of Layer 106(1)

For example, an electron-transport material can be used for the layer 106(1). The layer 106(1) can be referred to as an electron-relay layer. With use of the layer 106(1), a layer that is on the anode side and in contact with the layer 106(1) can be kept away from a layer that is on the cathode side and in contact with the layer 106(1). Interaction between the layer that is on the anode side and in contact with the layer 106(1) and the layer that is on the cathode side and in contact with the layer 106(1) can be reduced. Electrons can be smoothly supplied to the layer that is on the anode side and in contact with the layer 106(1).

A substance whose LUMO level is positioned between the LUMO level of the electron-acceptor substance included in the layer that is on the anode side and in contact with the layer 106(1) and the LUMO level of the substance included in the layer that is on the cathode side and in contact with the layer 106(1) can be suitably used for the layer 106(1).

For example, a material having a LUMO level in a range higher than or equal to −5.0 eV, preferably higher than or equal to −5.0 eV and lower than or equal to −3.0 eV, can be used for the layer 106(1).

Specifically, a phthalocyanine-based material can be used for the layer 106(1). Alternatively, a metal complex having a metal-oxygen bond and an aromatic ligand can be used for the layer 106(1).

Structure Example of Layer 106(2)

For example, a material that supplies electrons to the anode side and supplies holes to the cathode side when voltage is applied can be used for the layer 106(2). Specifically, electrons can be supplied to the unit 103 that is positioned on the anode side. The layer 106(2) can be referred to as a charge-generation layer.

Specifically, a hole-injection material capable of being used for the layer 104 can be used for the layer 106(2). For example, a composite material can be used for the layer 106(2). Alternatively, for example, a stacked film in which a film including the composite material and a film including a hole-transport material are stacked can be used for the layer 106(2).

Note that this embodiment can be combined with any of the other embodiments in this specification as appropriate.

Embodiment 7

In this embodiment, a structure of the light-emitting device 150 of one embodiment of the present invention is described with reference to FIG. 18B and FIG. 19B.

Figure 18B:
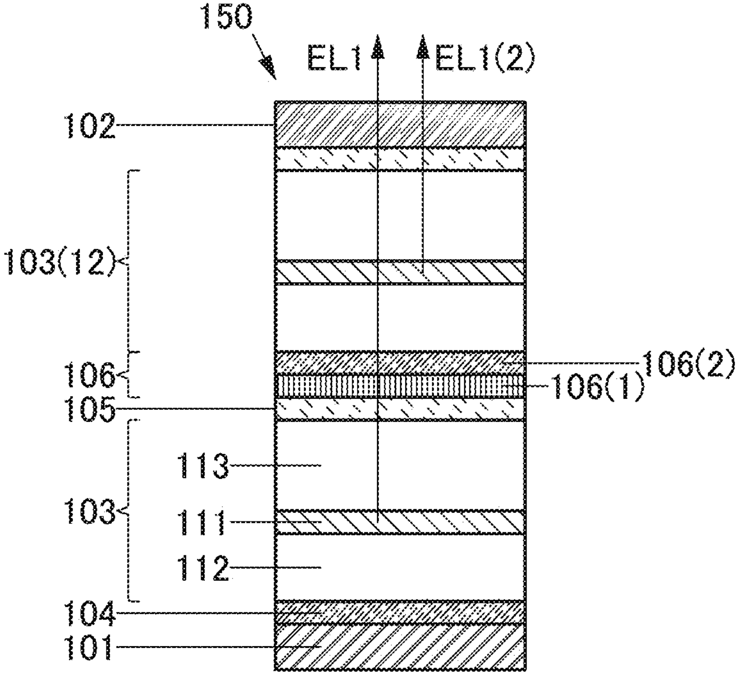

FIG. 18B is a cross-sectional view illustrating a structure of a light-emitting device of one embodiment of the present invention, which is different from that in FIG. 18A.

Figure 19B:
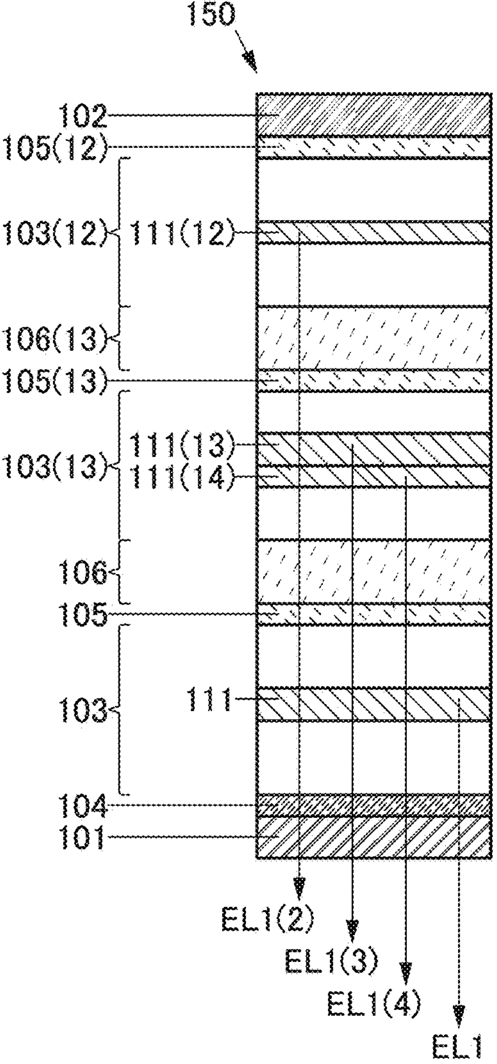

FIG. 19B is a cross-sectional view illustrating a structure of a light-emitting device of one embodiment of the present invention, which is different from that in FIG. 18B.

Structure Example 1 of Light-Emitting Device 150

The light-emitting device 150 described in this embodiment includes the electrode 101, the electrode 102, the unit 103, the intermediate layer 106, and a unit 103(12) (see FIG. 18B). The electrode 102 includes a region overlapping with the electrode 101, the unit 103 includes a region between the electrode 101 and the electrode 102, and the intermediate layer 106 includes a region between the unit 103 and the electrode 102. The unit 103(12) includes a region between the intermediate layer 106 and the electrode 102, and the unit 103(12) has a function of emitting light EL1(2).

A structure including the intermediate layer 106 and a plurality of units is referred to as a stacked light-emitting device or a tandem light-emitting device in some cases. This structure enables high luminance emission while the current density is kept low; can improve the reliability; can reduce the driving voltage in comparison with that of the light-emitting device with the same luminance; or can reduce the power consumption.

Structure Example of Unit 103(12)

The structure that can be employed for the unit 103 can also be employed for the unit 103(12). In other words, the light-emitting device 150 includes a plurality of units that are stacked. Note that the number of stacked units is not limited to two and may be three or more.

The same structure as the unit 103 can be employed for the unit 103(12). Alternatively, a structure different from the unit 103 can be employed for the unit 103(12).

For example, a structure which exhibits a different emission color from that of the unit 103 can be employed for the unit 103(12). Specifically, the unit 103 emitting red light and green light and the unit 103(12) emitting blue light can be employed. With this structure, a light-emitting device emitting light of a desired color can be provided. A light-emitting device emitting white light can be provided, for example.

Structure Example of Intermediate Layer 106

The intermediate layer 106 has a function of supplying electrons to one of the unit 103 and the unit 103(12) and supplying holes to the other. For example, the intermediate layer 106 described in Embodiment 6 can be used.

Structure Example 2 of Light-Emitting Device 150

The light-emitting device 150 described in this embodiment includes the electrode 101, the electrode 102, the layer 105(12), the unit 103, the intermediate layer 106, the unit 103(12), a unit 103(13), a layer 105(13), and an intermediate layer 106(13) (see FIG. 19B).

The light-emitting device 150 illustrated in FIG. 19B is different from the light-emitting device 150 illustrated in FIG. 18B in that the unit 103(13), the layer 105(13), and the intermediate layer 106(13) are provided between the intermediate layer 106 and the unit 103(12).

The layer 111 has a function of emitting light EL1, the layer 111(12) has a function of emitting light EL1(2), the layer 111(13) has a function of emitting light EL1(3), and the layer 111(14) has a function of emitting light EL1(4).

For example, a light-emitting material that emits blue light can be used for the layer 111 and the layer 111(12). For example, a light-emitting material that emits yellow light can be used for the layer 111(13). For example, a light-emitting material that emits red light can be used for the layer 111(14).

For example, a structure that can be used for the unit 103 can be used for the unit 103(13), a structure that can be used for the layer 105 can be used for the layer 105(13), a structure that can be used for the intermediate layer 106 can be used for the intermediate layer 106(13).

<Fabrication Method for Light-Emitting Device 150>

For example, each layer of the electrode 101, the electrode 102, the unit 103, the intermediate layer 106, and the unit 103(12) can be formed by a dry process, a wet process, an evaporation method, a droplet discharge method, a coating method, a printing method, or the like. A formation method may differ between components of the device.

Specifically, the light-emitting device 150 can be manufactured with a vacuum evaporation machine, an ink-jet machine, a coating machine such as a spin coater, a gravure printing machine, an offset printing machine, a screen printing machine, or the like.

For example, the electrode can be formed by a wet process or a sol-gel method using a paste of a metal material. An indium oxide-zinc oxide film can be formed by a sputtering method using a target obtained by adding zinc oxide to indium oxide at a concentration higher than or equal to 1 wt % and lower than or equal to 20 wt %. An indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

Note that this embodiment can be combined with any of the other embodiments in this specification as appropriate.

Embodiment 8

In this embodiment, the structure of a data processing device of one embodiment of the present invention will be described with reference to FIGS. 20A to 20E, FIGS. 21A to 21E, and FIGS. 22A and 22B.

Figure 20A:
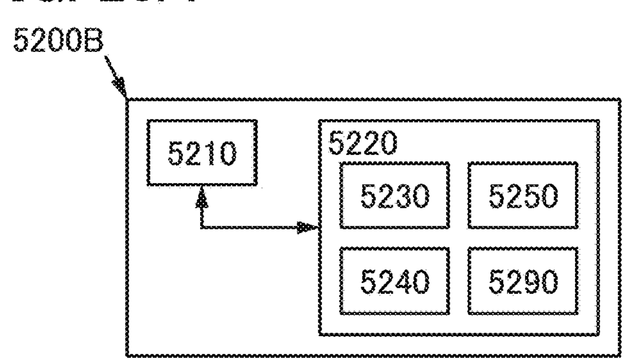
FIGS. 20A to 20E each illustrate a structure of a data processing device according to one embodiment.
Figures 21A, 21B, 21C, 21D, 21E:
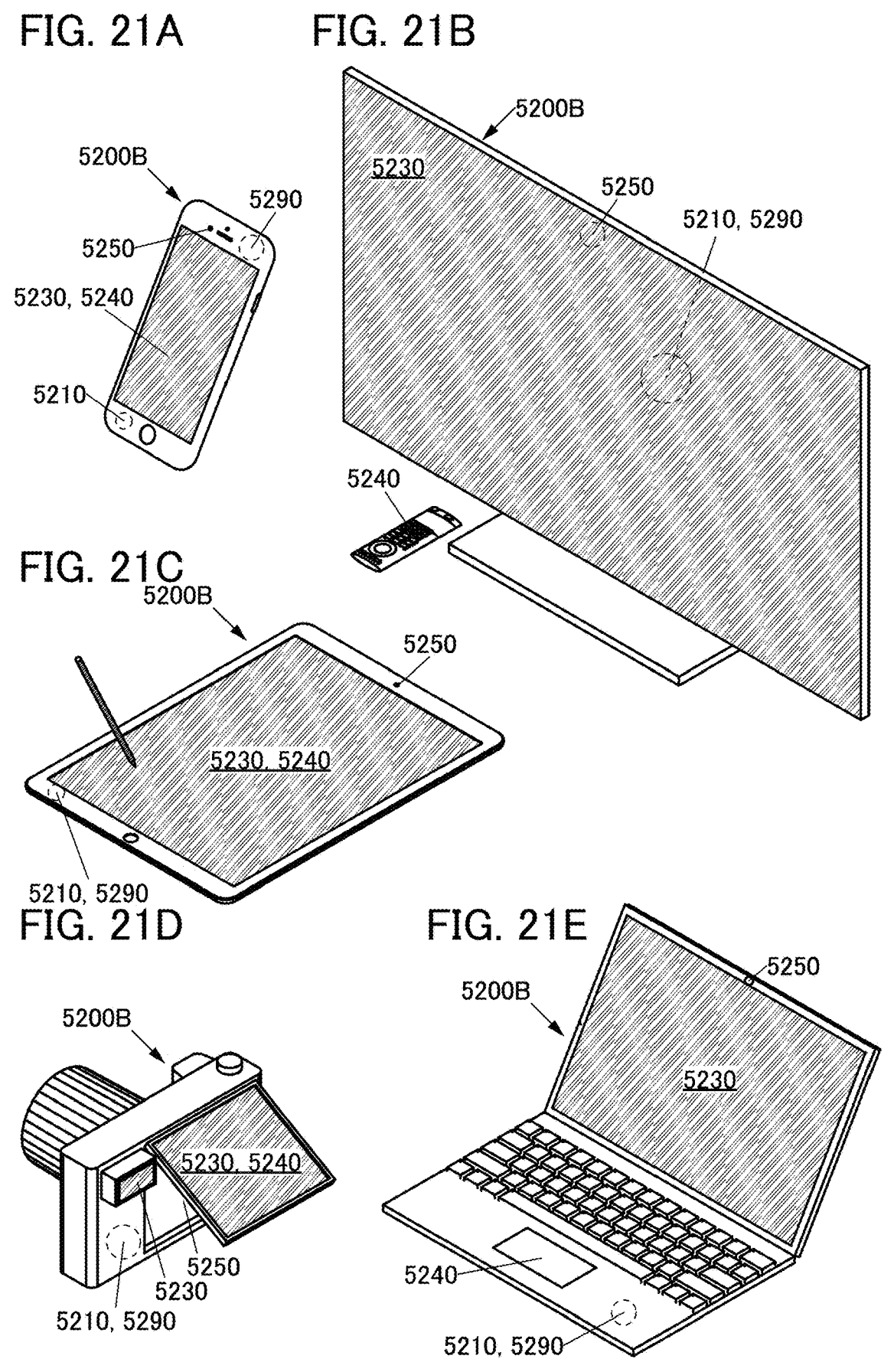
Figure 22A:
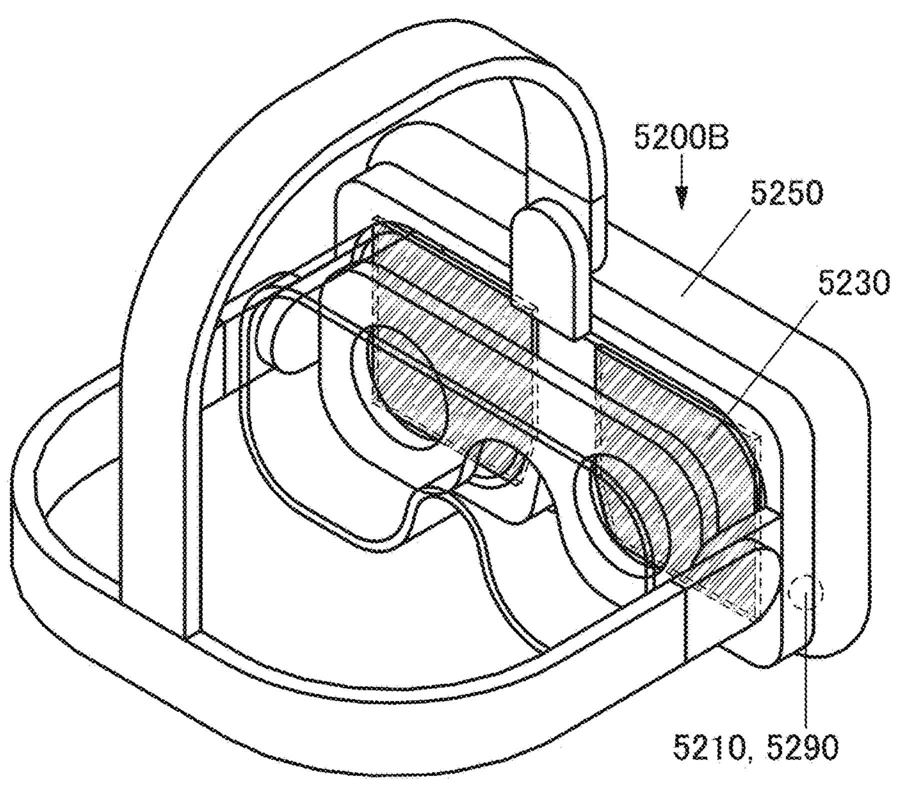
FIGS. 22A and 22B each illustrate a structure of a data processing device according to one embodiment.
Figure 22B:
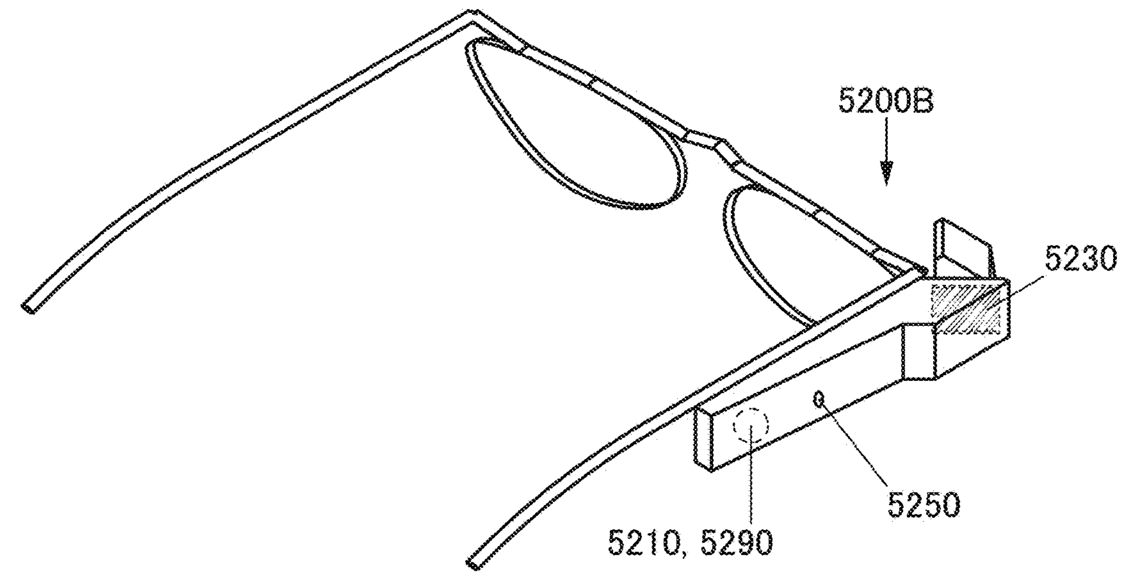

FIGS. 20A to 20E, FIGS. 21A to 21E, and FIGS. 22A and 22B each illustrate a structure of a data processing device of one embodiment of the present invention. FIG. 20A is a block diagram of a data processing device, and FIGS. 20B to 20E are perspective views each illustrating a structure of the data processing device. FIGS. 21A to 21E are perspective views each illustrating a structure of the data processing device. FIGS. 22A and 22B are perspective views each illustrating a structure of the data processing device.

<Data Processing Device>

A data processing device 5200B described in this embodiment includes an arithmetic device 5210 and an input/output device 5220 (see FIG. 20A).

The arithmetic device 5210 has a function of receiving handling data and a function of supplying image data on the basis of the handling data.

The input/output device 5220 includes a display portion 5230, an input unit 5240, a sensor unit 5250, and a communication unit 5290, and has a function of supplying handling data and a function of receiving image data. The input/output device 5220 also has a function of supplying sensing data, a function of supplying communication data, and a function of receiving communication data.

The input unit 5240 has a function of supplying handling data. For example, the input unit 5240 supplies handling data on the basis of handling by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input unit 5240.

The display portion 5230 includes a display panel and has a function of displaying image data. For example, the display panel described in Embodiment 1 can be used in the display portion 5230.

The sensor unit 5250 has a function of supplying sensing data. For example, the sensor unit 5250 has a function of sensing a surrounding environment where the data processing device is used and supplying the sensing data.

Specifically, an illuminance sensor, an imaging device, an attitude sensing device, a pressure sensor, a human motion sensor, or the like can be used as the sensor unit 5250.

The communication unit 5290 has a function of receiving and supplying communication data. For example, the communication unit 5290 has a function of being connected to another electronic device or a communication network by wireless communication or wired communication. Specifically, the communication unit 5290 has a function of wireless local area network communication, telephone communication, near field communication, or the like.

Structure Example 1 of Data Processing Device

Figure 20B:
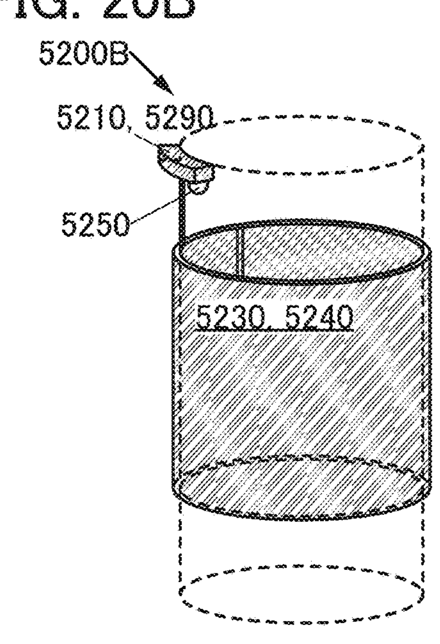

For example, the display portion 5230 can have an outer shape along a cylindrical column or the like (see FIG. 20B). The data processing device has a function of changing its display method in accordance with the illuminance of a usage environment. In addition, the data processing device has a function of changing the displayed content when sensing the existence of a person. Thus, for example, the data processing device can be provided on a column of a building. The data processing device can display advertising, guidance, or the like. The data processing device can be used for digital signage or the like.

Structure Example 2 of Data Processing Device

Figure 20C:
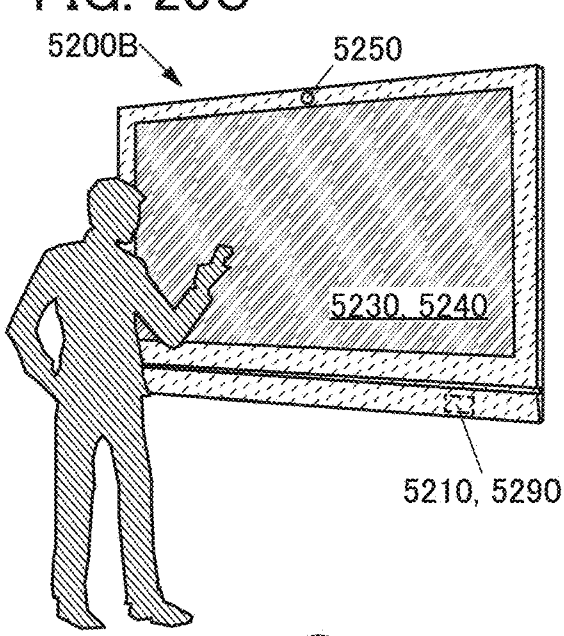

For example, the data processing device has a function of generating image data on the basis of the path of a pointer used by a user (see FIG. 20C). Specifically, a display panel with a diagonal size of 20 inches or longer, preferably 40 inches or longer, further preferably 55 inches or longer can be used. A plurality of display panels can be arranged and used as one display region. In addition, a plurality of display panels can be arranged and used as a multiscreen. Thus, the data processing device can be used for an electronic blackboard, an electronic bulletin board, or digital signage, for example.

Structure Example 3 of Data Processing Device

Figure 20D:
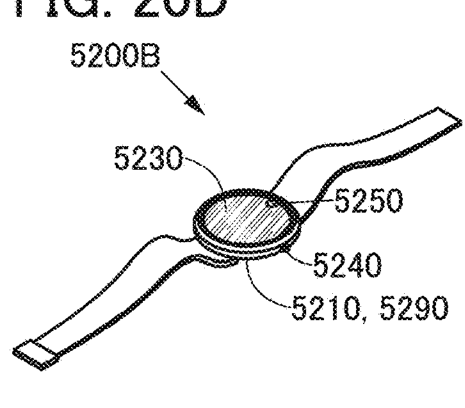

Data received from another device can be displayed on the display portion 5230 (see FIG. 20D). Moreover, several options can be displayed. The user can choose some from the options and send a reply to the data transmitter. As another example, the data processing device has a function of changing its display method in accordance with the illuminance of a usage environment. Thus, it is possible to obtain a watch-type data processing device with reduced power consumption, for example. As another example, the watch-type data processing device can display an image so as to be suitably used even in an environment under strong external light, e.g., outdoors in fine weather.

Structure Example 4 of Data Processing Device

Figure 20E:
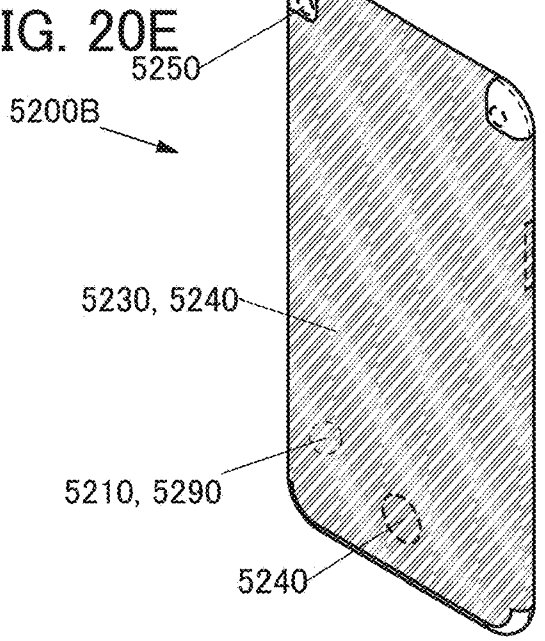

For example, the display portion 5230 has a surface gently curved along a side surface of a housing (see FIG. 20E). The display portion 5230 includes a display panel that has a function of displaying an image on the front surface, the side surfaces, the top surface, and the rear surface, for example. Thus, it is possible to obtain a mobile phone that can display data on not only its front surface but also its side surfaces, top surface, and rear surface, for example.

Structure Example 5 of Data Processing Device

For example, data received via the Internet can be displayed on the display portion 5230 (see FIG. 21A). The user can check a created message on the display portion 5230 and send the created message to another device. As another example, the data processing device has a function of changing its display method in accordance with the illuminance of a usage environment. Thus, it is possible to obtain the data processing device such as a smartphone with reduced power consumption. As another example, the data processing device such as a smartphone can display an image so as to be suitably used even in an environment under strong external light, e.g., outdoors in fine weather.

Structure Example 6 of Data Processing Device

A remote controller can be used as the input unit 5240 (see FIG. 21B). For example, data received from a broadcast station or via the Internet can be displayed on the display portion 5230. The data processing device can take an image of the user with the sensor unit 5250 or transmit the image of the user. The data processing device can acquire a viewing history of the user and provide it to a cloud service. The data processing device can acquire recommendation data from a cloud service and display the data on the display portion 5230. A program or a moving image can be displayed on the basis of the recommendation data. As another example, the data processing device has a function of changing its display method in accordance with the illuminance of a usage environment. Accordingly, for example, the data processing device such as a television system can display an image so as to be suitably used even in an environment under strong external light that enters the room from the outside in fine weather.

Structure Example 7 of Data Processing Device

For example, educational materials can be received via the Internet and displayed on the display portion 5230 (see FIG. 21C). The user can input an assignment with the input unit 5240 and send it via the Internet. The user can obtain a corrected assignment or the evaluation from a cloud service and have it displayed on the display portion 5230. The user can select suitable educational materials on the basis of the evaluation and have them displayed.

For example, an image signal can be received from another data processing device and displayed on the display portion 5230. When the data processing device is placed on a stand or the like, the display portion 5230 can be used as a sub-display. Thus, for example, the data processing device such as a tablet computer can display an image so as to be suitably used even in an environment under strong external light, e.g., outdoors in fine weather.

Structure Example 8 of Data Processing Device

The data processing device includes, for example, a plurality of display portions 5230 (see FIG. 21D). For example, the display portion 5230 can display an image that the sensor unit 5250 is capturing. A captured image can be displayed on the sensor unit. A captured image can be decorated using the input unit 5240. A message can be attached to a captured image. A captured image can be transmitted via the Internet. The data processing device has a function of changing shooting conditions in accordance with the illuminance of a usage environment. Accordingly, for example, the data processing device such as a digital camera can display an object to be photographed so as to be suitably used even in an environment under strong external light, e.g., outdoors in fine weather.

Structure Example 9 of Data Processing Device

For example, another data processing device can be controlled with the data processing device of this embodiment. For example, part of image data can be displayed on the display portion 5230 and another part of the image data can be displayed on a display portion of another data processing device (see FIG. 21E). Image signals can be supplied. Data written from an input unit of another data processing device can be obtained with the communication unit 5290. Thus, a large display region can be utilized by using the data processing device such as a portable personal computer, for example.

Structure Example 10 of Data Processing Device

The data processing device includes, for example, the sensor unit 5250 that senses an acceleration or a direction (see FIG. 22A). The sensor unit 5250 can supply data on the position of the user or the direction in which the user faces. The data processing device can generate image data for the right eye and image data for the left eye in accordance with the position of the user or the direction in which the user faces. The display portion 5230 includes a display region for the right eye and a display region for the left eye. Thus, a virtual reality image that gives the user a sense of immersion can be displayed on a goggles-type data processing device, for example.

Structure Example 11 of Data Processing Device

The data processing device includes, for example, an imaging device and the sensor unit 5250 that senses an acceleration or a direction (see FIG. 22B). The sensor unit 5250 can supply data on the position of the user or the direction in which the user faces. The data processing device can generate image data in accordance with the position of the user or the direction in which the user faces. Accordingly, the data can be shown together with a real-world scene, for example. Alternatively, an augmented reality image can be displayed on a glasses-type data processing device.

Note that this embodiment can be combined with any of the other embodiments in this specification as appropriate.

Embodiment 9

In this embodiment, a display device and a display system, which are each one embodiment of the present invention, will be described.

Structure example of display Device

Figure 23:
FIG. 23 is a block diagram illustrating a structure example of a display device.
Figure 23:
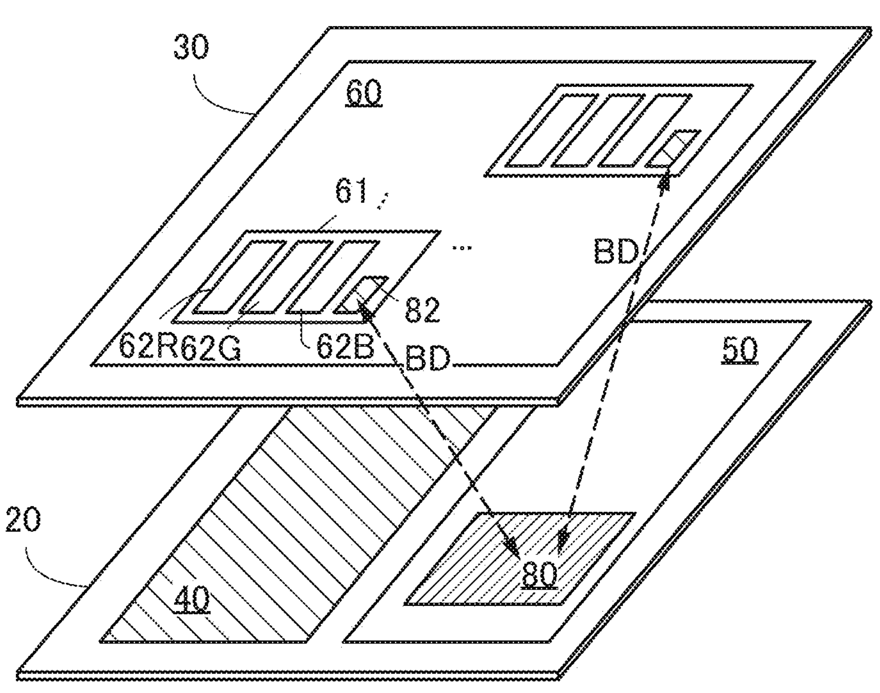

FIG. 23 is a block diagram schematically illustrating a structure example of a display device 10 that is the display device of one embodiment of the present invention. The display device 10 includes a layer 20 and a layer 30. The layer 30 can be stacked above the layer 20, for example. An interlayer insulator or a conductor for electrical connection between different layers can be provided between the layers 20 and 30.

For example, a transistor provided in the layer 20 can be a transistor in which a channel formation region includes silicon (also referred to as a Si transistor), specifically, a transistor in which a channel formation region includes single crystal silicon. In particular, a transistor in which a channel formation region includes single crystal silicon is preferably used as the transistor provided in the layer 20, in which case the on-state current of the transistor can be high, so that a circuit included in the layer 20 can be driven at high speed. The Si transistor can be formed in microfabrication, e.g., a channel length of 3 nm to 10 nm; therefore, the display device 10 can be provided with a CPU, an accelerator such as a GPU, an application processor, or the like.

A transistor provided in the layer 30 can be an OS transistor, for example. It is particularly preferable that a transistor in which a channel formation region includes an oxide containing at least one of indium, an element M (the element M is aluminum, gallium, yttrium, or tin), and zinc be used as the OS transistor. Such an OS transistor has a characteristic of an extremely low off-state current. Thus, it is preferable that the OS transistor be used as a transistor provided particularly in a pixel circuit included in a display portion, in which case analog data written to the pixel circuit can be retained for a long time.

A driver circuit 40 and a functional circuit 50 are provided in the layer 20. Since the Si transistor with a high on-state current is provided in the layer 20, the circuits can be driven at high speed.

A display portion 60 including a plurality of pixels 61 is provided in the layer 30. Pixel circuits 62R, 62G, and 62B that control emission of red light, green light, and blue light are provided in the pixels 61. The pixel circuits 62R, 62G, and 62B function as subpixels of the pixels 61. Since the pixel circuits 62R, 62G, and 62B include OS transistors, analog data written to the pixel circuits can be retained for a long time. A backup circuit 82 is provided in each of the pixels 61 included in the layer 30. The backup circuit is sometimes referred to as a storage circuit or a memory circuit.

The driver circuit 40 includes a gate line driver circuit, a source line driver circuit, and the like for driving the pixel circuits 62R, 62G, and 62B. In one example, the driver circuit 40 includes the gate line driver circuit and the source line driver circuit for driving a pixel 61 in the display portion 60. The driver circuit 40 is provided not in the layer 30 where the display portion is provided but in the layer 20, whereby an area occupied by the display portion in the layer 30 can be large. In addition, the driver circuit 40 may include a digital-to-analog (D/A) converter circuit, a low voltage differential signaling (LVDS) circuit functioning as an interface for receiving data such as image data from the outside of the display device 10, or the like. The Si transistor of the layer 20 can have a high on-state current. The channel length, the channel width, or the like of the Si transistor may be varied in accordance with the operation speed of each circuit.

The functional circuit 50 includes a CPU used for arithmetic processing of data. The CPU includes a plurality of CPU cores. The CPU core includes a flip-flop. The flip-flop includes a plurality of scan flip-flops. A flip-flop 80 inputs/outputs data of the scan flip-flops (backup data) to/from the backup circuit 82. FIG. 23 illustrates backup data BD as a data signal retained in the backup circuit 82.

For the backup circuit 82, for example, a memory including an OS transistor is suitable. The backup circuit including an OS transistor has advantages of, for example, inhibiting a decrease in voltage for data to be backed up and consuming almost no electric power for data storage, because the OS transistor has extremely off-state current. The backup circuit 82 including the OS transistor can be provided in the display portion 60 in which a plurality of pixels 61 are placed. In the example illustrated in FIG. 23, the backup circuit 82 is provided in each of the pixels 61.

The backup circuit 82 including the OS transistor and the layer 20 including the Si transistor can be stacked. The backup circuits 82 may be arranged in a matrix like the subpixels in the pixels 61; alternatively, each backup circuit 82 may be provided for a plurality of pixels. That is, the backup circuits 82 can be arranged in the layer 30 without being limited by the arrangement of the pixels 61. Therefore, the backup circuits 82 can be arranged without any increase in the circuit area while the degree of flexibility in the layout of the display portion or the circuits is enhanced, so that memory capacity of the backup circuits 82 required for arithmetic processing can be increased.

Structure Example of Pixel Circuit and Backup Circuit

Figure 24:
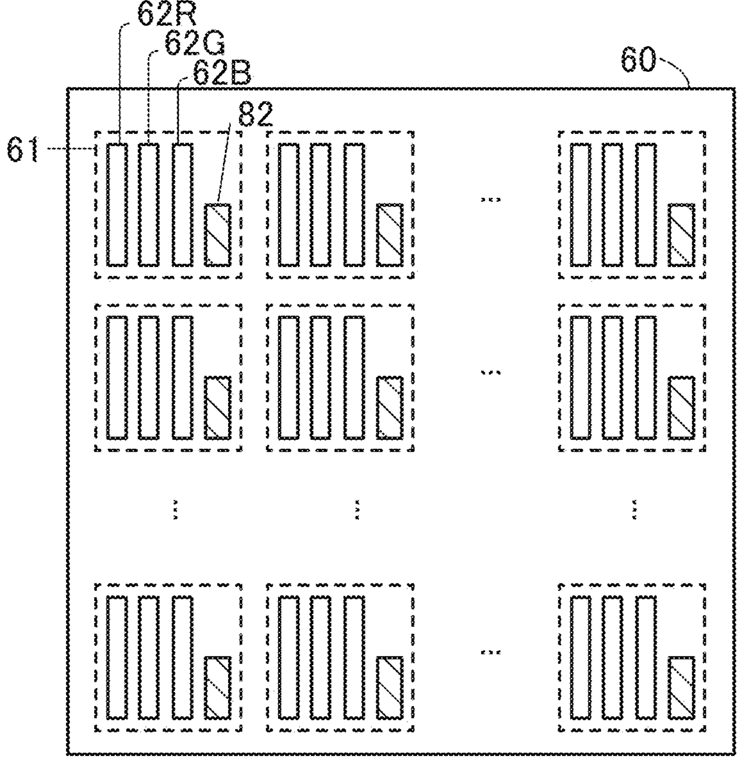
FIG. 24 is a block diagram illustrating a structure example of the display device.
Figure 25:
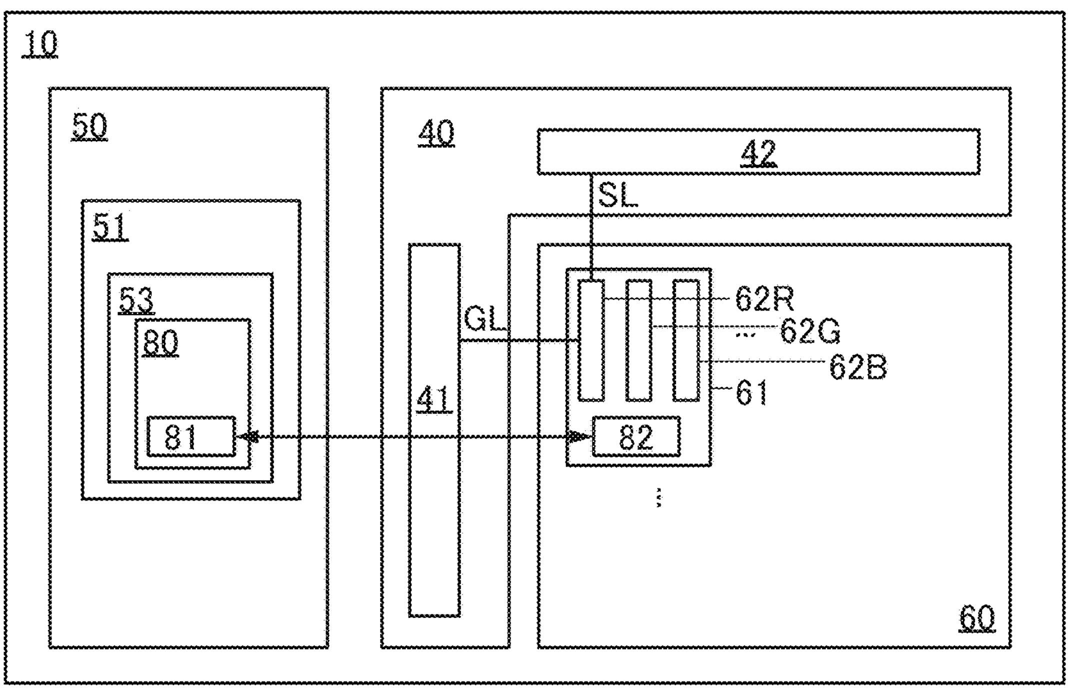
FIG. 25 is a block diagram illustrating a structure example of the display device.

FIG. 24 and FIG. 25 illustrate an example of the layout of the backup circuit 82 and the pixel circuits 62R, 62G, and 62B functioning as the subpixels in the display portion 60.

FIG. 24 illustrates a structure in which the plurality of pixels 61 are arranged in a matrix in the display portion 60. The pixels 61 each include the pixel circuits 62R, 62G, and 62B and the backup circuit 82. As described above, the backup circuit 82 and the pixel circuits 62R, 62G, and 62B can be formed with OS transistors and thus can be placed in the same pixel.

<Block Diagram of Display Device>

FIG. 25 is a block diagram illustrating components included in the display device 10. The display device includes the driver circuit 40, the functional circuit 50, and the display portion 60.

The driver circuit 40 includes a gate driver 41 and a source driver 42, for example. The gate driver 41 has a function of driving a plurality of gate lines GL for outputting signals to the pixel circuits 62R, 62G, and 62B. The source driver 42 has a function of driving a plurality of source lines SL for outputting signals to the pixel circuits 62R, 62G, and 62B. The driver circuit 40 supplies voltage for performing display with the pixel circuits 62R, 62G, and 62B to the pixel circuits 62R, 62G, and 62B through a plurality of wirings.

The functional circuit 50 includes a CPU 51. The CPU 51 includes a CPU core 53. The CPU core 53 includes the flip-flop 80 for temporarily retaining data used for arithmetic processing. The flip-flop 80 includes a plurality of scan flip-flops 81, and each of the scan flip-flops 81 is electrically connected to the backup circuit 82 provided in the display portion 60.

The display portion 60 includes the plurality of pixels 61 each including the pixel circuits 62R, 62G, and 62B and the backup circuit 82. The backup circuit 82 is not necessarily placed in the pixel 61 that is a repeating unit, as described with reference to FIG. 24. The backup circuit 82 can be placed freely in accordance with the shape of the display portion 60, the shapes of the pixel circuits 62R, 62G, and 62B, and the like.

Structure Example of Pixel Circuit

Figure 26A:
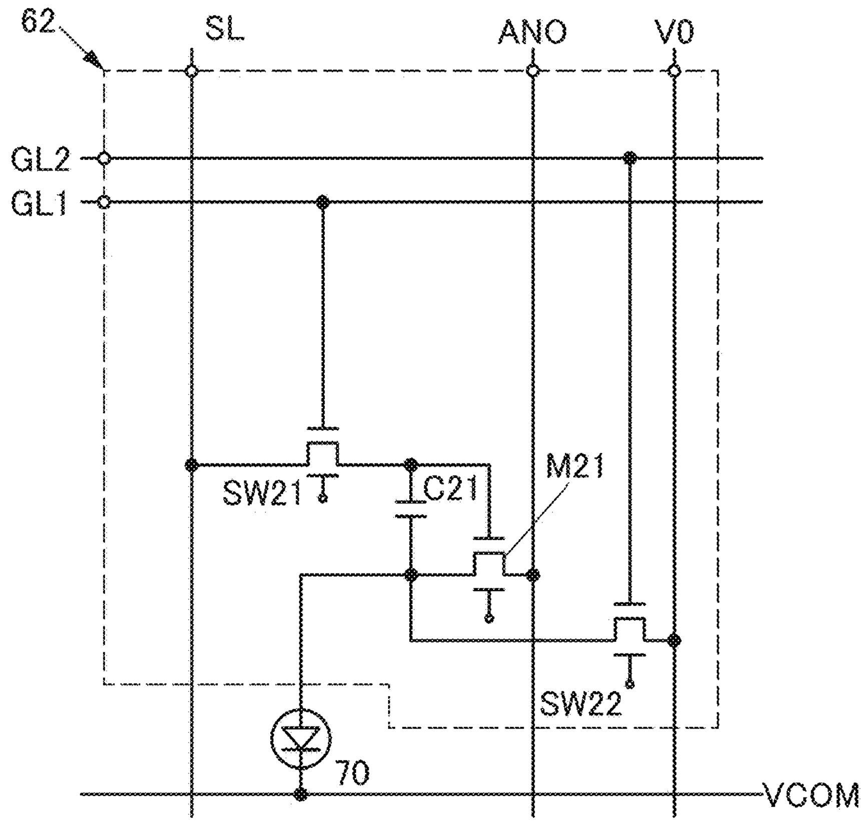
FIGS. 26A and 26B are circuit diagrams illustrating a structure example of the display device.
Figure 26B:
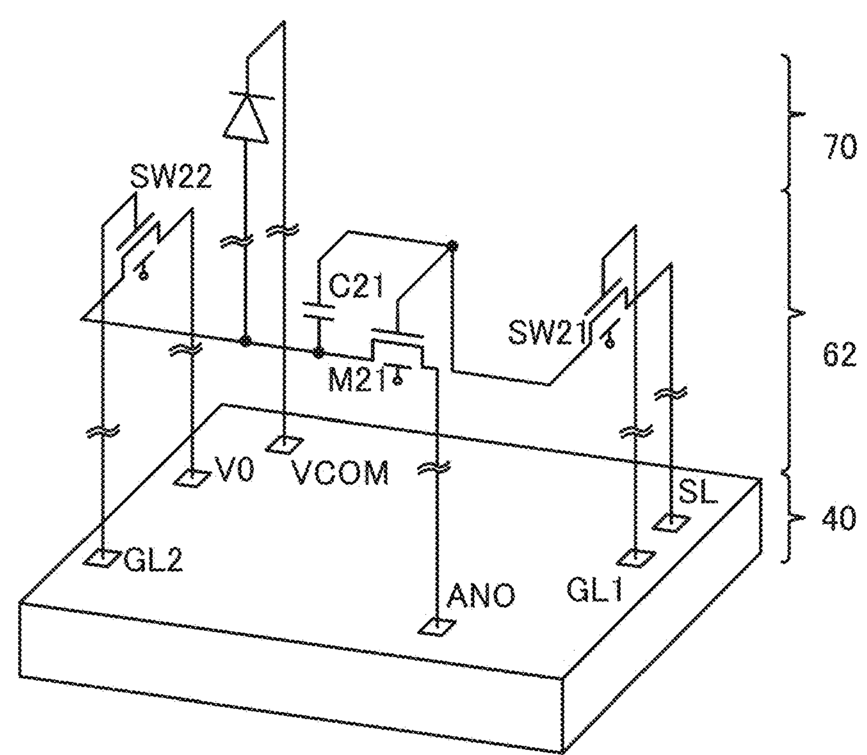

FIGS. 26A and 26B illustrate a structure example of a pixel circuit 62 that can be used as the pixel circuits 62R, 62G, and 62B and a light-emitting element 70 connected to the pixel circuit 62. FIG. 26A illustrates connection between elements, and FIG. 26B schematically illustrates the vertical position relationship of the driver circuit 40, the pixel circuit 62, and the light-emitting element 70.

In this specification and the like, the term “element” can be replaced with the term “device” in some cases. For example, a display element, a light-emitting element, and a liquid crystal element can be rephrased as a display device, a light-emitting device, and a liquid crystal device, respectively.

The pixel circuit 62, which is illustrated as an example in FIGS. 26A and 26B, includes a switch SW21, a switch SW22, a transistor M21, and a capacitor C21. The switch SW21, the switch SW22, and the transistor M21 can be formed with OS transistors. Each of the OS transistors of the switch SW21, the switch SW22, and the transistor M21 preferably includes both a gate electrode and a back gate electrode, in which case the back gate electrode and the gate electrode can be supplied with the same signals or different signals.

The transistor M21 includes the gate electrode electrically connected to the switch SW21, a first electrode electrically connected to the light-emitting element 70, and a second electrode electrically connected to a conductive film ANO. The conductive film ANO supplies a potential for supplying current to the light-emitting element 70.

The switch SW21 includes a first terminal electrically connected to the gate electrode of the transistor M21 and a second terminal electrically connected to the source line SL, and has a function of controlling its on/off state on the basis of the potential of a gate line GL1.

The switch SW22 includes a first terminal electrically connected to the wiring V0 and a second terminal electrically connected to the light-emitting element 70, and has a function of controlling its on/off state on the basis of the potential of a gate line GL2. The wiring V0 supplies a reference potential and outputs current flowing in the pixel circuit 62 to the driver circuit 40 or the functional circuit 50.

The capacitor C21 includes a conductive film electrically connected to the gate electrode of the transistor M21 and a conductive film electrically connected to the second terminal of the switch SW22.

The light-emitting element 70 includes a first electrode electrically connected to the first electrode of the transistor M21 and a second electrode electrically connected to a conductive film VCOM. The potential for supplying current to the light-emitting element 70 is supplied to the conductive film VCOM.

Accordingly, the intensity of light emitted by the light-emitting element 70 can be controlled in accordance with an image signal supplied to the gate electrode of the transistor M21. Furthermore, the amount of current flowing to the light-emitting element 70 can be increased by the reference potential of the wiring V0 that is supplied through the switch SW22. Moreover, it is possible to estimate the amount of current flowing to the light-emitting element by monitoring the amount of current flowing to the wiring V0 with an external circuit. Thus, a defect of a pixel or the like can be detected.

In the structure illustrated as an example in FIG. 26B, the wirings electrically connecting the pixel circuit 62 and the driver circuit 40 can be shortened, so that wiring resistance of the wirings can be reduced. Accordingly, data writing can be performed at high speed, and the display device 10 can be driven at high speed. Therefore, even when the number of pixels 61 included in the display device 10 is increased, a sufficiently long frame period can be ensured and the pixel density of the display device 10 can be increased. In addition, the increased pixel density of the display device 10 can increase the resolution of an image displayed by the display device 10. For example, the pixel density of the display device 10 can be 1000 ppi or higher, 5000 ppi or higher, or 7000 ppi or higher. Thus, the display device 10 can be, for example, a display device for VR or AR and can be suitably used in an electronic device with a short distance between the display portion and the user, such as an HMD.

Although the gate line GL1, the gate line GL2, the wiring ANO, the conductive film VCOM, the wiring V0, and the source line SL are supplied with signals from the driver circuit 40 below the pixel circuit 62 through the wirings in FIG. 26B, one embodiment of the present invention is not limited thereto. For example, wirings for supplying signals and voltages of the driver circuit 40 may be led to an outer region of the display portion 60 and electrically connected to the pixel circuits 62 arranged in a matrix in the layer 30. In this case, it is effective that the gate driver 41 included in the driver circuit 40 is provided in the layer 30. That is, the use of OS transistors as transistors of the gate driver 41 is effective. It is effective that part of the function of the source driver 42 included in the driver circuit 40 is provided in the layer 30. For example, it is effective that a demultiplexer distributing signals output by the source driver 42 to source lines is provided in the layer 30. The use of OS transistors as transistors of the demultiplexer is effective.

Structure Example of Display Correction System

The display system of one embodiment of the present invention may include a display correction system. The display correction system can reduce display defects based on defective pixels, such as bright spots or dark spots, by correcting a current $I_{EL}$ flowing to the light-emitting elements 70, for example.

A circuit diagram in FIG. 27A illustrates part of the pixel circuit 62 illustrated in FIG. 25. The amount of the current $I_{EL}$ flowing to the light-emitting element 70 in a defective pixel causing a bright spot or a dark spot is far larger or smaller than that in a pixel that performs normal display, for example.

The CPU 51 periodically obtains data of a monitor current $I_{MONI}$ that flows through a switch SW23. The amount of the monitor current $I_{MONI}$ is converted into digital data that can be processed in the CPU 51 and arithmetic processing is performed with the digital data in the CPU 51. A defective pixel is presumed by the arithmetic processing in the CPU 51, and correction is performed in the CPU 51 so that a display defect due to the defective pixel is less likely to be seen. For example, in the case where a pixel 61D illustrated in FIG. 27B is a defective pixel, the current $I_{EL}$ that flows to the light-emitting element 70 of an adjacent pixel 61N is corrected.

The amount of the correction can be estimated by executing arithmetic operation based on an artificial neural network such as a deep neural network (DNN), a convolutional neural network (CNN), a recurrent neural network (RNN), an autoencoder, a deep Boltzmann machine (DBM), or a deep belief network (DBN).

With the above correction, the current $I_{EL}$ flowing to the adjacent pixel 61N is corrected to be a current $I_{EL\_C}$. When a composited pixel 61G of the defective pixel and the pixel 61N performs display, a display defect due to the defective pixel, such as a bright spot or a dark spot, can be less likely to be seen, leading to normal display, for example (see FIG. 27C)

Note that during arithmetic operation by the display correction system, which is performed for correcting a current flowing to a pixel, data in the arithmetic operation can be retained as backup data in the CPU 51. Therefore, the display correction system is particularly effective in arithmetic processing on an enormous amount of calculation, such as arithmetic operation based on an artificial neural network. Note that it is also possible to reduce power consumption in addition to a reduction in display defects by making the CPU 51 function as an application processor, in combination with, for example, driving that makes a frame frequency changeable.

Modification Example of Display Device

Figure 28:
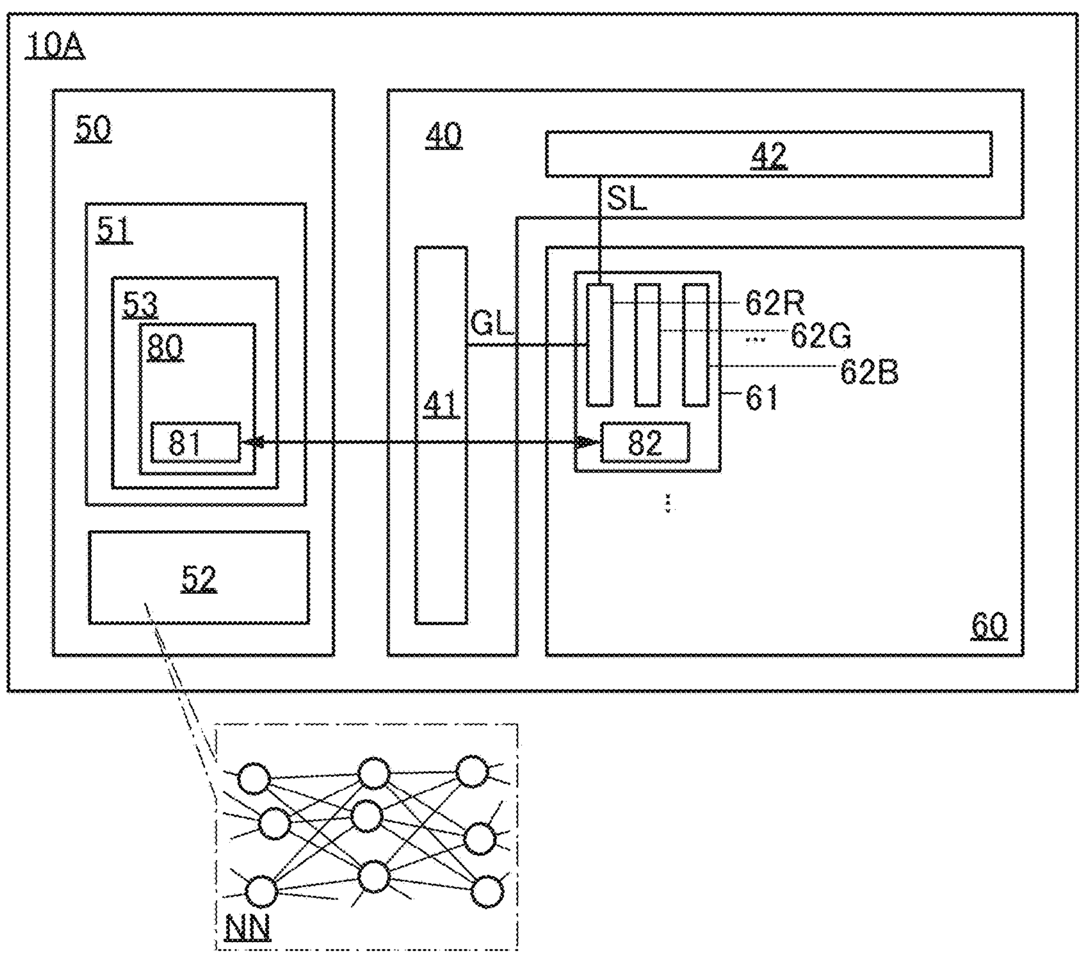
FIG. 28 is a block diagram illustrating a structure example of a display device.

FIG. 28 illustrates a modification example of the components included in the display device 10 described above.

The structure of a block diagram of a display device 10A illustrated in FIG. 28 corresponds to the structure of the display device 10 in FIG. 25 in which an accelerator 52 is added to the functional circuit 50.

In the case where arithmetic operation based on an artificial neural network is performed in the above-described display correction system, product-sum operation is repeatedly performed. The accelerator 52 functions as a dedicated arithmetic circuit to product-sum operation of an artificial neural network NN. In the arithmetic operation with the accelerator 52, the above-mentioned processing for correcting display defects or processing for correcting the outline of an image by upconversion of display data or the like can be performed, for example. During the arithmetic processing with the accelerator 52, it is possible to reduce the power consumption by power gating control on the CPU 51.

Note that this embodiment can be combined with any of the other embodiments in this specification as appropriate.

Embodiment 10

In this embodiment, a light-emitting element (light-emitting device) that can be used in the display device of one embodiment of the present invention will be described.

Structure Example of Light-Emitting Element 70

Figure 29A:
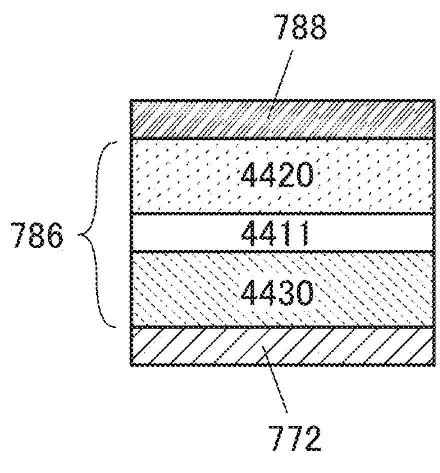
FIGS. 29A to 29D each illustrate a structure example of a light-emitting device.

An EL layer 786 included in the light-emitting element 70 can be formed of a plurality of layers such as a layer 4420, a light-emitting layer 4411, and a layer 4430, as illustrated in FIG. 29A. The layer 4420 can include, for example, a layer containing a substance with a high electron-injection property (an electron-injection layer) and a layer containing a substance with a high electron-transport property (an electron-transport layer). The light-emitting layer 4411 contains a light-emitting compound, for example. The layer 4430 can include, for example, a layer containing a substance with a high hole-injection property (a hole-injection layer) and a layer containing a substance with a high hole-transport property (a hole-transport layer).

The structure including the layer 4420, the light-emitting layer 4411, and the layer 4430, which is provided between a pair of electrodes 772 and 788, can function as a single light-emitting unit, and the structure in FIG. 29A is referred to as a single structure in this specification.

Figure 29B:
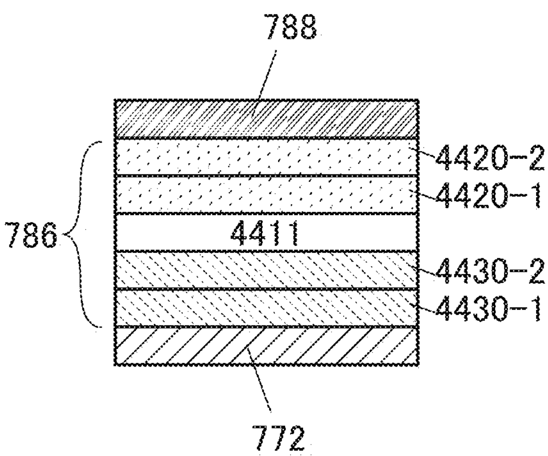

FIG. 29B is a modification example of the EL layer 786 illustrated in FIG. 29A. Specifically, the light-emitting element illustrated in FIG. 29B includes a layer 4430-1 over the conductor 772, a layer 4430-2 over the layer 4430-1, a light-emitting layer 4411 over the layer 4430-2, a layer 4420-1 over the light-emitting layer 4411, the layer 4420-2 over the layer 4420-1, and a conductor 788 over the layer 4420-2. For example, in the case where the conductor 772 serves as an anode and the conductor 788 serves as a cathode, the layer 4430-1 serves as the hole-injection layer, the layer 4430-2 serves as the hole-transport layer, the layer 4420-1 serves as the electron-transport layer, and the layer 4420-2 serves as the electron-injection layer. Alternatively, in the case where the conductor 772 serves as a cathode and the conductor 788 serves an anode, the layer 4430-1 serves as the electron-injection layer, the layer 4430-2 serves as the electron-transport layer, the layer 4420-1 serves as the hole-transport layer, and the layer 4420-2 serves as the hole-injection layer. With such a structure of the layers, carriers can be efficiently injected into the light-emitting layer 4411 so that the efficiency of carrier recombination in the light-emitting layer 4411 can be increased.

Figure 29C:
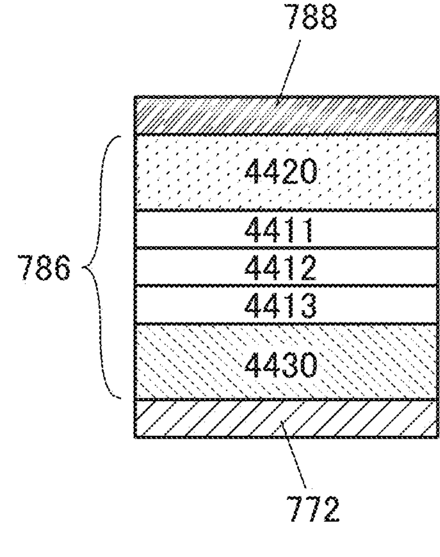

Note that the structure in which a plurality of light-emitting layers (light-emitting layers 4411, 4412, and 4413) is provided between the layer 4420 and the layer 4430 as illustrated in FIG. 29C is another variation of the single structure.

Figure 29D:
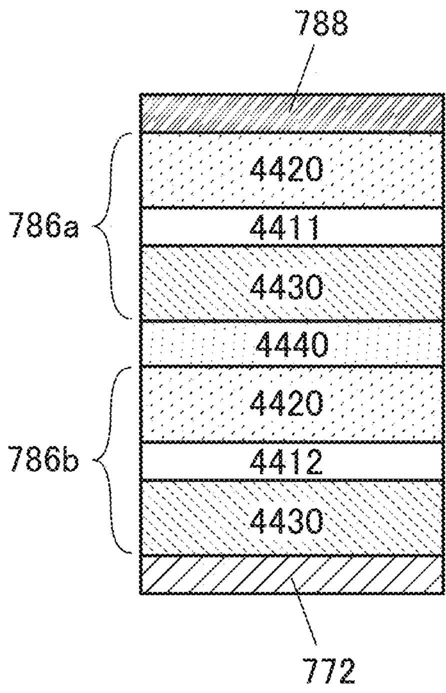

The structure in which a plurality of light-emitting units (EL layers 786*a* and 786*b*) are connected in series with an intermediate layer (charge-generation layer) 4440 therebetween as illustrated in FIG. 29D is referred to as a tandem structure in this specification. In this specification and the like, the structure illustrated in FIG. 29D is referred to as a tandem structure; however, without being limited to this, a tandem structure may be referred to as a stack structure, for example. The tandem structure enables a light-emitting element capable of high luminance light emission.

Also in the structures illustrated in FIGS. 29C and 29D, the layers 4420 and 4430 may each have a stacked-layer structure of two or more layers as illustrated in FIG. 29B.

The emission color of the light-emitting element 70 can be red, green, blue, cyan, magenta, yellow, white, or the like depending on the material of the EL layer 786. When the light-emitting element 70 has a microcavity structure, the color purity can be further increased.

In the light-emitting element that emits white light, the light-emitting layer preferably contains two or more kinds of light-emitting substances. To obtain white light emission, the two or more kinds of light-emitting substances are selected so as to emit light of complementary colors. For example, the emission colors of first and second light-emitting layers are complementary, so that the light-emitting element can emit white light as a whole. This can be applied to a light-emitting element including three or more light-emitting layers.

The light-emitting layer preferably contains two or more selected from light-emitting substances that emit light of red (R), green (G), blue (B), yellow (Y), orange (O), and the like. Alternatively, the light-emitting layer preferably contains two or more light-emitting substances that emit light containing two or more of spectral components of R, G, and B.

<Method for Forming Light-Emitting Element 70>

A method for forming the light-emitting element 70 provided over the pixel circuit 62 is described below.

FIG. 30A illustrates a schematic top view of the light-emitting element 70 of one embodiment of the present invention. The light-emitting element 70 includes a plurality of light-emitting elements 70R emitting red light, a plurality of light-emitting elements 70G emitting green light, and a plurality of light-emitting elements 70B emitting blue light. In FIG. 30A, light-emitting regions of the light-emitting elements are denoted by R, G, and B to easily differentiate the light-emitting elements. Note that the structure of the light-emitting element 70 illustrated in FIG. 30A may be referred to as an side-by-side (SBS) structure. Although the structure illustrated in FIG. 30A has three colors of red (R), green (G), and blue (B), one embodiment of the present invention is not limited thereto. For example, the structure may have four or more colors.

The light-emitting elements 70R, the light-emitting elements 70G, and the light-emitting elements 70B are arranged in a matrix. FIG. 30A shows what is called a stripe arrangement, in which the light-emitting elements with the same color are arranged in one direction. Note that the arrangement method of the light-emitting elements is not limited thereto; another method such as a delta, zigzag, or PenTile arrangement may also be used.

As the light-emitting elements 70R, 70G, and 70B, an organic EL device such as an organic light-emitting diode (OLED) or a quantum-dot light-emitting diode (QLED) is preferably used. As a light-emitting substance included in the EL element, a substance emitting fluorescence (a fluorescent material), a substance emitting phosphorescence (a phosphorescent material), an inorganic compound (e.g., a quantum dot material), a substance exhibiting thermally activated delayed fluorescence (a thermally activated delayed fluorescent (TADF) material), or the like can be used.

FIG. 30B is a schematic cross-sectional view taken along dashed-dotted line A1-A2 in FIG. 30A.

FIG. 30B shows a cross section of the light-emitting elements 70R, 70G, and 70B. The light-emitting elements 70R, 70G, and 70B are each provided over an insulating layer 251 and include a conductor 772 functioning a pixel electrode and a conductor 788 functioning a common electrode. For the insulating layer 251, one or both of an inorganic insulating material and an organic insulating material can be used. An inorganic insulating film is preferably formed using the insulating layer 251. Examples of the inorganic insulating film include an oxide insulating film and a nitride insulating film, such as a silicon oxide film, a silicon oxynitride film, a silicon nitride oxide film, a silicon nitride film, an aluminum oxide film, an aluminum oxynitride film, and a hafnium oxide film.

The light-emitting element 70R includes an EL layer 786R between the conductor 772 serving as a pixel electrode and the conductor 788 serving as a common electrode. The EL layer 786R includes a light-emitting organic compound that emits light with intensity at least in a red wavelength range. An EL layer 786G of the light-emitting element 70G includes a light-emitting organic compound that emits light with intensity at least in a green wavelength range. An EL layer 786B of the light-emitting element 70B includes a light-emitting organic compound that emits light with intensity at least in a blue wavelength range.

The EL layer 786R, the EL layer 786G, and the EL layer 786B may each include one or more of an electron-injection layer, an electron-transport layer, a hole-injection layer, and a hole-transport layer in addition to the layer containing a light-emitting organic compound (the light-emitting layer).

The conductor 772 serving as a pixel electrode is provided for each of the light-emitting elements. The conductor 788 serving as a common electrode is provided as a common layer to the light-emitting elements. A conductive film that transmits visible light is used for either the conductor 772 serving as a pixel electrode or the conductor 788 serving as a common electrode, and a reflective conductive film is used for the other. The light-transmitting conductor 772 serving as a pixel electrode and the reflective conductor 788 serving as a common electrode offer a bottom-emission display device whereas the reflective conductor 772 serving as a pixel electrode and the light-transmitting conductor 788 serving as a common electrode offer a top-emission display device. Note that when both the conductor 772 serving as a pixel electrode and the conductor 788 serving as a common electrode transmit light, a dual-emission display device can be obtained.

An insulating layer 272 is provided to cover end portions of the conductor 772 serving as a pixel electrode. End portions of the insulating layer 272 are preferably tapered. For the insulating layer 272, a material similar to the material that can be used for the insulating layer 251 can be used.

The EL layer 786R, the EL layer 786G, and the EL layer 786B each include a region in contact with a top surface of the conductor 772 serving as a pixel electrode and a region in contact with a surface of the insulating layer 272. End portions of the EL layer 786R, the EL layer 786G, and the EL layer 786B are positioned over the insulating layer 272.

As shown in FIG. 30B, there is a gap between the EL layers of two light-emitting elements with different colors. The EL layer 786R, the EL layer 786G, and the EL layer

786B are thus preferably provided so as not to be in contact with each other. This suitably prevents unintentional light emission (also referred to as crosstalk) from being caused by current flowing through two adjacent EL layers. As a result, the contrast can be increased to achieve a display device with high display quality.

The EL layer 786R, the EL layer 786G, and the EL layer 786B can be formed separately by a vacuum evaporation method or the like using a shadow mask such as a metal mask. These layers may be formed separately by a photolithography method. The use of the photolithography method achieves a display device with high resolution, which is difficult to obtain in the case of using a metal mask.

A protective layer 271 is provided over the conductor 788 serving as a common electrode so as to cover the light-emitting elements 70R, 70G, and 70B. The protective layer 271 has a function of preventing diffusion of impurities such as water into each light-emitting element from the above.

The protective layer 271 can have, for example, a single-layer structure or a stacked-layer structure at least including an inorganic insulating film. Examples of the inorganic insulating film include an oxide film or a nitride film such as a silicon oxide film, a silicon oxynitride film, a silicon nitride oxide film, a silicon nitride film, an aluminum oxide film, an aluminum oxynitride film, or a hafnium oxide film. Alternatively, a semiconductor material such as indium gallium oxide or indium gallium zinc oxide (IGZO) may be used for the protective layer 271. The protective layer 271 may be formed by an ALD method, a CVD method, or a sputtering method. Although the protective layer 271 includes an inorganic insulating film in this example, one embodiment of the present invention is not limited thereto. The protective layer 271 may have a stacked-layer structure of an inorganic insulating film and an organic insulating film, for example.

In the case where an indium gallium zinc oxide is used for the protective layer 271, the indium gallium zinc oxide can be processed by a wet etching method or a dry etching method. For example, in the case where IGZO is used as the protective layer 271, a chemical solution of oxalic acid, phosphoric acid, a mixed chemical solution (e.g., a mixed chemical solution of phosphoric acid, acetic acid, nitric acid, and water, which is also referred to as a mixed acid aluminum etchant), or the like can be used. Note that the volume ratio of phosphoric acid, acetic acid, nitric acid, and water mixed in the mixed acid aluminum etchant can be 53.3:6.7:3.3:36.7 or in the neighborhood thereof.

FIG. 30C illustrates an example different from the above.

In FIG. 30C, a light-emitting element 70W emitting white light is provided. The light-emitting element 70W includes an EL layer 786W emitting white light between the conductor 772 serving as a pixel electrode and the conductor 788 serving as a common electrode.

The EL layer 786W can have, for example, a stacked structure of two or more layers that are selected so as to emit light of complementary colors. It is also possible to use a stacked EL layer in which a charge-generation layer is provided between light-emitting layers.

FIG. 30C illustrates three light-emitting elements 70W side by side. A coloring layer 264R is provided above the left light-emitting element 70W. The coloring layer 264R functions as a band path filter that transmits red light. Similarly, a coloring layer 264G that transmits green light is provided above the middle light-emitting element 70W, and a coloring layer 264B that transmits blue light is provided above the right light-emitting element 70W. This enables the display device to display color images.

In the two adjacent light-emitting elements 70W, the EL layer 786W and the conductor 788 serving as a common electrode are isolated from the adjacent EL layer 786W and the adjacent conductor 788. This suitably prevents unintentional light emission from being caused by current flowing through the EL layers 786W in the two adjacent light-emitting elements 70W. Particularly when the EL layer 786W is a stacked EL element in which a charge-generation layer is provided between two light-emitting layers, crosstalk is more significant as the resolution increases, i.e., as the distance between adjacent pixels decreases, leading to lower contrast. Thus, the above structure can achieve a display device having both high resolution and high contrast.

The EL layer 786W and the conductor 788 serving as a common electrode are preferably isolated by a photolithography method. This can reduce the distance between light-emitting elements, achieving a display device with higher aperture ratio than that is formed using, for example, a shadow mask such as a metal mask.

Note that in the case of a bottom-emission light-emitting element, coloring layers may be provided between the conductor 772 serving as a pixel electrode and the insulating layer 251.

FIG. 30D illustrates an example different from the above. Specifically, in FIG. 30D, the insulating layers 272 are not provided between the light-emitting elements 70R, 70G, and 70B. With such a structure, a display device with a high aperture ratio can be obtained. The protective layer 271 covers side surfaces of the EL layer 786R, the EL layer 786G, and the EL layer 786B. With this structure, impurities (typically, water) can be prevented from entering the EL layer 786R, the EL layer 786G, and the EL layer 786B through their side surfaces. In the structure illustrated in FIG. 30D, the top shapes of the conductor 772, the EL layer 786R, and the conductor 788 agree or agree approximately with one another. This structure can be formed in such a manner that the conductor 772, the EL layer 786R, and the conductor 788 are formed, and collectively processed using a resist or the like. In this process, the EL layers 786R, the conductor 772, and the conductor 788 are processed using the conductor 788 as a mask, and thus this process can be called self-alignment patterning. Although the EL layer 786R is described here, the EL layer 786G and the EL layer 786B can each have a similar structure.

In FIG. 30D, the protective layer 273 is further provided over the protective layer 271. For example, the protective layer 271 can be formed with an apparatus that can deposit a film with excellent coverage (typically, an ALD apparatus), and the protective layer 273 can be formed with an apparatus that can deposit a film with coverage inferior to that of the protective layer 271 (typically, a sputtering apparatus), whereby a space 275 can be provided between the protective layer 271 and the protective layer 273. In other words, the spaces 275 are positioned between the EL layer 786R and the EL layer 786G and between the EL layer 786G and the EL layer 786B.

Note that the space 275 includes, for example, one or more selected from air, nitrogen, oxygen, carbon dioxide, and Group 18 elements (typically, helium, neon, argon, xenon, and krypton). Furthermore, a gas used during the deposition of the protective layer 273 is sometimes included in the space 275. For example, in the case where the protective layer 273 is formed using a sputtering method, one or more of the above-described Group 18 elements may be included in the space 275. In the case where a gas is included in the space 275, a gas can be identified with a gas chromatography method or the like. Alternatively, in the case where the protective layer 273 is formed using a sputtering method, a gas used in the sputtering is sometimes included in the protective layer 273. In this case, an element such as argon may be detected when the protective layer 273 is analyzed by an energy dispersive X-ray (EDX) analysis or the like.

In the case where the refractive index of the space 275 is lower than that of the protective layer 271, light emitted from the EL layer 786R, the EL layer 786G, or the EL layer 786B is reflected at the interface between the protective layer 271 and the space 275. Thus, light emitted from the EL layer 786R, the EL layer 786G, or the EL layer 786B can be prevented from entering an adjacent pixel. With the structure, mixture of light of different colors can be prevented, so that the image quality of the display device can be improved.

In the case of the structure illustrated in FIG. 30D, a region between the light-emitting element 70R and the light-emitting element 70G or a region between the light-emitting element 70G and the light-emitting element 70B (hereinafter simply referred to as a distance between the light-emitting elements) can be shortened. Specifically, the distance between the light-emitting elements can be 1 μm or shorter, preferably, 500 nm or shorter, further preferably, 200 nm or shorter, 100 nm or shorter, 90 nm or shorter, 70 nm or shorter, 50 nm or shorter, 30 nm or shorter, 20 nm or shorter, 15 nm or shorter, or 10 nm or shorter. In other words, a region is provided, in which an interval between a side surface of the EL layer 786R and a side surface of the EL layer 786G or an interval between a side surface of the EL layer 786G and a side surface of the EL layer 786B is 1 μm or shorter, preferably 0.5 μm (500 nm) or shorter, further preferably to 100 nm or shorter.

In the case where the space 275 includes air, for example, the structure illustrated in FIG. 30D can be referred to as an air isolation structure. The air isolation structure allows the light-emitting elements to be isolated from each other and color mixing of light or crosstalk between the light-emitting elements can be prevented.

Figure 31A:
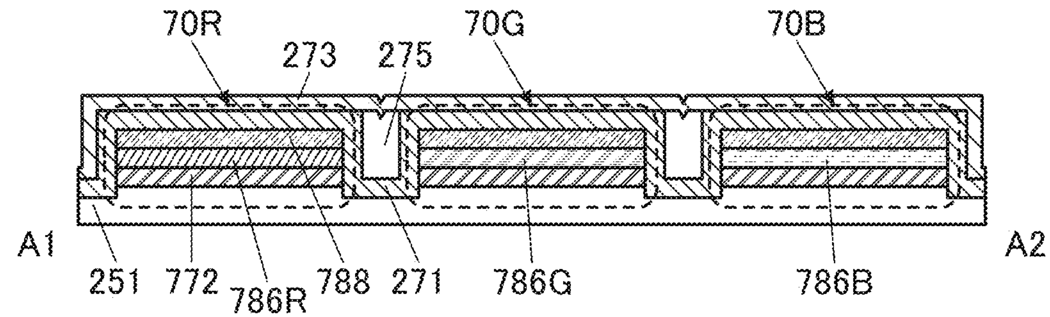
FIGS. 31A and 31B illustrate a structure example of a display device.

FIG. 31A illustrates an example different from the above example. Specifically, the structure illustrated in FIG. 31A is different from that in FIG. 30D in the structure of the insulating layer 251. The insulating layer 251 has a depressed portion in its top surface that is formed by being partially etched when the light-emitting elements 70R, 70G, and 70B are processed. In addition, the protective layer 271 is formed in the depressed portion. In other words, in the cross-sectional view, a region is provided, in which the bottom surface of the protective layer 271 is positioned below the bottom surface of the conductor 772. With the region, impurities (typically, water or the like) can be suitably prevented from entering the light-emitting elements 70R, 70G, and 70B from the bottom. It is likely that the depressed portion can be formed when impurities (also referred to as residue) that could be attached to the side surfaces of the light-emitting elements 70B, 70G, and 70B in processing of the light-emitting elements are removed by e.g., wet etching. After the residue is removed, the side surfaces of the light-emitting elements are covered with the protective layer 271, whereby a highly reliable display device can be provided.

Figure 31B:
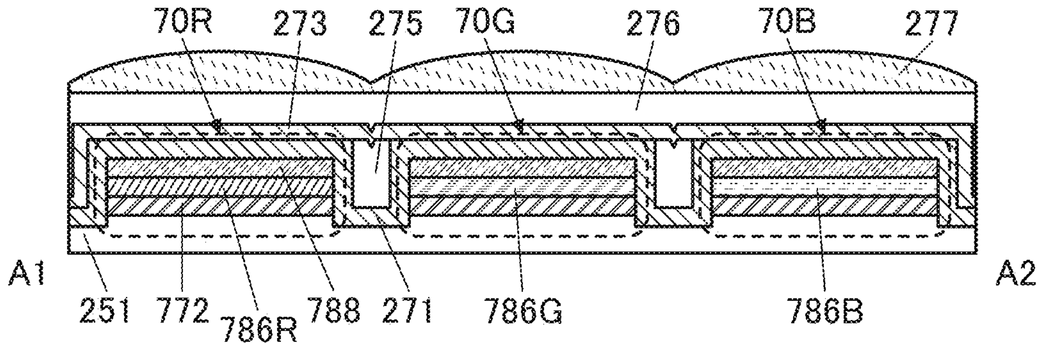

FIG. 31B illustrates an example different from the above example. Specifically, the structure illustrated in FIG. 31B includes an insulating layer 276 and a microlens array 277 in addition to the structure illustrated in FIG. 31A. The insulating layer 276 has a function as an adhesive layer. Note that when the refractive index of the insulating layer 276 is lower than that of the microlens array 277, the microlens array 277 can condense light emitted from the light-emitting elements 70R, 70G, and 70B. This can increase the light extraction efficiency of the display device. In particular, this is suitable, because a user can see bright images when the user sees the display surface from the front of the display device. As the insulating layer 276, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

The above is the description of the light-emitting element.

At least part of this embodiment can be implemented in appropriate combination with any of the other embodiments described in this specification.

Embodiment 11

In this embodiment, an example of a cross-sectional structure of the display device 10 that is one embodiment of the present invention will be described.

Figure 32:
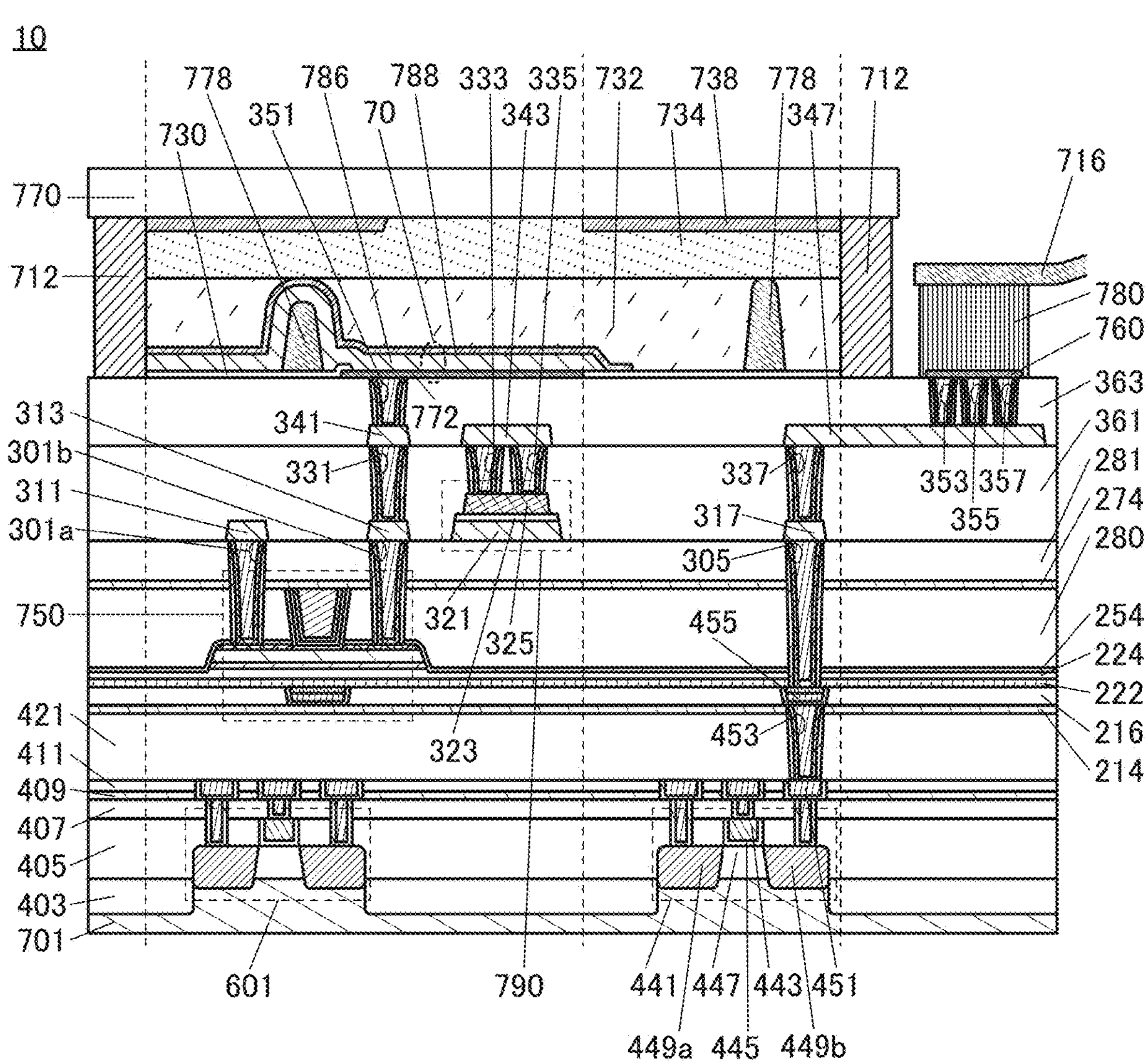
FIG. 32 is a cross-sectional view illustrating a structure example of the display device.

FIG. 32 is a cross-sectional view illustrating a structure example of the display device 10. The display device 10 includes a substrate 701 and a base 770. The substrate 701 and the base 770 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

Transistors 441 and 601 are provided on the substrate 701. The transistors 441 and 601 can be transistors provided in the layer 20 described in Embodiment 9.

The transistor 441 is formed of a conductor 443 functioning as a gate electrode, an insulator 445 functioning as a gate insulator, and part of the substrate 701 and includes a semiconductor region 447 including a channel formation region, a low-resistance region 449*a* functioning as one of a source region and a drain region, and a low-resistance region 449*b* functioning as the other of the source region and the drain region. The transistor 441 can be a p-channel transistor or an n-channel transistor.

The transistor 441 is electrically isolated from other transistors by an element isolation layer 403. FIG. 32 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 32, the semiconductor region 447 has a projecting shape. Moreover, the conductor 443 is provided to cover the side surface and the top surface of the semiconductor region 447 with the insulator 445 therebetween. Note that FIG. 32 does not illustrate the state where the conductor 443 covers the side surface of the semiconductor region 447. A material adjusting the work function can be used for the conductor 443.

A transistor having a projecting semiconductor region, like the transistor 441, can be referred to as a fin-type transistor because a projecting portion of a semiconductor substrate is used. An insulator functioning as a mask for forming a projecting portion may be provided in contact with the top surface of the projecting portion. Although FIG. 32 illustrates the structure in which the projecting portion is formed by processing part of the substrate 701, a semiconductor having a projecting shape may be formed by processing an SOI substrate.

Note that the structure of the transistor 441 illustrated in FIG. 32 is only an example; the structure of the transistor 441 is not limited thereto and can be changed as appropriate in accordance with the circuit structure, an operation method for the circuit, or the like. For example, the transistor 441 may be a planar transistor.

The transistor 601 can have a structure similar to that of the transistor 441.

An insulator 405, an insulator 407, an insulator 409, and an insulator 411 are provided over the substrate 701, in addition to the element isolation layer 403 and the transistors 441 and 601. A conductor 451 is embedded in the insulator 405, the insulator 407, the insulator 409, and the insulator 411. Here, the top surface of the conductor 451 and the top surface of the insulator 411 can be substantially level with each other.

An insulator 421 and an insulator 214 are provided over the conductor 451 and the insulator 411. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 280, an insulator 274, and an insulator 281 are provided over the conductor 455 and the insulator 216. A conductor 305 is embedded in the insulator 222, the insulator 224, the insulator 254, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760, and a flexible printed circuit (FPC) 716 is provided to be electrically connected to the anisotropic conductor 780. A variety of signals and the like are supplied to the display device 10 from the outside of the display device 10 through the FPC 716.

As illustrated in FIG. 32, the low-resistance region 449*b* having a function of the other of the source region and the drain region of the transistor 441 is electrically connected to the FPC 716 through the conductor 451, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 32 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be the transistor provided in the layer 30 described in Embodiment 9. For example, the transistor 750 can be the transistor provided in the pixel circuit 62. An OS transistor can be suitably used as the transistor 750. The OS transistor has a feature of extremely low off-state current. Consequently, the retention time for image data or the like can be increased, so that the frequency of the refresh operation can be reduced. Thus, power consumption of the display device 10 can be reduced.

The transistor 750 can be a transistor provided in the backup circuit 82. An OS transistor can be suitably used as the transistor 750. An OS transistor has a characteristic of an extremely small off-state current. Thus, data in the flip-flop can be retained even in a period in which the supply of power source voltage is stopped. Thus, a normally-off operation (the intermittent stop operation of the supply of the power source voltage) of the CPU can be performed. Thus, power consumption of the display device 10 can be reduced.

A conductor 301*a* and a conductor 301*b* are embedded in the insulator 254, the insulator 280, the insulator 274, and the insulator 281. The conductor 301*a* is electrically connected to one of a source and a drain of the transistor 750, and the conductor 301*b* is electrically connected to the other of the source and the drain of the transistor 750. Here, the top surfaces of the conductor 301*a* and the conductor 301*b* and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to have the increased evenness.

As illustrated in FIG. 32, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 functioning as a dielectric is positioned between the pair of electrodes. Although FIG. 32 illustrates an example in which the capacitor 790 is provided over the insulator 281, the capacitor 790 may be provided over an insulator different from the insulator 281.

In the example illustrated in FIG. 32, the conductor 301*a*, the conductor 301*b*, and the conductor 305 are formed in the same layer; the conductor 311, the conductor 313, the conductor 317, and the lower electrode 321 are formed in the same layer; the conductor 331, the conductor 333, the conductor 335, and the conductor 337 are formed in the same layer; the conductor 341, the conductor 343, and the conductor 347 are formed in the same layer; and the conductor 351, the conductor 353, the conductor 355, and the conductor 357 are formed in the same layer. Forming a plurality of conductors in the same layer simplifies the process of manufacturing the display device 10 and thus the manufacturing cost of the display device 10 can be reduced. Note that these conductors may be formed in different layers or may contain different types of materials.

The display device 10 illustrated in FIG. 32 includes a light-emitting element 70. The light-emitting element 70 includes the conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

The conductor 772 is electrically connected to the other of the source and the drain of the transistor 750 through the conductor 351, the conductor 341, the conductor 331, the conductor 313, and the conductor 301*b*. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

Although not illustrated in FIG. 32, an optical member (optical substrate) such as a polarizing member, a retardation member, or an anti-reflection member can be provided in the display device 10 as appropriate, for example.

On the base 770 side, a light-blocking layer 738 and an insulator 734 that is in contact with them are provided. The light-blocking layer 738 has a function of blocking light emitted from adjacent regions or a function of preventing external light from reaching the transistor 750 or the like.

In the display device 10 illustrated in FIG. 32, an insulator 730 is provided over the insulator 363. Here, the insulator 730 can cover part of the conductor 772. Here, the light-emitting element 70 is a top-emission light-emitting element, which includes the conductor 788 with a light-transmitting property. Note that the light-emitting element 70 may have a bottom-emission structure in which light is emitted to the conductor 772 side or a dual-emission structure in which light is emitted to both the conductor 772 and the conductor 788.

The light-blocking layer 738 is provided to include a region overlapping with the insulator 730. The light-blocking layer 738 is covered with the insulator 734. A space between the light-emitting element 70 and the insulator 734 is filled with a sealing layer 732.

A component 778 is provided between the insulator 730 and the EL layer 786. Moreover, the component 778 is provided between the insulator 730 and the insulator 734.

Figure 33:
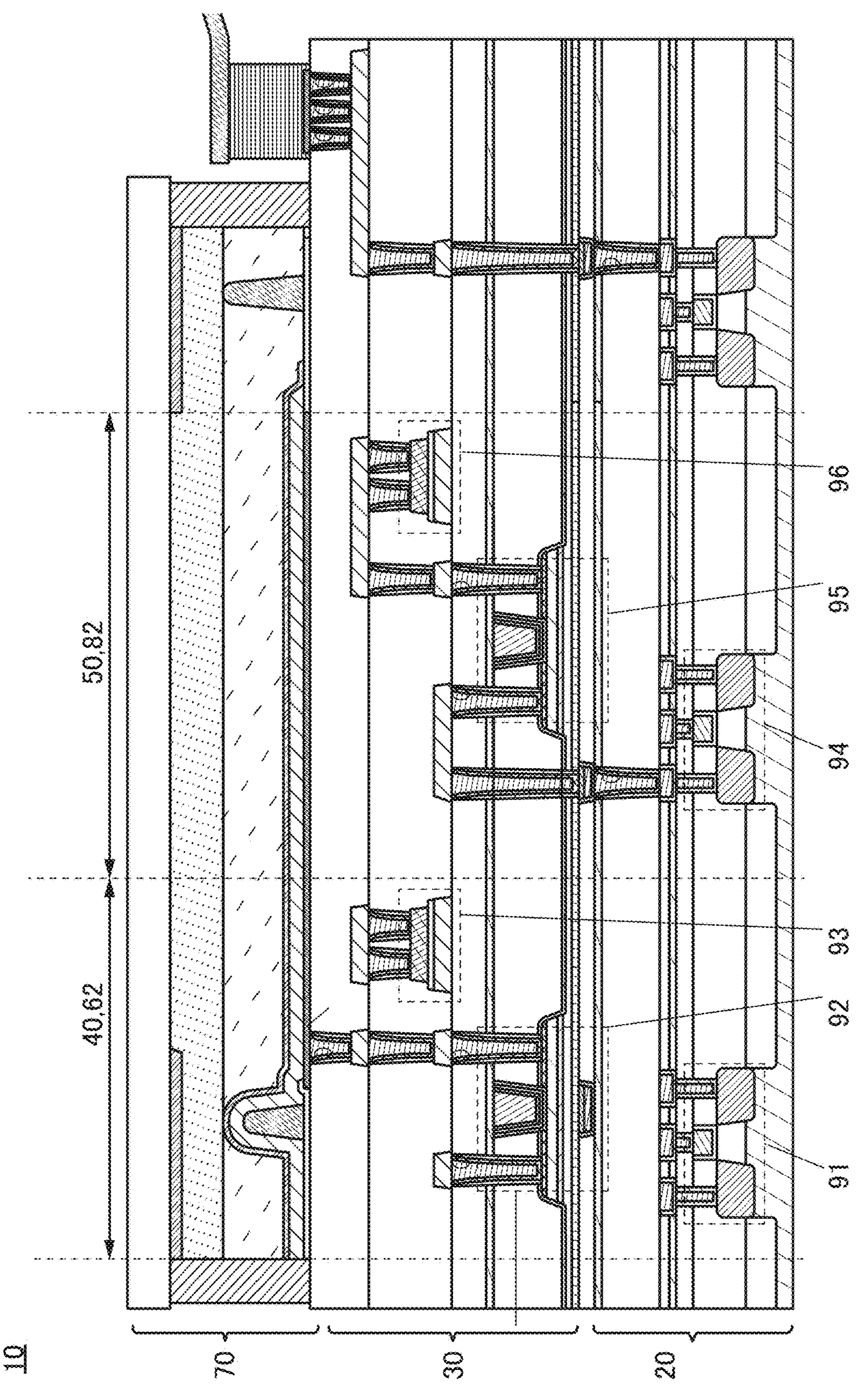
FIG. 33 is a cross-sectional view illustrating a structure example of the display device.

FIG. 33 is a cross-sectional view illustrating a Si transistor included in the driver circuit 40 included in the layer 20, an OS transistor included in the pixel circuit 62 included in the layer 30, a Si transistor included in the functional circuit 50 included in the layer 20, and an OS transistor included in the backup circuit 82 included in the layer 30. The description of the cross-sectional view illustrated in FIG. 33 is similar to that illustrated in FIG. 32.

As illustrated in FIG. 33, a Si transistor 91 in the driver circuit 40 and a Si transistor 94 in the functional circuit 50 can be provided in the layer 20. As illustrated in FIG. 33, an OS transistor 92 and a capacitor 93 in the pixel circuit 62 and an OS transistor 95 and a capacitor 96 in the backup circuit 82 can be provided in the layer 30. The light-emitting element 70 can be provided above the layer 30.

Figure 34:
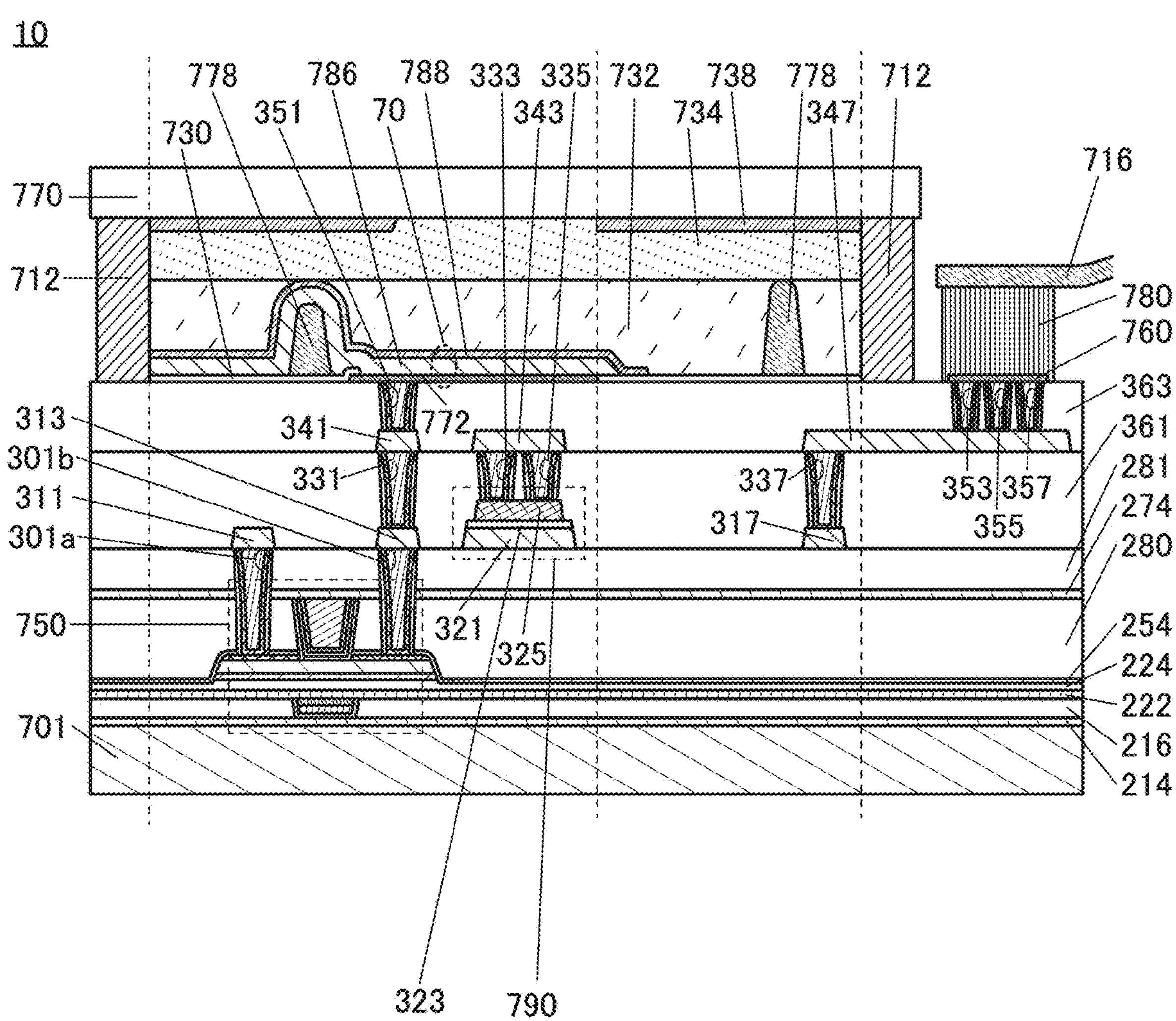
FIG. 34 is a cross-sectional view illustrating a structure example of the display device.

FIG. 34 illustrates a modification example of the display device in FIG. 32. The display device 10 in FIG. 34 is different from the display device 10 illustrated in FIG. 32 in that the transistors 441 and 601 are not provided. As illustrated in FIG. 34, the display device does not necessarily include Si transistors and may include only OS transistors. It is preferable to use an OS transistor for the pixel circuit. Furthermore, at least part of the driver circuit may be configured with an OS transistor. In addition, at least part of the functional circuit may be configured with an OS transistor. Additionally, at least part of the driver circuit may be externally provided. At least part of the functional circuit may be externally provided. In the example illustrated in FIG. 34, the transistor 750 is provided over the substrate 701. As the substrate 701, a single crystal semiconductor substrate such as a single crystal silicon substrate, or another semiconductor substrate can be used as described above. In addition, a variety of insulator substrates such as a glass substrate or a sapphire substrate may be used as the substrate 701.

Figure 35:
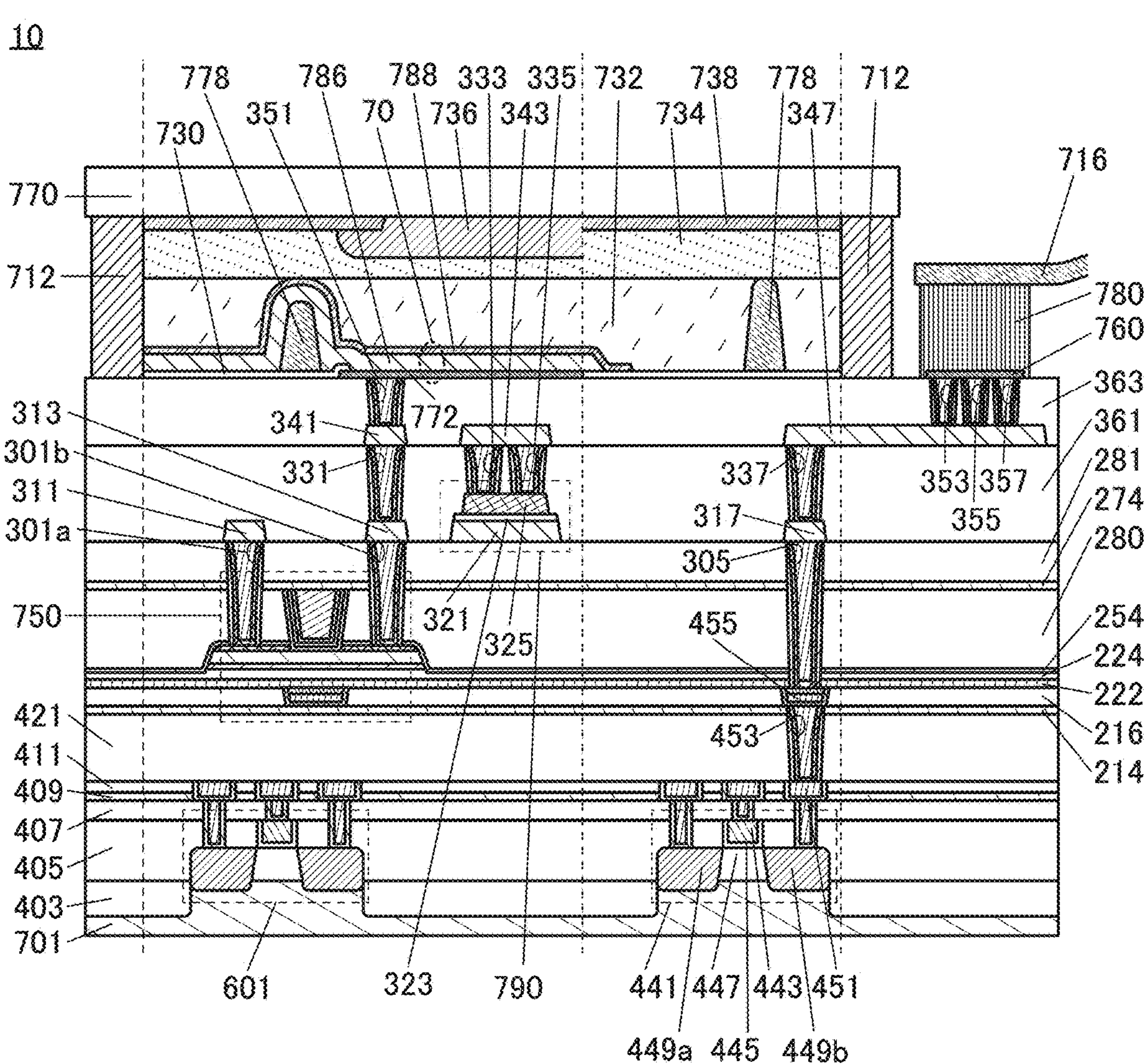
FIG. 35 is a cross-sectional view illustrating a structure example of the display device.

FIG. 35 illustrates a modification example of the display device 10 in FIG. 32. The display device 10 illustrated in FIG. 35 is different from the display device 10 illustrated in FIG. 32 in that a coloring layer 736 is provided. The coloring layer 736 is provided to include a region overlapping with the light-emitting element 70. Providing the coloring layer 736 can improve the color purity of light emitted from the light-emitting element 70. Thus, the display device 10 can display high-quality images. Furthermore, all the light-emitting elements 70, for example, in the display device 10 can be light-emitting elements that emit white light; hence, the EL layers 786 are not necessarily formed separately for each color, leading to higher resolution of the display device 10.

The light-emitting element 70 can have a micro-optical resonator (microcavity) structure. Thus, light of predetermined colors (e.g., RGB) can be extracted without a coloring layer, and the display device 10 can perform color display. The structure without a coloring layer can prevent light from being absorbed by the coloring layer. As a result, the display device 10 can display high-luminance images, and power consumption of the display device 10 can be reduced. Note that a structure without a coloring layer can be employed even when the EL layer 786 is formed into an island shape for each pixel or formed into a stripe shape for each pixel column, i.e., the EL layers 786 are formed separately for each color. Note that the luminance of the display device 10 can be, for example, 500 cd/m$^2$ or higher, preferably higher than or equal to 1000 cd/m$^2$ and lower than or equal to 10000 cd/m$^2$, more preferably higher than or equal to 2000 cd/m$^2$ and lower than or equal to 5000 cd/m$^2$.

Figure 36:
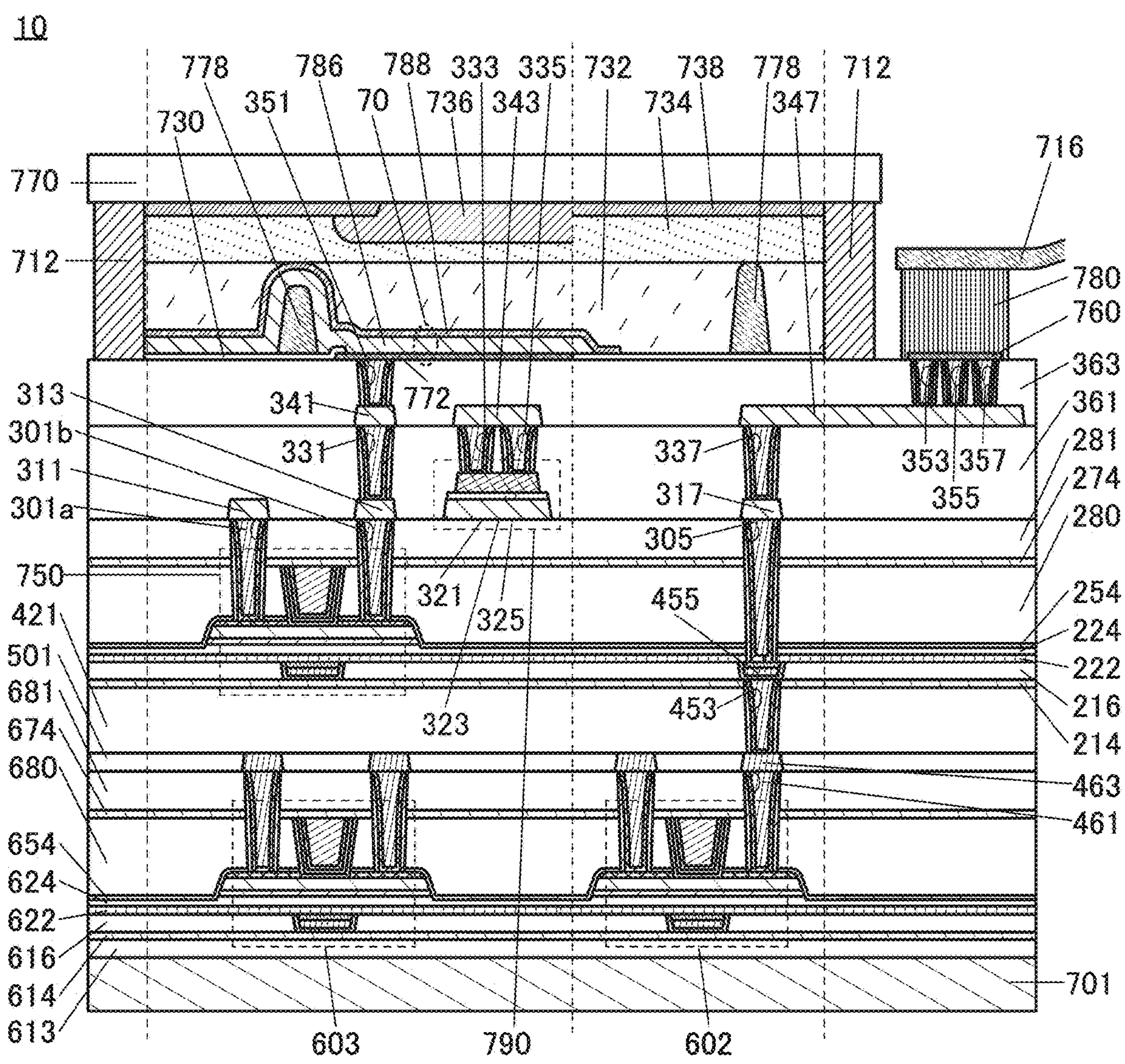
FIG. 36 is a cross-sectional view illustrating a structure example of the display device.

Although FIG. 32 and FIG. 35 each illustrate a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 36 illustrates a modification example of FIG. 35. The display device 10 illustrated in FIG. 36 is different from that in FIG. 35 mainly in that the transistors 602 and 603 that are OS transistors are included in place of the transistors 441 and 601. The transistor 750 can be an OS transistor. That is, the display device 10 illustrated in FIG. 36 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to those of the transistor 441 and the transistor 601 illustrated in FIG. 35 may be provided between the substrate 701 and the insulator 613.

That is, the transistor 602 and the transistor 603 can be the transistors provided in the layer 20 described in Embodiment 9.

The transistor 602 and the transistor 603 can have a structure similar to that of the transistor 750. Note that the transistor 602 and the transistor 603 may be OS transistors having a structure different from that of the transistor 750.

An insulator 616, an insulator 622, an insulator 624, an insulator 654, an insulator 680, an insulator 674, and an insulator 681 are provided over the insulator 614, in addition to the transistor 602 and the transistor 603. A conductor 461 is embedded in the insulator 654, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

The insulator 421 and the insulator 214 are provided over the conductor 463 and the insulator 501. A conductor 453 is embedded in the insulator 421 and the insulator 214. Here, the top surface of the conductor 453 and the top surface of the insulator 214 can be substantially level with each other.

As illustrated in FIG. 36, one of a source and a drain of the transistor 602 is electrically connected to the FPC 716 through the conductor 461, the conductor 463, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, and the insulator 501 have a function of an interlayer film and may also have a function of a planarization film that covers unevenness thereunder.

When the display device 10 has the structure illustrated in FIG. 36, all the transistors in the display device 10 can be OS transistors while the bezel and size of the display device 10 are reduced. Accordingly, the transistors provided in the layer 20 described in Embodiment 9 and the transistors provided in the layer 30 can be manufactured using the same apparatus, for example. Consequently, the manufacturing cost of the display device 10 can be reduced, making the display device 10 inexpensive.

Figure 37:
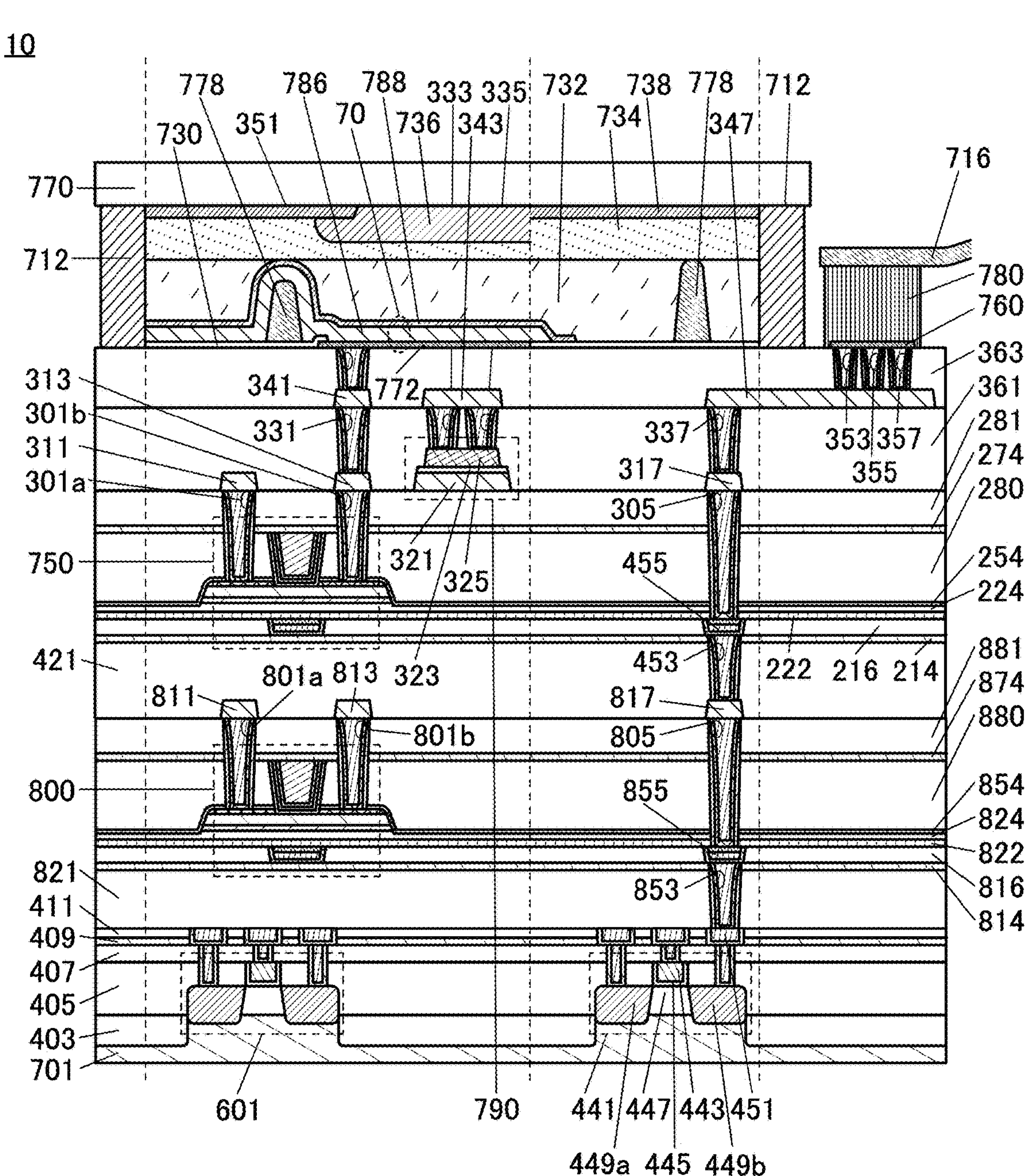
FIG. 37 is a cross-sectional view illustrating a structure example of the display device.

FIG. 37 is a cross-sectional view illustrating a structure example of the display device 10. The display device 10 in FIG. 37 is different from the display device 10 in FIG. 35 mainly in that a layer including a transistor 800 is interposed between the layer including the transistor 750 and the layer including the transistor 601 and the transistor 441.

In the structure of FIG. 37, the layer 20 described in Embodiment 9 can include the layer including the transistor 601 and the transistor 441 and the layer including the transistor 800. The transistor 750 can be the transistor provided in the layer 30 described in Embodiment 2.

An insulator 821 and an insulator 814 are provided over the conductor 451 and the insulator 411. A conductor 853 is embedded in the insulator 821 and the insulator 814. Here, the top surface of the conductor 853 and the top surface of the insulator 814 can be substantially level with each other.

An insulator 816 is provided over the conductor 853 and the insulator 814. A conductor 855 is embedded in the insulator 816. Here, the top surface of the conductor 855 and the top surface of the insulator 816 can be substantially level with each other.

An insulator 822, an insulator 824, an insulator 854, an insulator 880, an insulator 874, and an insulator 881 are provided over the conductor 855 and the insulator 816. A conductor 805 is embedded in the insulator 822, the insulator 824, the insulator 854, the insulator 880, the insulator 874, and the insulator 881. Here, the top surface of the conductor 805 and the top surface of the insulator 881 can be substantially level with each other.

The insulator 421 and the insulator 214 are provided over the conductor 817 and the insulator 881.

As illustrated in FIG. 37, the low-resistance region **449*b* functioning as the other of the source region and the drain region of the transistor 441 is electrically connected to the FPC 716 through the conductor 451, the conductor 853, the conductor 855, the conductor 805, the conductor 817, the conductor 453, the conductor 455, the conductor 305, the conductor 317, the conductor 337, the conductor 347, the conductor 353, the conductor 355, the conductor 357, the connection electrode 760, and the anisotropic conductor 780**.

The transistor 800 is provided over the insulator 814. The transistor 800 can be provided in the layer 20 described in Embodiment 9. The transistor 800 is preferably an OS transistor. For example, the transistor 800 can be a transistor used in the backup circuit 82.

A conductor **801*a* and a conductor 801*b* are embedded in the insulator 854, the insulator 880, the insulator 874, and the insulator 881. The conductor 801*a* is electrically connected to one of a source and a drain of the transistor 800, and the conductor 801*b* is electrically connected to the other of the source and the drain of the transistor 800. Here, the top surfaces of the conductor 801*a* and the conductor 801*b* and the top surface of the insulator 881** can be substantially level with each other.

The transistor 750 can be the transistor provided in the layer 30 described in Embodiment 9. For example, the transistor 750 can be a transistor provided in the pixel circuit 62. The transistor 750 is preferably an OS transistor.

The insulator 405, the insulator 407, the insulator 409, the insulator 411, the insulator 821, the insulator 814, the insulator 880, the insulator 874, the insulator 881, the insulator 421, the insulator 214, the insulator 280, the insulator 274, the insulator 281, the insulator 361, and the insulator 363 function as interlayer films and may also function as a planarization film that covers unevenness thereunder.

In the example in FIG. 37, the conductor 801*a*, the conductor 801*b*, and the conductor 805 are formed in the same layer. The conductor 811, the conductor 813, and the conductor 817 are formed in the same layer.

At least part of this embodiment can be implemented in appropriate combination with any of the other embodiments described in this specification.

Embodiment 12

In this embodiment, a transistor that can be used in the display device of one embodiment of the present invention will be described.

<Structure Example of Transistor>

FIG. 38A, FIG. 38B, and FIG. 38C are a top view and cross-sectional views of a transistor 200A that can be used in the display device of one embodiment of the present invention and the periphery of the transistor 200A. The transistor 200A can be used in the display device of one embodiment of the present invention.

FIG. 38A is a top view of the transistor 200A. FIG. 38B and FIG. 38C are cross-sectional views of the transistor 200A. Here, FIG. 38B is a cross-sectional view of a portion indicated by the dashed-dotted line A1-A2 in FIG. 38A and is a cross-sectional view in the channel length direction of the transistor 200A. FIG. 38C is a cross-sectional view of a portion indicated by the dashed-dotted line A3-A4 in FIG. 38A and is a cross-sectional view in the channel width direction of the transistor 200A. Note that some components are not illustrated in the top view of FIG. 38A for clarity of the drawing.

As illustrated in FIGS. 38A to 38C, the transistor 200A includes a metal oxide 230*a* positioned over a substrate (not illustrated); a metal oxide 230*b* positioned over the metal oxide 230*a*; a conductor 242*a* and a conductor 242*b* that are positioned apart from each other over the metal oxide 230*b*; the insulator 280 that is positioned over the conductor 242*a* and the conductor 242*b* and has an opening between the conductor 242*a* and the conductor 242*b*; a conductor 260 positioned in the opening; an insulator 250 between the conductor 260 and the metal oxide 230*b*, the conductor 242*a*, the conductor 242*b*, and the insulator 280; and a metal oxide 230*c* between the insulator 250 and the metal oxide 230*b*, the conductor 242*a*, the conductor 242*b*, and the insulator 280. Here, as illustrated in FIG. 38B and FIG. 38C, the top surface of the conductor 260 is substantially level with the top surfaces of the insulator 250, the metal oxide 230*c*, and the insulator 280. Hereinafter, the metal oxide 230*a*, the metal oxide 230*b*, and the metal oxide 230*c* may be collectively referred to as a metal oxide 230. The conductor 242*a* and the conductor 242*b* may be collectively referred to as a conductor 242.

In the transistor 200A illustrated in FIGS. 38A to 38C, side surfaces of the conductor 242*a* and the conductor 242*b* on the conductor 260 side are substantially perpendicular. Note that the transistor 200A illustrated in FIGS. 38A to 38C is not limited thereto, and the angle formed between the side surfaces and the bottom surfaces of the conductor 242*a* and the conductor 242*b* may be greater than or equal to 10° and less than or equal to 80°, preferably greater than or equal to 30° and less than or equal to 60°. The side surfaces of the conductor 242*a* and the conductor 242*b* that face each other may have a plurality of surfaces.

As illustrated in FIGS. 38A to 38C, the insulator 254 is preferably provided between the insulator 280 and the insulator 224, the metal oxide 230*a*, the metal oxide 230*b*, the conductor 242*a*, and the conductor 242*b*. Here, as illustrated in FIG. 38B and FIG. 38C, the insulator 254 is preferably in contact with the side surface of the metal oxide 230*c*, the top surface and the side surface of the conductor 242*a*, the top surface and the side surface of the conductor 242*b*, the side surfaces of the metal oxide 230*a* and the metal oxide 230*b*, and the top surface of the insulator 224.

In the transistor 200A, three layers of the metal oxide 230*a*, the metal oxide 230*b*, and the metal oxide 230*c* are stacked in and around the region where the channel is formed (hereinafter also referred to as channel formation region); however, the present invention is not limited thereto. For example, a two-layer structure of the metal oxide 230*b* and the metal oxide 230*c* or a stacked-layer structure of four or more layers may be employed. Although the conductor 260 has a stacked-layer structure of two layers in the transistor 200A, the present invention is not limited thereto. For example, the conductor 260 may have a single-layer structure or a stacked-layer structure of three or more layers. Alternatively, each of the metal oxide 230*a*, the metal oxide 230*b*, and the metal oxide 230*c* may have a stacked-layer structure of two or more layers.

For example, when the metal oxide 230*c* has a stacked-layer structure including a first metal oxide and a second metal oxide over the first metal oxide, the first metal oxide preferably has a composition similar to that of the metal oxide 230*b* and the second metal oxide preferably has a composition similar to that of the metal oxide 230*a*.

Here, the conductor 260 functions as a gate electrode of the transistor, and the conductor 242*a* and the conductor 242*b* each function as a source electrode or a drain electrode. As described above, the conductor 260 is formed to be embedded in the opening of the insulator 280 and the region between the conductor 242*a* and the conductor 242*b*. Here, the positions of the conductor 260, the conductor 242*a*, and the conductor 242*b* are selected in a self-aligned manner with respect to the opening of the insulator 280. In other words, in the transistor 200A, the gate electrode can be positioned between the source electrode and the drain electrode in a self-aligned manner. Thus, the conductor 260 can be formed without an alignment margin, resulting in a reduction in the area occupied by the transistor 200A. Accordingly, the display device can have higher definition. In addition, the display device can have a narrow bezel.

As illustrated in FIGS. 38A to 38C, the conductor 260 preferably includes a conductor 260*a* provided inside the insulator 250 and a conductor 260*b* provided to be embedded inside the conductor 260*a*.

The transistor 200A preferably includes the insulator 214 positioned over the substrate (not illustrated); the insulator 216 positioned over the insulator 214; a conductor 205 positioned to be embedded in the insulator 216; the insulator 222 positioned over the insulator 216 and the conductor 205; and the insulator 224 positioned over the insulator 222. The metal oxide 230*a* is preferably provided over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the metal oxide 230*c*, and the insulator 280.

The insulator 222, the insulator 254, and the insulator 274 preferably have a function of inhibiting diffusion of hydrogen (e.g., at least one of hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of oxygen (e.g., at least one of oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of excess oxygen or impurities such as hydrogen included in the insulator 280 and the insulator 281 into the insulator 224, the metal oxide 230*a*, the metal oxide 230*b*, and the insulator 250.

A conductor 240 (a conductor 240*a* and a conductor 240*b*) that is electrically connected to the transistor 200A and functions as a plug is preferably provided. An insulator 241 (an insulator 241*a* and an insulator 241*b*) is provided in contact with the side surface of the conductor 240 functioning as a plug. In other words, the insulator 241 is provided in contact with the inner wall of an opening in the insulator 254, the insulator 280, the insulator 274, and the insulator 281. A structure may be employed in which a first conductor of the conductor 240 is provided in contact with the side surface of the insulator 241 and a second conductor of the conductor 240 is provided on the inner side of the first conductor. Here, the top surface of the conductor 240 and the top surface of the insulator 281 can be substantially level with each other. Although the transistor 200A has a structure in which the first conductor of the conductor 240 and the second conductor of the conductor 240 are stacked, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230*a*, the metal oxide 230*b*, and the metal oxide 230*c*). For example, it is preferable to use a metal oxide having a band gap of 2 eV or more, preferably 2.5 eV or more as the metal oxide to be the channel formation region of the metal oxide 230.

The metal oxide preferably contains at least indium (In) or zinc (Zn). In particular, the metal oxide preferably contains indium (In) and zinc (Zn). In addition to them, an element M is preferably contained. As the element M, one or more of aluminum (Al), gallium (Ga), yttrium (Y), tin (Sn), boron (B), titanium (Tl), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and cobalt (Co) can be used. In particular, the element M is preferably one or more of aluminum (Al), gallium (Ga), yttrium (Y), and tin (Sn). Furthermore, the element M preferably contains one or both of Ga and Sn.

As illustrated in FIG. 38B, the metal oxide 230*b* in a region that does not overlap with the conductor 242 sometimes has smaller thickness than the metal oxide 230*b* in a region that overlaps with the conductor 242. The thin region is formed when part of the top surface of the metal oxide 230*b* is removed at the time of forming the conductor 242*a* and the conductor 242*b*. When a conductive film to be the conductor 242 is formed, a low-resistance region is sometimes formed on the top surface of the metal oxide 230*b* in the vicinity of the interface with the conductive film. Removing the low-resistance region positioned between the conductor 242*a* and the conductor 242*b* on the top surface of the metal oxide 230*b* in this manner can prevent formation of the channel in the region.

According to one embodiment of the present invention, a display device that includes small-size transistors and thus has high resolution can be provided. A display device that includes a transistor with a high on-state current and thus has high luminance can be provided. A display device that includes a transistor operating at high speed and thus operates at high speed can be provided. A display device that includes a transistor having stable electrical characteristics and thus is highly reliable can be provided. A display device that includes a transistor with a low off-state current and thus has low power consumption can be provided.

The structure of the transistor 200A that can be used in the display device of one embodiment of the present invention is described in detail.

The conductor 205 is placed so as to include a region overlapping with the metal oxide 230 and the conductor 260. Furthermore, the conductor 205 is preferably provided to be embedded in the insulator 216.

The conductor 205 includes the conductors 205*a*, 205*b*, and 205*c*. The conductor 205*a* is provided in contact with the bottom surface and the side wall of the opening provided in the insulator 216. The conductor 205*b* is provided so as to be embedded in a recessed portion formed in the conductor 205*a*. Here, the level of the top surface of the conductor 205*b* is lower than the levels of the top surfaces of the conductor 205*a* and the insulator 216. The conductor 205*c* is provided in contact with the top surface of the conductor 205*b* and the side surface of the conductor 205*a*. Here, the top surface of the conductor 205*c* is substantially level with the top surfaces of the conductor 205*a* and the insulator 216. That is, the conductor 205*b* is surrounded by the conductor 205*a* and the conductor 205*c*.

The conductors 205*a* and 205*c* are preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Alternatively, the conductors 205*a* and 205*c* are preferably formed using a conductive material having a function of inhibiting diffusion of oxygen (e.g., at least one of oxygen atoms and oxygen molecules).

When the conductors 205*a* and 205*c* are formed using a conductive material having a function of inhibiting diffusion of hydrogen, impurities such as hydrogen contained in the conductor 205*b* can be prevented from diffusing into the metal oxide 230 through the insulator 224 and the like. When the conductors 205*a* and 205*c* are formed using a conductive material having a function of inhibiting diffusion of oxygen, the conductivity of the conductor 205*b* can be inhibited from being lowered because of oxidation. As the conductive material having a function of inhibiting diffusion of oxygen, for example, titanium, titanium nitride, tantalum, tantalum nitride, ruthenium, or ruthenium oxide is preferably used. Thus, the conductor 205*a* may be a single layer or a stacked layer of the above conductive materials. For example, titanium nitride may be used for the conductor 205*a*.

A conductive material containing tungsten, copper, or aluminum as its main component is preferably used for the conductor 205*b*. For example, tungsten may be used for the conductor 205*b*.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, Vth of the transistor 200A can be controlled. In particular, by applying a negative potential to the conductor 205, Vth of the transistor 200A can be higher than 0 V and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably provided to be larger than the channel formation region in the metal oxide 230. In particular, it is preferable that the conductor 205 extend beyond an end portion of the metal oxide 230 that intersects with the channel width direction, as illustrated in FIG. 38C. In other words, the conductor 205 and the conductor 260 preferably overlap with each other with the insulator positioned therebetween, in a region outside the side surface of the metal oxide 230 in the channel width direction.

With the above structure, the channel formation region of the metal oxide 230 can be electrically surrounded by electric fields of the conductor 260 functioning as the first gate electrode and electric fields of the conductor 205 functioning as the second gate electrode.

Furthermore, as illustrated in FIG. 38C, the conductor 205 extends to function as a wiring as well. However, without limitation to this structure, a structure in which a conductor functioning as a wiring is provided below the conductor 205 may be employed.

The insulator 214 preferably functions as a barrier insulating film that inhibits the entry of impurities such as water or hydrogen to the transistor 200A from the substrate side. Accordingly, it is preferable to use, for the insulator 214, an insulating material having a function of inhibiting diffusion of impurities such as a hydrogen atom, a hydrogen molecule, a water molecule, a nitrogen atom, a nitrogen molecule, a nitrogen oxide molecule (e.g., N20, NO, and $NO_2$), and a copper atom (an insulating material through which the above impurities are less likely to pass). Alternatively, it is preferable to use an insulating material having a function of inhibiting diffusion of oxygen (e.g., at least one of an oxygen atom or an oxygen molecule) (an insulating material through which the oxygen is less likely to pass).

For example, aluminum oxide or silicon nitride is preferably used for the insulator 214. Accordingly, it is possible to inhibit diffusion of impurities such as water or hydrogen to the transistor 200A side from the substrate side through the insulator 214. Alternatively, it is possible to inhibit diffusion of oxygen contained in the insulator 224 and the like to the substrate side through the insulator 214.

The permittivity of each of the insulator 216, the insulator 280, and the insulator 281 each functioning as an interlayer film is preferably lower than that of the insulator 214. When a material with a low permittivity is used for an interlayer film, the parasitic capacitance generated between wirings can be reduced. For the insulator 216, the insulator 280, and the insulator 281, for example, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used as appropriate.

The insulator 222 and the insulator 224 function as a gate insulator.

Here, the insulator 224 in contact with the metal oxide 230 preferably release oxygen by heating. In this specification, oxygen that is released by heating is referred to as excess oxygen in some cases. For example, silicon oxide, silicon oxynitride, or the like can be used as appropriate for the insulator 224. When an insulator containing oxygen is provided in contact with the metal oxide 230, oxygen vacancies in the metal oxide 230 can be reduced, leading to improved reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0\times10^{18}$ atoms/$cm^3$, preferably greater than or equal to $1.0\times10^{19}$ atoms/$cm^3$, further preferably greater than or equal to $2.0\times10^{19}$ atoms/$cm^3$ or greater than or equal to $3.0\times10^{20}$ atoms/$cm^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 38C, the insulator 224 is sometimes thinner in a region overlapping with neither the insulator 254 nor the metal oxide 230*b* than in the other regions. In the insulator 224, the region overlapping with neither the insulator 254 nor the metal oxide 230*b* preferably has a thickness with which the above oxygen can be adequately diffused.

Like the insulator 214 and the like, the insulator 222 preferably functions as a barrier insulating film that inhibits the entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, the entry of impurities such as water or hydrogen into the transistor 200A from outside can be inhibited.

Furthermore, it is preferable that the insulator 222 have a function of inhibiting diffusion of oxygen (e.g., at least one of an oxygen atom and an oxygen molecule) (it is preferable that the above oxygen be less likely to pass through the insulator 222). For example, the insulator 222 preferably has a lower oxygen permeability than the insulator 224. The insulator 222 preferably has a function of inhibiting diffusion of oxygen or impurities, in which case oxygen contained in the metal oxide 230 can be preventing from diffusing to the substrate side. Moreover, the conductor 205 can be inhibited from reacting with oxygen contained in the insulator 224 or the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. In the case where the insulator 222 is formed using such a material, the insulator 222 functions as a layer inhibiting release of oxygen from the metal oxide 230 and the entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

The insulator 222 may be a single layer or a stacked layer using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). With further miniaturization and higher integration of a transistor, a problem such as generation of leakage current may arise because of a thinned gate insulator. When a high-k material is used for the insulator functioning as a gate insulator, a gate potential at the time of operation of the transistor can be reduced while the physical thickness is maintained.

Note that the insulator 222 and the insulator 224 may each have a stacked-layer structure of two or more layers. In that cases, without limitation to a stacked-layer structure formed of the same material, a stacked-layer structure formed of different materials may be employed. For example, an insulator similar to the insulator 224 may be provided below the insulator 222.

The metal oxide 230 includes the metal oxide 230*a*, the metal oxide 230*b* over the metal oxide 230*a*, and the metal oxide 230*c* over the metal oxide 230*b*. When the metal oxide 230 includes the metal oxide 230*a* under the metal oxide 230*b*, it is possible to inhibit diffusion of impurities into the metal oxide 230*b* from the components formed below the metal oxide 230*a*. Moreover, when the metal oxide 230 includes the metal oxide 230*c* over the metal oxide 230*b*, it is possible to inhibit diffusion of impurities into the metal oxide 230*b* from the components formed above the metal oxide 230*c*.

Note that the metal oxide 230 preferably has a stacked-layer structure of a plurality of oxide layers that differ in the atomic ratio of metal atoms. For example, in the case where the metal oxide 230 contains at least indium (In) and an element M, the proportion of the number of atoms of the element M contained in the metal oxide 230*a* to the number of atoms of all elements that constitute the metal oxide 230*a* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*a* is preferably higher than the atomic ratio of the element M to In in the metal oxide 230*b*. Here, a metal oxide that can be used as the metal oxide 230*a* or the metal oxide 230*b* can be used as the metal oxide 230*c*.

The energy of the conduction band minimum of each of the metal oxide 230*a* and the metal oxide 230*c* is preferably higher than that of the metal oxide 230*b*. In other words, the electron affinity of each of the metal oxide 230*a* and the metal oxide 230*c* is preferably smaller than that of the metal oxide 230*b*. In that case, a metal oxide that can be used as the metal oxide 230*a* is preferably used as the metal oxide 230*c*. Specifically, the proportion of the number of atoms of the element M contained in the metal oxide 230*c* to the number of atoms of all elements that constitute the metal oxide 230*c* is preferably higher than the proportion of the number of atoms of the element M contained in the metal oxide 230*b* to the number of atoms of all elements that constitute the metal oxide 230*b*. In addition, the atomic ratio of the element M to In in the metal oxide 230*c* is preferably higher than the atomic ratio of the element M to In in the metal oxide 230*b*.

Here, the energy level of the conduction band minimum gently changes at junction portions between the metal oxide 230*a*, the metal oxide 230*b*, and the metal oxide 230*c*. In other words, the energy level of the conduction band minimum at junction portions between the metal oxide 230*a*, the metal oxide 230*b*, and the metal oxide 230*c* is continuously varied or are continuously connected. This can be achieved by decreasing the density of defect states in a mixed layer formed at the interface between the metal oxide 230*a* and the metal oxide 230*b* and the interface between the metal oxide 230*b* and the metal oxide 230*c*.

Specifically, when the metal oxide 230*a* and the metal oxide 230*b* or the metal oxide 230*b* and the metal oxide 230*c* contain the same element (as a main component) in addition to oxygen, a mixed layer with a low density of defect states can be formed. For example, in the case where the metal oxide 230*b* is an In—Ga—Zn oxide, an In—Ga—Zn oxide, a Ga—Zn oxide, gallium oxide, or the like may be used as the metal oxide 230*a* and the metal oxide 230*c*. The metal oxide 230*c* may have a stacked-layer structure. For example, a stacked-layer structure of an In—Ga—Zn oxide and a Ga—Zn oxide over the In—Ga—Zn oxide or a stacked-layer structure of an In—Ga—Zn oxide and gallium oxide over the In—Ga—Zn oxide can be employed. In other words, the metal oxide 230*c* may have a stacked-layer structure of an In—Ga—Zn oxide and an oxide that does not contain In.

Specifically, as the metal oxide 230*a*, a metal oxide with In:Ga:Zn=1:3:4 [atomic ratio] or 1:1:0.5 [atomic ratio] can be used. As the metal oxide 230*b*, a metal oxide with In:Ga:Zn=4:2:3 [atomic ratio] or 3:1:2 [atomic ratio] can be used. As the metal oxide 230*c*, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] can be used. Specific examples of a stacked-layer structure of the metal oxide 230*c* include a stacked-layer structure of a layer with In:Ga:Zn=4:2:3 [atomic ratio] and a layer with Ga:Zn=2:1 [atomic ratio], a stacked-layer structure of a layer with In:Ga:Zn=4:2:3 [atomic ratio] and a layer with Ga:Zn=2:5 [atomic ratio], and a stacked-layer structure of a layer with In:Ga:Zn=4:2:3 [atomic ratio] and gallium oxide.

At this time, the metal oxide 230*b* serves as a main carrier path. When the metal oxide 230*a* and the metal oxide 230*c* have the above structure, the density of defect states at the interface between the metal oxide 230*a* and the metal oxide 230*b* and the interface between the metal oxide 230*b* and the metal oxide 230*c* can be made low. This reduces the influence of interface scattering on carrier conduction, and the transistor 200A can have a high on-state current and high frequency characteristics. Note that in the case where the metal oxide 230*c* has a stacked-layer structure, not only the effect of reducing the density of defect states at the interface between the metal oxide 230*b* and the metal oxide 230*c*, but also the effect of inhibiting diffusion of the constituent element of the metal oxide 230*c* to the insulator 250 side can be expected. Specifically, the metal oxide 230*c* has a stacked-layer structure in which the upper layer is an oxide that does not contain In, whereby the diffusion of In to the insulator 250 side can be inhibited. Since the insulator 250 functions as a gate insulator, the transistor has defects in characteristics when In diffuses. Thus, the metal oxide 230*c* having a stacked-layer structure allows a highly reliable display device to be provided.

The conductor 242 (the conductor 242*a* and the conductor 242*b*) functioning as the source electrode and the drain electrode is provided over the metal oxide 230*b*. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even when absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such a case, the carrier density of the region in the metal oxide 230 in the vicinity of the conductor 242 increases, and the region becomes a low-resistance region.

Here, the region between the conductor 242*a* and the conductor 242*b* is formed to overlap with the opening of the insulator 280. Accordingly, the conductor 260 can be formed in a self-aligned manner between the conductor 242*a* and the conductor 242*b*.

The insulator 250 functions as a gate insulator. The insulator 250 is preferably positioned in contact with the top surface of the metal oxide 230*c*. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride, which are thermally stable, are preferable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Accordingly, oxidation of the conductor 260 due to oxygen in the insulator 250 can be inhibited.

The metal oxide functions as part of the gate insulator in some cases. Therefore, when silicon oxide, silicon oxynitride, or the like is used for the insulator 250, a metal oxide that is a high-k material with a high relative permittivity is preferably used as the metal oxide. When the gate insulator has a stacked-layer structure of the insulator 250 and the metal oxide, the stacked-layer structure can be thermally stable and have a high relative permittivity. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is preferable to use an insulator containing an oxide of one or both of aluminum and hafnium, such as aluminum oxide, hafnium oxide, or an oxide containing aluminum and hafnium (hafnium aluminate), in particular.

Although the conductor 260 has a two-layer structure in FIGS. 38A to 38C, the conductor 260 may have a single-layer structure or a stacked-layer structure of three or more layers.

The conductor 260*a* is preferably formed using the aforementioned conductor having a function of inhibiting diffusion of impurities such as a hydrogen atom, a hydrogen molecule, a water molecule, a nitrogen atom, a nitrogen molecule, a nitrogen oxide molecule (e.g., N20, NO, and $NO_2$), and a copper atom. Alternatively, it is preferable to use a conductive material having a function of inhibiting diffusion of oxygen (e.g., at least one of an oxygen atom and an oxygen molecule).

When the conductor 260*a* has a function of inhibiting diffusion of oxygen, the conductivity of the conductor 260*b* can be inhibited from being lowered because of oxidation due to oxygen contained in the insulator 250. As a conductive material having a function of inhibiting oxygen diffusion, for example, tantalum, tantalum nitride, ruthenium, ruthenium oxide, or the like is preferably used.

Moreover, a conductive material containing tungsten, copper, or aluminum as its main component is preferably used for the conductor 260*b*. The conductor 260 also functions as a wiring and thus is preferably formed using a conductor having high conductivity. For example, a conductive material containing tungsten, copper, or aluminum as its main component can be used. The conductor 260*b* may have a stacked-layer structure, for example, a stacked-layer structure of titanium or titanium nitride and the above conductive material.

As illustrated in FIG. 38A and FIG. 38C, the side surface of the metal oxide 230 is covered with the conductor 260 in a region where the metal oxide 230*b* does not overlap with the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 200A can be increased and the frequency characteristics can be improved.

The insulator 254, like the insulator 214 and the like, preferably functions as a barrier insulating film that inhibits the entry of impurities such as water or hydrogen into the transistor 200A from the insulator 280 side. The insulator 254 preferably has lower hydrogen permeability than the insulator 224, for example. Furthermore, as illustrated in FIG. 38B and FIG. 38C, the insulator 254 is preferably in contact with the side surface of the metal oxide 230*c*, the top and side surfaces of the conductor 242*a*, the top and side surfaces of the conductor 242*b*, side surfaces of the metal oxide 230*a* and the metal oxide 230*b*, and the top surface of the insulator 224. Such a structure can inhibit the entry of hydrogen contained in the insulator 280 into the metal oxide 230 through the top surfaces or side surfaces of the conductor 242*a*, the conductor 242*b*, the metal oxide 230*a*, the metal oxide 230*b*, and the insulator 224.

Furthermore, it is preferable that the insulator 254 have a function of inhibiting diffusion of oxygen (e.g., at least one of an oxygen atom and an oxygen molecule) (it is preferable that the above oxygen be less likely to pass through the insulator 254). For example, the insulator 254 preferably has lower oxygen permeability than the insulator 280 or the insulator 224.

The insulator 254 is preferably formed by a sputtering method. When the insulator 254 is formed by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is preferably formed, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224 and the metal oxide 230 are covered with the insulator 254 having a barrier property against hydrogen, whereby the insulator 280 is isolated from the insulator 224 and the metal oxide 230 by the insulator 254. This can inhibit the entry of impurities such as hydrogen from the outside of the transistor 200A, resulting in favorable electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride are preferable because they are thermally stable. In particular, materials such as silicon oxide, silicon oxynitride, and porous silicon oxide are preferably used, in which case a region containing oxygen released by heating can be easily formed.

The concentration of impurities such as water or hydrogen in the insulator 280 is preferably reduced. In addition, the top surface of the insulator 280 may be planarized.

Like the insulator 214 or the like, the insulator 274 preferably functions as a barrier insulating film that inhibits the entry of impurities such as water or hydrogen into the insulator 280 from the above. As the insulator 274, for example, the insulator that can be used as the insulator 214, the insulator 254, and the like can be used.

The insulator 281 functioning as an interlayer film is preferably provided over the insulator 274. As in the insulator 224 or the like, the concentration of impurities such as water or hydrogen in the insulator 281 is preferably reduced.

The conductor 240*a* and the conductor 240*b* are positioned in openings formed in the insulator 281, the insulator 274, the insulator 280, and the insulator 254. The conductor 240*a* and the conductor 240*b* are positioned to face each other with the conductor 260 therebetween. Note that the top surfaces of the conductor 240*a* and the conductor 240*b* may be level with the top surface of the insulator 281.

The insulator 241*a* is provided in contact with the inner walls of the openings in the insulator 281, the insulator 274, the insulator 280, and the insulator 254, and the first conductor of the conductor 240*a* is formed in contact with the side surface of the insulator 241*a*. The conductor 242*a* is positioned on at least part of the bottom portion of the opening, and the conductor 240*a* is in contact with the conductor 242*a*. Similarly, the insulator 241*b* is provided in contact with the inner walls of the openings in the insulator 281, the insulator 274, the insulator 280, and the insulator 254, and the first conductor of the conductor 240*b* is formed in contact with the side surface of the insulator 241*b*. The conductor 242*b* is positioned on at least part of the bottom portion of the opening, and the conductor 240*b* is in contact with the conductor 242*b*.

The conductor 240*a* and the conductor 240*b* are preferably formed using a conductive material containing tungsten, copper, or aluminum as its main component. The conductor 240*a* and the conductor 240*b* may have a stacked-layer structure.

In the case where the conductor 240 has a stacked-layer structure, the aforementioned conductor having a function of inhibiting diffusion of impurities such as water or hydrogen is preferably used as the conductor in contact with the metal oxide 230*a*, the metal oxide 230*b*, the conductor 242, the insulator 254, the insulator 280, the insulator 274, and the insulator 281. For example, tantalum, tantalum nitride, titanium, titanium nitride, ruthenium, ruthenium oxide, or the like is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240*a* and the conductor 240*b*. Moreover, impurities such as water or hydrogen can be inhibited from entering the metal oxide 230 through the conductor 240*a* and the conductor 240*b* from a layer above the insulator 281.

As the insulator 241*a* and the insulator 241*b*, for example, the insulator that can be used as the insulator 254 or the like can be used. Since the insulator 241*a* and the insulator 241*b* are provided in contact with the insulator 254, impurities such as water or hydrogen in the insulator 280 or the like can be inhibited from entering the metal oxide 230 through the conductor 240*a* and the conductor 240*b*. Furthermore, oxygen contained in the insulator 280 can be prevented from being absorbed by the conductor 240*a* and the conductor 240*b*.

Although not illustrated, a conductor functioning as a wiring may be provided in contact with the top surfaces of the conductors 240*a* and 240*b*. For the conductor functioning as a wiring, a conductive material containing tungsten, copper, or aluminum as its main component is preferably used. Furthermore, the conductor may have a stacked-layer structure and may be a stack of titanium or a titanium nitride and any of the above conductive materials, for example. Note that the conductor may be formed to be embedded in an opening provided in an insulator.

<Materials for Transistor>

Materials that can be used for the transistor will be described.

[Substrate]

As a substrate where the transistor 200A is formed, an insulator substrate, a semiconductor substrate, or a conductor substrate can be used, for example. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example includes a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the elements provided for the substrates include a capacitor, a resistor, a switching element, a light-emitting element, and a memory element.

[Insulator]

Examples of an insulator include an oxide, a nitride, an oxynitride, a nitride oxide, a metal oxide, a metal oxynitride, and a metal nitride oxide, each of which has an insulating property.

With further miniaturization and higher integration of a transistor, for example, a problem such as generation of leakage current may arise because of a thinned gate insulator. When a high-k material is used for the insulator functioning as a gate insulator, the voltage at the time of operation of the transistor can be reduced while the physical thickness is maintained. By contrast, when a material with a low relative permittivity is used for the insulator functioning as an interlayer film, parasitic capacitance generated between wirings can be reduced. Thus, a material is preferably selected depending on the function of an insulator.

Examples of the insulator having a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor including an oxide semiconductor is surrounded by insulators having a function of inhibiting the passage of oxygen and impurities such as hydrogen (e.g., the insulator 214, the insulator 222, the insulator 254, and the insulator 274), the electrical characteristics of the transistor can be stable. An insulator having a function of inhibiting the passage of oxygen and impurities such as hydrogen can be formed to have a single layer or a stacked layer including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. Specifically, as the insulator having a function of inhibiting the passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

An insulator functioning as a gate insulator preferably includes a region containing oxygen released by heating. For example, a structure where silicon oxide or silicon oxynitride that includes a region containing oxygen released by heating is provided in contact with the metal oxide 230 can compensate oxygen vacancies in the metal oxide 230.

[Conductor]

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that maintain their conductivity even after absorbing oxygen. A semiconductor having high electrical conductivity, typified by polycrystalline silicon containing an impurity element such as phosphorus, or silicide such as nickel silicide may be used.

A plurality of conductors formed using any of the above materials may be stacked. For example, a stacked-layer structure combining a material containing the above metal element and a conductive material containing oxygen may be employed. Alternatively, a stacked-layer structure combining a material containing the above metal element and a conductive material containing nitrogen may be employed. Further alternatively, a stacked-layer structure combining a material containing the above metal element, a conductive material containing oxygen, and a conductive material containing nitrogen may be employed.

In the case where a metal oxide is used for the channel formation region of the transistor, the conductor functioning as the gate electrode preferably employs a stacked-layer structure combining a material containing the above metal element and a conductive material containing oxygen. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in the metal oxide in which the channel is formed. A conductive material containing the above metal element and nitrogen may be used. For example, a conductive material containing nitrogen such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from an external insulator or the like can be captured in some cases.

At least part of this embodiment can be implemented in combination with any of the other embodiments described in this specification as appropriate.

Embodiment 13

Described in this embodiment is a metal oxide (hereinafter also referred to as an oxide semiconductor) applicable to an OS transistor described in the above embodiment.

<Classification of Crystal Structures>

First, the classification of the crystal structures of an oxide semiconductor will be described with reference to FIG. 39A. FIG. 39A is a diagram showing the classification of crystal structures of an oxide semiconductor, typically IGZO (a metal oxide containing In, Ga, and Zn).

As shown in FIG. 39A, an oxide semiconductor is roughly classified into “Amorphous,” “Crystalline,” and “Crystal.” The term “Amorphous” includes a completely amorphous structure. The term “Crystalline” includes CAAC (c-axis-aligned crystalline), nc (nanocrystalline), and CAC (cloud-aligned composite) structures. Note that the term “Crystalline” excludes single crystal, poly crystal, and completely amorphous structures. The term “Crystal” includes single crystal and poly crystal structures.

Note that the structures in the thick frame in FIG. 39A are in an intermediate state between “Amorphous” and “Crystal,” and belong to a new crystalline phase. That is, these structures are completely different from “Amorphous,” which is energetically unstable, and “Crystal.”

A crystal structure of a film or a substrate can be analyzed with an X-ray diffraction (XRD) spectrum. FIG. 39B shows an XRD spectrum, which is obtained by GIXD (Grazing-Incidence XRD) measurement, of a CAAC-IGZO film classified into “Crystalline.” Note that a GIXD method is also referred to as a thin film method or a Seemann-Bohlin method. The XRD spectrum that is shown in FIG. 39B and obtained by GIXD measurement is hereinafter simply referred to as an XRD spectrum. The CAAC-IGZO film in FIG. 39B has an atomic ratio of In:Ga:Zn=4:2:3 or a neighborhood thereof. The CAAC-IGZO film in FIG. 39B has a thickness of 500 nm.

As shown in FIG. 39B, a clear peak indicating crystallinity is observed in the XRD spectrum of the CAAC-IGZO film. Specifically, a peak indicating c-axis alignment is observed at 2θ of around 31° in the XRD spectrum of the CAAC-IGZO film. As shown in FIG. 39B, the peak at 2θ of around 31° is asymmetric with the angle at which the peak intensity is observed as the axis.

A crystal structure of a film or a substrate can also be evaluated with a diffraction pattern obtained by a nanobeam electron diffraction (NBED) method (such a pattern is also referred to as a nanobeam electron diffraction pattern). FIG. 39C shows a diffraction pattern of the CAAC-IGZO film. FIG. 39C shows a diffraction pattern obtained by the NBED method in which an electron beam is incident in the direction parallel to the substrate. The CAAC-IGZO film in FIG. 39C has an atomic ratio of In:Ga:Zn=4:2:3 or a neighborhood thereof. In the nanobeam electron diffraction method, electron diffraction is performed with a probe diameter of 1 nm.

As shown in FIG. 39C, a plurality of spots indicating c-axis alignment are observed in the diffraction pattern of the CAAC-IGZO film.

[Structure of Oxide Semiconductor]

Oxide semiconductors might be classified in a manner different from the one in FIG. 39A when classified in terms of the crystal structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more minute crystals (crystals each of which has a maximum diameter of less than 10 nm). In the case where the crystal region is formed of one minute crystal, the maximum diameter of the crystal region is less than 10 nm. In the case where the crystal region is formed of a large number of minute crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having a small amount of impurities or defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (what is called thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Hence, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using $\theta/2\theta$ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[A-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration in the film than the nc-OS and the CAAC-OS.

[Composition of Oxide Semiconductor]

Next, the CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted with [In], [Ga], and [Zn], respectively. For example, the first region in the CAC-OS in the In—Ga—Zn oxide has [In] higher than [In] in the composition of the CAC-OS film. Moreover, the second region has [Ga] higher than [Ga] in the composition of the CAC-OS film. Alternatively, for example, the first region has higher [In] than [In] in the second region and lower [Ga] than [Ga] in the second region. Moreover, the second region has higher [Ga] than [Ga] in the first region and lower [In] than [In] in the first region.

Specifically, the first region includes indium oxide, indium zinc oxide, or the like as its main component. The second region includes gallium oxide, gallium zinc oxide, or the like as its main component. That is, the first region can be rephrased with a region containing In as its main component. The second region can be rephrased with a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In—Ga—Zn oxide has a structure in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC- OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (μ), and excellent switching operation can be achieved.

An oxide semiconductor can have any of various structures that show various different properties. Two or more of the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{3}$, still further preferably lower than or equal to $1\times10^{11}$ cm$^{-3}$, yet further preferably lower than $1\times10^{10}$ cm$^{-3}$ and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, it is effective to reduce the impurity concentration in the oxide semiconductor. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurity>

The influence of impurities in the oxide semiconductor is described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^{3}$, preferably lower than or equal to $2\times10^{17}$ atoms/cm$^{3}$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^{3}$, preferably lower than or equal to $2\times10^{16}$ atoms/cm$^{3}$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^{3}$, preferably lower than or equal to $5\times10^{18}$ atoms/cm$^{3}$, further preferably lower than or equal to $1\times10^{18}$ atoms/cm$^{3}$, still further preferably lower than or equal to $5\times10^{17}$ atoms/cm$^{3}$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^{3}$, preferably lower than $1\times10^{19}$ atoms/cm$^{3}$, further preferably lower than $5\times10^{18}$ atoms/cm$^{3}$, still further preferably lower than $1\times10^{18}$ atoms/cm$^{3}$.

When an oxide semiconductor with sufficiently reduced impurities is used for a channel formation region in a transistor, the transistor can have stable electrical characteristics.

At least part of this embodiment can be implemented in combination with any of the other embodiments described in this specification as appropriate.

Embodiment 14

In this embodiment, an electronic device including a display device and a display system, which are each one embodiment of the present invention will be described.

FIG. 40A is an external view of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and display an image corresponding to received image data on the display portion 8204. The movement of the eyeball and the eyelid of a user is captured by a camera in the main body 8203 and then coordinates of a user's sight line are calculated using the captured data to utilize the user's sight line as an input means.

The mounting portion 8201 may include a plurality of electrodes so as to be in contact with the user. The main body

8203 may have a function of sensing current flowing through the electrodes with the movement of the user's eyeball to recognize the user's sight line. The main body 8203 may have a function of sensing current flowing through the electrodes to monitor the user's pulse. The mounting portion 8201 may include sensors, such as a temperature sensor, a pressure sensor, and an acceleration sensor so that the user's biological information can be displayed on the display portion 8204. The main body 8203 may have a function of sensing the movement of the user's head or the like to move an image displayed on the display portion 8204 in synchronization with the movement of the user's head or the like.

A display device of one embodiment of the present invention can be used in the display portion 8204. Thus, power consumption of the head-mounted display 8200 can be reduced, so that the head-mounted display 8200 can be used continuously for a long time. The power consumption of the head-mounted display 8200 can be reduced, which allows the battery 8206 to be downsized and get lighter. Thus, the head-mounted display 8200 can be downsized and light. Thus, a burden of the use of the head-mounted display 8200 can be lightened, and thus a user can use the head-mounted display 8200 almost without feeling fatigue.

FIGS. 40B to 40D are external views of a head-mounted display 8300. The head-mounted display 8300 includes a housing 8301, a display portion 8302, a fixing band 8304, and a pair of lenses 8305. A battery 8306 is incorporated in the housing 8301, and electric power can be supplied from the battery 8306 to the display portion 8302 or the like.

A user can see display on the display portion 8302 through the lenses 8305. It is favorable that the display portion 8302 be curved. When the display portion 8302 is curved, a user can feel high realistic sensation of images. Although the structure described in the example of this embodiment has one display portion 8302, the number of display portions 8302 provided is not limited to one. For example, two display portions 8302 may be provided for user's respective eyes so that three-dimensional display using parallax or the like is possible.

A display device of one embodiment of the present invention can be used in the display portion 8302. Thus, power consumption of the head-mounted display 8300 can be reduced, so that the head-mounted display 8300 can be used continuously for a long time. The power consumption of the head-mounted display 8300 can be reduced, which allows the battery 8306 to be downsized and get lighter. Thus, the head-mounted display 8300 can be downsized and light. Thus, a burden of the use of the head-mounted display 8300 can be lightened, and thus a user can use the head-mounted display 8300 almost without feeling fatigue.

Figure 41A:
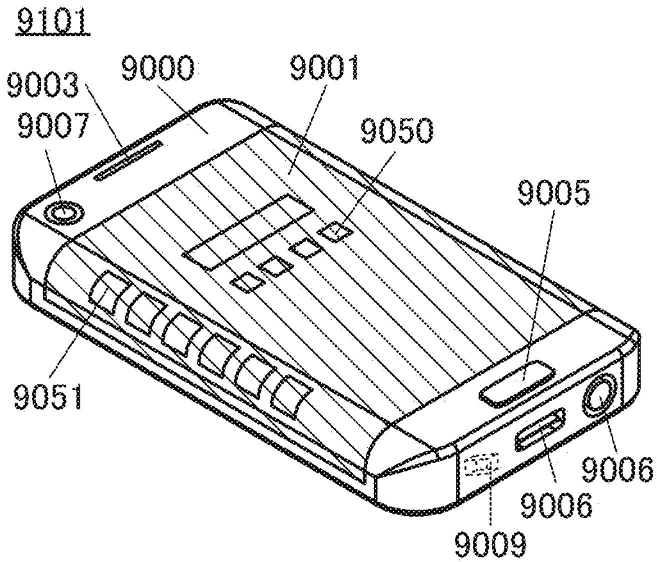
FIGS. 41A and 41B illustrate examples of electronic devices.
Figure 41B:
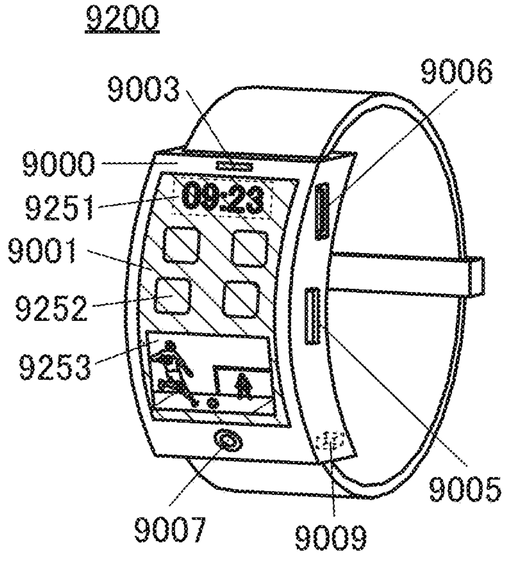

Next, FIGS. 41A and 41B illustrate examples of electronic devices that are different from those illustrated in FIGS. 40A to 40D.

Electronic devices illustrated in FIGS. 41A and 41B include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a battery 9009, and the like.

The electronic devices illustrated in FIGS. 41A and 41B have a variety of functions. For example, the electronic devices can have a variety of functions, such as a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of connecting to a variety of computer networks with a wireless communication function, a function of transmitting and receiving a variety of data with a wireless communication function, and a function of reading a program or data stored in a storage medium and displaying the program or data on the display portion. Note that functions of the electronic devices in FIGS. 41A and 41B are not limited to the above, and the electronic devices can have a variety of functions. Although not illustrated in FIGS. 41A and 41B, the electronic devices may have a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 41A and 41B are described in detail below.

FIG. 41A is a perspective view showing a portable information terminal 9101. The portable information terminal 9101 serves as, for example, one or more of a telephone set, a notebook, and an information browsing system. Specifically, the portable information terminal 9101 can be used as a smartphone. The portable information terminal 9101 can display text or image data on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, or call; the title and sender of an email and SNS message; the date; the time; remaining battery; or the reception strength of an antenna. Alternatively, the operation buttons 9050 or the like may be displayed in place of the information 9051.

The display device of one embodiment of the present invention can be used for the portable information terminal 9101. Thus, power consumption of the portable information terminal 9101 can be reduced, so that the portable information terminal 9101 can be used continuously for a long time. The power consumption of the portable information terminal 9101 can be reduced, which allows the battery 9009 to be downsized and get lighter. Thus, the portable information terminal 9101 can be downsized and light. Thus, the portability of the portable information terminal 9101 can be increased.

FIG. 41B is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is curved, and display can be performed on the curved display surface. FIG. 41B illustrates an example in which time 9251, operation buttons 9252 (also referred to as operation icons or simply icons), and a content 9253 are displayed on the display portion 9001. The content 9253 can be a moving image, for example.

The portable information terminal 9200 can employ near field communication conformable to a communication standard. For example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

The display device of one embodiment of the present invention can be used for the portable information terminal 9200. Thus, power consumption of the portable information terminal 9200 can be reduced, so that the portable information terminal 9200 can be continuously used for a long time. The power consumption of the portable information terminal 9200 can be reduced, which allows the battery 9009 to be downsized and get lighter. Thus, the portable information terminal 9200 can be downsized and light. Thus, the portability of the portable information terminal 9200 can be increased.

At least part of this embodiment can be implemented in appropriate combination with any of the other embodiments described in this specification.

(Supplementary Notes on Description in this Specification and the Like)

The following are notes on the description of the foregoing embodiments and the structures in the embodiments One embodiment of the present invention can be constituted by appropriately combining the structure described in an embodiment with any of the structures described in the other embodiments. In addition, in the case where a plurality of structure examples are described in one embodiment, some of the structure examples can be combined as appropriate.

Note that a content (or part thereof) described in one embodiment can be applied to, combined with, or replaced with another content (or part thereof) in the same embodiment and/or a content (or part thereof) described in another embodiment or other embodiments.

Note that in each embodiment, a content described in the embodiment is a content described with reference to a variety of diagrams or a content described with text disclosed in this specification.

Note that by combining a diagram (or part thereof) described in one embodiment with another part of the diagram, a different diagram (or part thereof) described in the embodiment, and/or a diagram (or part thereof) described in another embodiment or other embodiments, much more diagrams can be formed.

In this specification and the like, components are classified on the basis of the functions, and shown as blocks independent of one another in block diagrams. However, in an actual circuit and the like, such components are sometimes hard to classify functionally, and there is a case where one circuit is associated with a plurality of functions or a case where a plurality of circuits are associated with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, variation in signal, voltage, or current due to noise or difference in timing can be included.

In this specification and the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the terms such as "electrode" and "wiring" do not limit the functions of the components. For example, an "electrode" is used as part of a wiring in some cases, and vice versa. Furthermore, the terms "electrode" or "wiring" can also mean a combination of a plurality of electrodes or wirings provided in an integrated manner, for example.

In this specification and the like, "voltage" and "potential" can be replaced with each other as appropriate. The term "voltage" refers to a potential difference from a reference potential. When the reference potential is a ground potential, for example, "voltage" can be replaced with "potential". The ground potential does not necessarily mean 0 V. Potentials are relative values, and a potential supplied to a wiring or the like is sometimes changed depending on the reference potential.

In this specification and the like, the terms "film" and "layer" can be interchanged with each other depending on the case or circumstances. For example, the term "conductive layer" can be changed to the term "conductive film" in some cases. Also, for example, the term "insulating film" can be changed to the term "insulating layer" in some cases.

In this specification and the like, a switch is in a conductive state (on state) or in a non-conductive state (off state) to determine whether current flows therethrough or not. Alternatively, a switch has a function of selecting and changing a current path.

In this specification and the like, the channel length refers to, for example, the distance between a source and a drain in a region where a semiconductor (or a portion where current flows in a semiconductor when a transistor is on) and a gate overlap with each other or a region where a channel is formed in a top view of the transistor.

In this specification and the like, the channel width refers to, for example, the length of a portion where a source and a drain face each other in a region where a semiconductor (or a portion of the semiconductor in which current flows when a transistor is in the on state) and a gate electrode overlap with each other or in a region where a channel is formed.

In this specification and the like, the expression "A and B are connected" means the case where A and B are electrically connected to each other as well as the case where A and B are directly connected to each other. Here, the expression "A and B are electrically connected" means the case where electric signals can be transmitted and received between A and B when an object having any electric action exists between A and B.

Reference Example 1

In this reference example, the structures of Light-emitting devices 1 to 3 are described with reference to FIGS. 42A and 42B and FIG. 43.

Figure 42A:
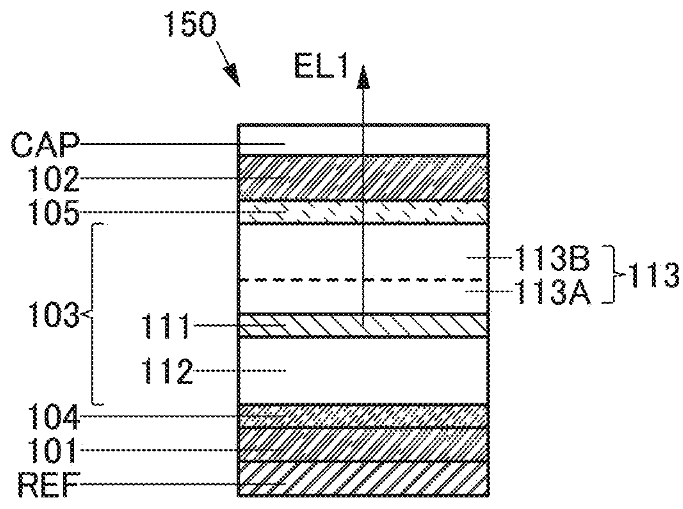
FIGS. 42A and 42B illustrate structures of light-emitting devices.

FIG. 42A illustrates a structure of Light-emitting device 1 and Light-emitting device 2. FIG. 42B illustrates the structure of Light-emitting device 3.

Figure 43:
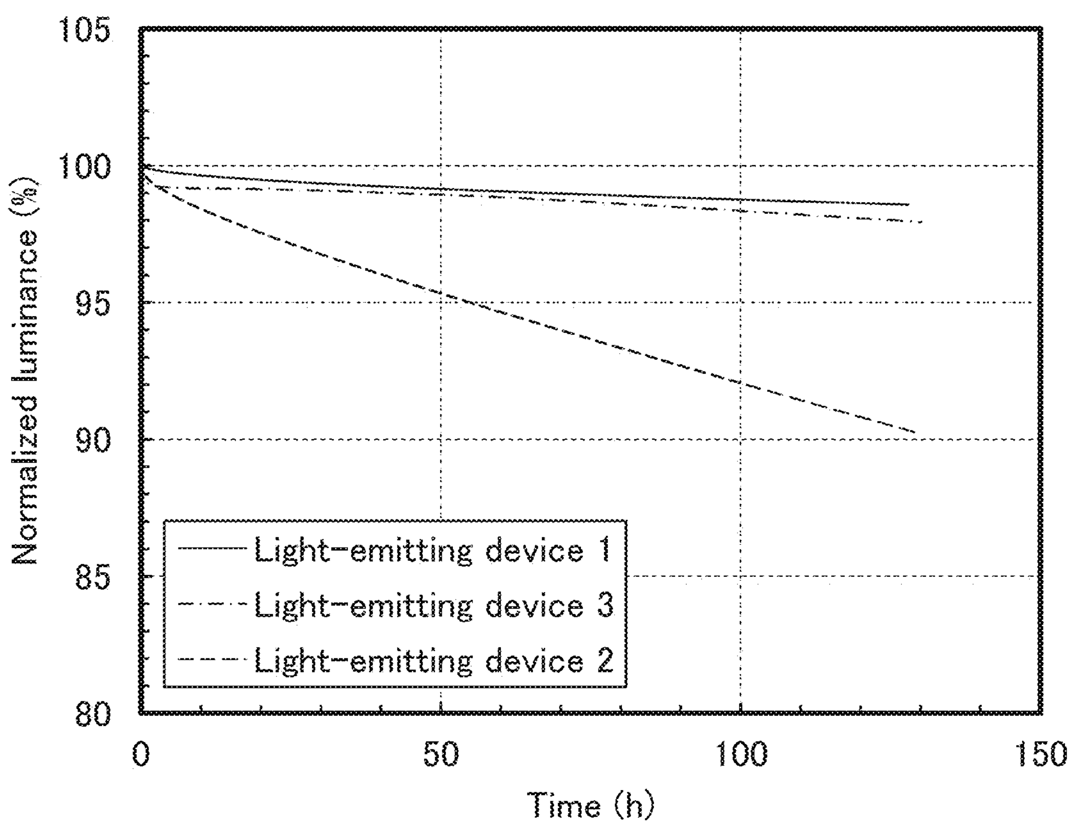
FIG. 43 shows the time dependence of normalized luminance of light-emitting devices.

FIG. 43 is a graph showing time dependence of normalized luminance characteristics of Light-emitting devices 1 to 3 each emitting light at a constant current density in an environment of 65° C.

<Light-Emitting Devices 1 to 3>

Figure 42B:
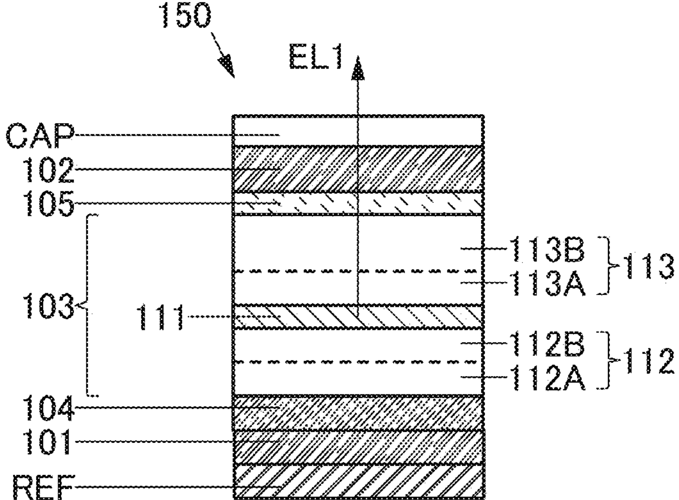

Light-emitting devices 1 to 3 described and fabricated in this reference example each include the electrode 101, the electrode 102, and the unit 103, and the electrode 102 includes the region overlapping with the electrode 101 (see FIGS. 42A and 42B).

<<Structures of Light-Emitting Devices 1 to 3>>

Table 1 to Table 3 show structures of Light-emitting devices 1 to 3. Structural formulae of materials used in Light-emitting devices described in this reference example are shown below. Note that in the tables in this reference example, subscript and superscript characters are written in ordinary size for convenience. For example, a subscript character in an abbreviation is written in ordinary size in the tables. The corresponding description in the specification gives an accurate reading of such notations in the tables.

TABLE 1

| Structure | Reference numeral | Material | Composition ratio | Thickness/ nm |
|---|---|---|---|---|
| Layer | CAP | DBT3PII | | 80 |
| Electrode | 102 | Ag:Mg | 1:0.1 | 15 |
| Layer | 105 | LiF | | 1 |
| Layer | 113B | NBPhen | | 15 |
| Layer | 113A | 9mDBtBPNfpr | | 20 |
| Layer | 111 | 9mDBtBPNfpr: PCBBiF: OCPG-006 | 0.6: 0.4: 0.05 | 60 |
| Layer | 112 | PCBBiF | | 80 |
| Layer | 104 | PCBBiF:OCHD-003 | 1:0.03 | 10 |
| Electrode | 101 | ITSO | | 100 |
| Reflective film | REF | Ag | | |

TABLE 2

| Structure | Reference numeral | Material | Composition ratio | Thickness/ nm |
|---|---|---|---|---|
| Layer | CAP | DBT3PII | | 80 |
| Electrode | 102 | Ag:Mg | 1:0.1 | 15 |
| Layer | 105 | LiF | | 1 |
| Layer | 113B | NBPhen | | 25 |
| Layer | 113A | 8BP-4mDBtPBfpm | | 10 |
| Layer | 111 | 8BP-4mDBtPBfpm: βNCCP: Ir(ppy)2(mbfpypy-d3) | 0.6: 0.4: 0.1 | 50 |
| Layer | 112 | PCBBilBP | | 20 |
| Layer | 104 | DBT3PII:MoOx | 1:0.5 | 45 |
| Electrode | 101 | ITSO | | 85 |
| Reflective film | REF | Ag | | |

TABLE 3

| Structure | Reference numeral | Material | Composition ratio | Thickness/ nm |
|---|---|---|---|---|
| Layer | CAP | DBT3PII | | 80 |
| Electrode | 102 | Ag:Mg | 1:0.1 | 15 |
| Layer | 105 | LiF | | 1 |
| Layer | 113B | ZADN:Liq | 1:1 | 20 |
| Layer | 113A | 6BP-4Cz2PPm | | 10 |
| Layer | 111 | 2αN-αNPhA: 3,10PCA2Nbf(IV)-02 | 1:0.03 | 20 |
| Layer | 112B | DBfBB1TP | | 10 |
| Layer | 112A | oFBiSF(2) | | 115 |
| Layer | 104 | oFBiSF(2):OCHD-003 | 1:0.02 | 10 |
| Electrode | 101 | ITSO | | 10 |
| Reflective film | REF | Ag | | |

<<Method for Fabricating Light-Emitting Device 1>>

Light-emitting device 1 described in this reference example was fabricated with a method including the following steps.

[First Step]

The reflective film REF was formed in the first step. Specifically, the reflective film REF was formed with a sputtering method using an alloy containing silver (Ag), palladium (Pd), and copper (Cu) (abbreviation: APC) as a target.

[Second Step]

In the second step, the electrode 101 was formed over the reflective film REF. Specifically, the electrode 101 was formed with a sputtering method using indium oxide-tin oxide containing silicon or silicon oxide (abbreviation: ITSO) as a target.

The electrode 101 includes ITSO, and has a thickness of 100 nm and an area of 4 $mm^2$ (2 mm×2 mm).

[Third Step]

In the third step, the layer 104 was formed over the electrode 101. Specifically, materials of the layer 104 were co-deposited by a resistance-heating method.

The layer 104 includes N-(1,1'-biphenyl-4-yl)-N-[4-(9-phenyl-9H-carbazol-3-yl)phenyl]-9,9-dimethyl-9H-fluoren-2-amine (abbreviation: PCBBiF) and an electron acceptor material (abbreviation: OCHD-003) at PCBBiF:OCHD-003=1:0.03 in a weight ratio and has a thickness of 10 nm. Note that OCHD-003 has an electron-acceptor property and contains fluorine. The molecular weight of OCHD-003 is 672.

[Fourth Step]

In the fourth step, the layer 112 was formed over the layer 104. Specifically, a material of the layer 112 was deposited by a resistance-heating method.

Note that the layer 112 contains PCBBiF and has a thickness of 80 nm.

[Fifth Step]

In the fifth step, the layer 111 was formed over the layer 112. Specifically, materials of the layer 111 were co-deposited by a resistance-heating method.

The layer 111 includes 9-[(3'-dibenzothiophen-4-yl)biphenyl-3-yl]naphtho[1',2':4,5]furo[2,3-b]pyrazine (abbreviation: 9mDBtBPNfpr), PCBBiF, and a phosphorescent dopant at 9mDBtBPNfpr:PCBBiF:OCPG-006=0.6:0.4:0.05 in a weight ratio and has a thickness of 60 nm.

[Sixth Step]

In the sixth step, the layer 113A was formed over the layer 111. Specifically, a material of the layer 113A was deposited by a resistance-heating method.

The layer 113A contains 9mDBtBPNfpr and has a thickness of 20 nm.

[Seventh Step]

In the seventh step, the layer 113B was formed over the layer 113A. Specifically, a material of the layer 113B was deposited by a resistance-heating method.

The layer 113B includes 2,9-di(2-naphthyl)-4,7-diphenyl-1,10-phenanthroline (abbreviation: NBPhen) and has a thickness of 15 nm.

[Eighth Step]

In the eighth step, the layer 105 was formed over the layer 113B. Specifically, a material of the layer 105 was deposited by a resistance-heating method.

Note that the layer 105 includes lithium fluoride (abbreviation: LiF) and has a thickness of 1 nm.

[Ninth Step]

In a ninth step, the electrode 102 was formed over the layer 105. Specifically, materials of the electrode 102 were co-deposited by a resistance-heating method.

The electrode 102 includes Ag and Mg at Ag:Mg=1:0.1 in a weight ratio and has a thickness of 15 nm.

[Tenth Step]

In the tenth step, the layer CAP was formed over the electrode 102. Specifically, a material of the layer CAP was deposited by a resistance-heating method.

The layer CAP includes 1,3,5-tri(dibenzothiophen-4-yl)-benzene (abbreviation: DBT3PII) and has a thickness of 80 nm.

<<Method for Fabricating Light-Emitting Device 2>>

Light-emitting device 2 described in this reference example was fabricated using a method including the following steps.

[First Step]

The reflective film REF was formed in the first step. Specifically, the reflective film REF was formed with a sputtering method using APC as a target.

[Second Step]

In the first step, the electrode 101 was formed over the reflective film REF. Specifically, the electrode 101 was formed with a sputtering method using ITSO as a target.

Note that the electrode 101 includes ITSO and has a thickness of 85 nm.

[Third Step]

In the third step, the layer 104 was formed over the electrode 101. Specifically, materials of the layer 104 were co-deposited by a resistance-heating method.

The layer 104 includes DBT3PII and molybdenum oxide (abbreviation: $MoO_x$), at DBT3PII:$MoO_x$=1:0.5 in a weight ratio and has a thickness of 45 nm.

[Fourth Step]

In the fourth step, the layer 112 was formed over the layer 104. Specifically, a material of the layer 112 was deposited by a resistance-heating method.

Note that layer 112 includes 4,4'-diphenyl-4"-(9-phenyl-9H-carbazol-3-yl)triphenylamine (abbreviation: PCBBi1BP) and has a thickness of 20 nm.

[Fifth Step]

In a fifth step, the layer 111 was formed over the layer 112. Specifically, materials of the layer 111 were co-deposited by a resistance-heating method.

The layer 111 contains 8-(1,1'-biphenyl-4-yl)-4-[3-(dibenzothiophen-4-yl)phenyl]-[1]benzofuro[3,2-d]pyrimidine (abbreviation: 8BP-4mDBtPBfpm), 9-(2-naphthyl)-9'-phenyl-9H,9'H-3,3'-bicarbazole (abbreviation: βNCCP), and [2-d3-methyl-(2-pyridinyl-κN)benzofuro[2,3-b]pyridine-κC]bis[2-(2-pyridinyl-κN)phenyl-κC]iridium(III) (abbreviation: $Ir(ppy)_2$(mbfpypy-d3)) at 8BP-4mDBtPBfpm: βNCCP:$Ir(ppy)_2$ (mbfpypy-d3)=0.6:0.4:0.1 in a weight ratio and a thickness of 50 nm.

[Sixth Step]

In the sixth step, the layer 113A was formed over the layer 111. Specifically, a material of the layer 113A was deposited by a resistance-heating method.

The layer 113A includes 8BP-4mDBtPBfpm and has a thickness of 10 nm.

[Seventh Step]

In the seventh step, the layer 113B was formed over the layer 113A. Specifically, a material of the layer 113B was deposited by a resistance-heating method.

Note that the layer 113B contains NBPhen and has a thickness of 25 nm.

[Eighth Step]

In the eighth step, the layer 105 was formed over the layer 113B. Specifically, a material of the layer 105 was deposited by a resistance-heating method.

The layer 105 includes LiF and has a thickness of 1 nm.

[Ninth Step]

In the ninth step, the electrode 102 was formed over the layer 105. Specifically, materials of the electrode 102 were co-deposited by a resistance-heating method.

The electrode 102 includes Ag and Mg at Ag:Mg=1:0.1 in a weight ratio and has a thickness of 15 nm.

[Tenth Step]

In the tenth step, the layer CAP was formed over the electrode 102. Specifically, a material of the layer CAP was deposited by a resistance-heating method.

The layer CAP contains DBT3PII and has a thickness of 80 nm.

<<Method for Fabricating Light-Emitting Device 3>>

Light-emitting device 3 described in this reference example was fabricated using a method including the following steps.

[First Step]

The reflective film REF was formed in the first step. Specifically, the reflective film REF was formed with a sputtering method using APC as a target.

[Second Step]

In the second step, the electrode 101 was formed over the reflective film REF. Specifically, the electrode 101 was formed with a sputtering method using ITSO as a target.

Note that the electrode 101 includes ITSO and has a thickness of 10 nm.

[Third Step]

In the third step, the layer 104 was formed over the electrode 101. Specifically, materials of the layer 104 were co-deposited by a resistance-heating method.

The layer 104 includes N-(1,1'-biphenyl-2-yl)-N-(9,9-dimethylfluoren-2-yl)-9,9'-spirobi[9H-fluoren]-2-amine (abbreviation: oFBiSF(2)) and OCHD-003 at oFBiSF(2): OCHD-003=1:0.02 in a weight ratio and has a thickness of 10 nm.

[Fourth Step]

In the fourth step, the layer 112A was formed over the layer 104. Specifically, a material of the layer 112A was deposited by a resistance-heating method.

Note that the layer 112A includes oFBiSF(2) and has a thickness of 115 nm.

[Fifth Step]

In the fifth step, a layer 112B was formed over the layer 112A. Specifically, a material of the layer 112A was deposited by a resistance-heating method.

The layer 112B includes N,N-bis[4-(dibenzofuran-4-yl)phenyl]-4-amino-p-terphenyl (abbreviation: DBfBB1TP) and has a thickness of 10 nm.

[Sixth Step]

In the sixth step, the layer 111 was formed over the layer 112B. Specifically, materials of the layer 111 were co-deposited by a resistance-heating method.

The layer 111 includes 2,9-di(1-naphthyl)-10-phenylanthracene (abbreviation: 2αN-αNphA) and 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02) at 2αN-αNPhA:3,10PCA2Nbf(IV)-02=1:0.03 in a weight ratio and has a thickness of 20 nm.

[Seventh Step]

In the seventh step, the layer 113A was formed over the layer 111. Specifically, a material of the layer 113A was deposited by a resistance-heating method.

The layer 113A includes 4-[3,5-bis(9H-carbazol-9-yl) phenyl]-2-phenyl-6-(1,1'-biphenyl-4-yl)pyrimidine (abbreviation: 6BP-4Cz2PPm) and has a thickness of 10 nm.

[Eighth Step]

In the eighth step, a layer 113B was formed over the layer 113A. Specifically, materials of the layer 113B were co-deposited by a resistance-heating method.

The layer 113B includes 2-{4-[9,10-di(naphthalen-2-yl)-2-anthryl]phenyl}-1-phenyl-1H-benzimidazole (abbreviation: ZADN) and 8-hydroxyquinolinato-lithium (abbreviation: Liq) at ZADN:Liq=1:1 in a weight ratio and has a thickness of 20 nm

[Ninth Step]

In the ninth step, the layer 105 was formed over the layer 113B. Specifically, a material of the layer 105 was deposited by a resistance-heating method.

The layer 105 includes LiF and has a thickness of 1 nm.

[Tenth Step]

In the tenth step, the electrode 102 was formed over the layer 105. Specifically, materials of the electrode 102 were co-deposited by a resistance-heating method.

The electrode 102 includes Ag and Mg at Ag:Mg=1:0.1 in a weight ratio and has a thickness of 15 nm.

[Eleventh Step]

In the eleventh step, the layer CAP was formed over the electrode 102. Specifically, a material of the layer CAP was deposited by a resistance-heating method.

In addition, the layer CAP includes DBT3PII and has a thickness of 80 nm.

<<Operation Characteristics of Light-Emitting Devices 1 to 3>>

When power is supplied, Light-emitting device 1 emitted red light. In an environment at 65° C., Light-emitting device 1 was made to emit light at a constant current density to have a luminance of 4131 cd/m$^2$ in the initial state. FIG. 43 shows the time dependence of normalized luminance where the initial luminance is 100%.

When power was supplied, Light-emitting device 2 emitted green light. In an environment at 65° C., Light-emitting device 2 was made to emit light at a constant current density to have a luminance of 14818 cd/m$^2$ in the initial state. FIG. 43 shows the time dependence of normalized luminance where the initial luminance is 100%.

When power was supplied, Light-emitting device 3 emitted red light. In an environment at 65° C., Light-emitting device 3 was made to emit light at a constant current density to have a luminance of 1051 cd/m$^2$ in the initial state. FIG. 43 shows the time dependence of normalized luminance where the initial luminance is 100%.

A light-emitting device with the same structure as Light-emitting devices 1 to 3 was used for a display panel to have an aperture ratio of 75%, and the effective luminance was calculated on the assumption that white display was made at 5000 cd/m$^2$. Table 4 shows typical characteristics of Light-emitting devices 1 to 3 when Light-emitting devices 1 to 3 emitted light at an intrinsic luminance determined on the basis of the calculated effective luminance.

TABLE 4

| | Chromaticity x | Chromaticity y | Effective luminance (cd/cm$^2$) | Intrinsic luminance (cd/cm$^2$) | Current efficiency (cd/A) | Current density (mA/cm$^2$) | Voltage (V) |
|---|---|---|---|---|---|---|---|
| Light-emitting device 1 | 0.698 | 0.302 | 1033 | 4131 | 29.8 | 13.9 | 3.83 |
| Light-emitting device 2 | 0.273 | 0.701 | 3704 | 14818 | 107.5 | 13.8 | 5.86 |
| Light-emitting device 3 | 0.142 | 0.041 | 263 | 1051 | 7.8 | 13.4 | 6.27 |

What is claimed is:

1. A display panel comprising:

a first light-emitting device comprising a first electrode, a second electrode, and a first unit between the first electrode and the second electrode;

a second light-emitting device comprising a third electrode, a fourth electrode, and a second unit between the third electrode and the fourth electrode;

a first insulating film comprising a region between the first light-emitting device and the second light-emitting device;

a first conductive film over the first insulating film; and a second conductive film electrically connected to the first conductive film, wherein the second conductive film is outside a display region, wherein the first electrode, the third electrode, and the second conductive film are on a same surface, wherein the first insulating film has a single-layer structure, wherein the first insulating film is in contact with a top surface and a side surface of the first electrode, a top surface and a side surface of the second electrode, a side surface of the first unit, a side surface of the second unit, a top surface and a side surface of the third electrode, a top surface and a side surface of the fourth electrode, and a top surface and a side surface of the second conductive film, wherein the first insulating film comprises a first opening overlapping with the second electrode, a second opening overlapping with the fourth electrode, and a third opening overlapping with the second conductive film, wherein the first conductive film is electrically connected to the second electrode in the first opening, to the fourth electrode in the second opening, and to the second conductive film in the third opening, wherein the first unit is configured to emit first light, and wherein the second unit is configured to emit second light.

2. The display panel according to claim 1, wherein a hue of the second light is different from a hue of the first light.

3. The display panel according to claim 1, wherein the first light-emitting device comprises a first layer, wherein the first layer is sandwiched between the second electrode and the first unit, wherein the second light-emitting device comprises a second layer, wherein the second layer is sandwiched between the fourth electrode and the second unit, and wherein the first layer and the second layer comprise the same electron-injection material.

4. The display panel according to claim 3, wherein the first layer and the second layer comprise lithium fluoride.

5. A data processing device comprising:

at least one of a keyboard, a hardware button, a pointing device, a touch sensor, an illuminance sensor, an imaging device, an audio input device, a sight input device, and an attitude detection device; and the display panel according to claim 1.

6. A display panel comprising:

a first light-emitting device comprising a first electrode, a second electrode, a first unit between the first electrode and the second electrode, and a first layer between the second electrode and the first unit;

a second light-emitting device comprising a third electrode, a fourth electrode, a second unit between the third electrode and the fourth electrode, and a second layer between the fourth electrode and the second unit;

a first insulating film comprising a region between the first light-emitting device and the second light-emitting device;

a second insulating film over the first insulating film;

a first conductive film over the second insulating film; and a second conductive film electrically connected to the first conductive film, wherein the second conductive film is outside a display region, wherein the first electrode, the third electrode, and the second conductive film are on a same surface, wherein the first insulating film has a single-layer structure, wherein the first insulating film is in contact with a top surface and a side surface of the first electrode, a top surface and a side surface of the second electrode, a side surface of the first unit, a side surface of the second unit, a side surface of the first layer, a side surface of the second layer, a top surface and a side surface of the third electrode, a top surface and a side surface of the fourth electrode, and a top surface and a side surface of the second conductive film, wherein the first insulating film comprises a first opening overlapping with the second electrode, a second opening overlapping with the fourth electrode, and a third opening overlapping with the second conductive film, wherein the second insulating film comprises a fourth opening overlapping with the first opening, a fifth opening overlapping with the second opening, and a sixth opening overlapping with the third opening, wherein a width of the first opening is substantially the same as a width of the fourth opening, wherein a width of the second opening is substantially the same as a width of the fifth opening, wherein the first conductive film is electrically connected to the second electrode in the first opening and the fourth opening, to the fourth electrode in the second opening and the fifth opening, and to the second conductive film in the third opening and the sixth opening, wherein the first unit is configured to emit first light, wherein the second unit is configured to emit second light, and wherein the first layer and the second layer comprise the same electron-injection material.

7. The display panel according to claim 6, wherein a hue of the second light is different from a hue of the first light.

8. The display panel according to claim 6, wherein the first layer and the second layer comprise lithium fluoride.

9. A data processing device comprising:

at least one of a keyboard, a hardware button, a pointing device, a touch sensor, an illuminance sensor, an imaging device, an audio input device, a sight input device, and an attitude detection device; and the display panel according to claim 6.

10. A method for manufacturing a display panel, comprising:

a first step of forming a first electrode, a second electrode, and a third electrode;

a second step of forming a first unit over the first electrode, the second electrode, and the third electrode;

a third step of forming a first sacrifice layer over the first unit;

a fourth step of removing parts of the first sacrifice layer over the second electrode and the third electrode by a photoetching method so that the first sacrifice layer is formed into a shape overlapping with the first electrode;

a fifth step of removing parts of the first unit over the second electrode and the third electrode by an etching method so that the first unit is formed into a shape overlapping with the first sacrifice layer;

a sixth step of forming a second unit over the first sacrifice layer, the second electrode, and the third electrode;

a seventh step of forming a second sacrifice layer on the second unit, an eighth step of removing parts of the second sacrifice layer over the first sacrifice layer and the third electrode by a photoetching method so that the second sacrifice layer is formed into a shape overlapping with the second electrode;

a ninth step of removing parts of the second unit over the first sacrifice layer and the third electrode by an etching method so that the second unit is formed into a shape overlapping with the second sacrifice layer;

a tenth step of forming a third unit over the first sacrifice layer, the second sacrifice layer, and the third electrode;

an eleventh step of forming a third sacrifice layer over the third unit;

a twelfth step of removing parts of the third sacrifice layer over the first sacrifice layer and the second sacrifice layer by a photoetching method so that the third sacrifice layer is formed into a shape overlapping with the third electrode;

a thirteenth step of removing parts of the third unit over the first sacrifice layer and the second sacrifice layer by an etching method so that the third unit is formed into a shape overlapping with the third sacrifice layer;

a fourteenth step of removing the first sacrifice layer, the second sacrifice layer, and the third sacrifice layer by an etching method;

a fifteenth step of forming a first layer over the first unit, the second unit, and the third unit;

a sixteenth step of forming a fourth electrode over the first layer;

a seventeenth step of forming slits in surroundings of the first electrode, the second electrode, and the third electrode by a photoetching method to form a first light-emitting device, a second light-emitting device, and a third light-emitting device;

an eighteenth step of forming an insulating film covering the first light-emitting device, the second light-emitting device, the third light-emitting device, and sidewalls of the slits;

a nineteenth step of forming a first opening in the insulating film over the first light-emitting device, a second opening in the insulating film over the second light-emitting device, and a third opening in the insulating film over the third light-emitting device by a photoetching method; and a twentieth step of forming a conductive film covering the first opening, the second opening, and the third opening.

11. The method for manufacturing the display panel according to claim 10, wherein the insulating film comprises a first insulating film and a second insulating film over the first insulating film, and wherein a side surface of the second insulating film is aligned with a side surface of the first insulating film.

12. The method for manufacturing the display panel according to claim 11, wherein the first insulating film is an inorganic film.

13. The method for manufacturing the display panel according to claim 11, wherein the first insulating film comprises at least one of an aluminum oxide and a silicon nitride.

* * * * *